United States Patent
Kojima et al.

(10) Patent No.: US 7,967,956 B2
(45) Date of Patent: Jun. 28, 2011

(54) INFORMATION RECORDING MEDIUM AND METHOD FOR PRODUCING THE SAME

(75) Inventors: Rie Kojima, Kadoma (JP); Yukako Doi, Takatsuki (JP); Noboru Yamada, Hirakata (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/486,498

(22) Filed: Jun. 17, 2009

(65) Prior Publication Data

US 2009/0250339 A1    Oct. 8, 2009

Related U.S. Application Data

(62) Division of application No. 10/895,870, filed on Jul. 21, 2004, now Pat. No. 7,608,385.

(30) Foreign Application Priority Data

Jul. 24, 2003  (JP) ................................ 2003-279265

(51) Int. Cl.
*C23C 14/34* (2006.01)

(52) U.S. Cl. .................... 204/192.15; 430/320

(58) Field of Classification Search .......... None
See application file for complete search history.

(56) References Cited

U.S. PATENT DOCUMENTS

| | | | |
|---|---|---|---|
| 4,847,132 | A | 7/1989 | Takao et al. |
| 6,153,063 | A | 11/2000 | Yamada et al. |
| 6,214,429 | B1 | 4/2001 | Zou et al. |
| 6,406,771 | B1 | 6/2002 | Nakakuki et al. |
| 6,689,445 | B2 | 2/2004 | Kojima et al. |
| 2001/0036527 | A1 | 11/2001 | Abiko et al. |
| 2001/0049074 | A1 | 12/2001 | Ohno et al. |
| 2003/0003395 | A1 | 1/2003 | Yuzurihara et al. |
| 2003/0124387 | A1 | 7/2003 | Hirotsune et al. |
| 2003/0138669 | A1 | 7/2003 | Kojima et al. |
| 2003/0179117 | A1 | 9/2003 | Kojima et al. |
| 2004/0121261 | A1 | 6/2004 | Ashida et al. |
| 2005/0074694 | A1 | 4/2005 | Nishihara et al. |
| 2006/0141202 | A1 | 6/2006 | Suenaga |

FOREIGN PATENT DOCUMENTS

| | | |
|---|---|---|
| EP | 0 326 932 | 8/1999 |
| EP | 1 324 326 | 7/2003 |
| EP | 1 351 229 | 10/2003 |
| EP | 1 385 160 | 1/2004 |
| JP | 62-192944 | 8/1987 |
| JP | 63-259855 | 10/1988 |
| JP | 2000-30314 | 1/2000 |
| JP | 2000-339748 | 12/2000 |
| JP | 2001-67722 | 3/2001 |
| JP | 2001-143318 | 5/2001 |
| JP | 2001-322357 | 11/2001 |
| JP | 2001-344808 | 12/2001 |
| JP | 2003-242683 | * 8/2003 |
| JP | 2003-331467 | 11/2003 |
| TW | 200300934 | 6/2003 |
| TW | 234157 | 6/2005 |
| WO | 97/34298 | 9/1997 |
| WO | 2004/085167 | 3/2004 |

OTHER PUBLICATIONS

Translation JP-2003-242683(Aug. 2003).*
"Phase-Change Optical Disk Having a Nitride Interface Layer", Yamada et al., Japanese Journal of Applied Physics, vol. 37 (1998) pp. 2104-2110; Part 1, No. 4B, Apr. 1998.

* cited by examiner

*Primary Examiner* — Cynthia H Kelly
*Assistant Examiner* — Anna L Verderame
(74) *Attorney, Agent, or Firm* — Hamre, Schumann, Mueller & Larson, P.C.

(57) ABSTRACT

The information recording medium of the present invention comprises at least one of the following oxide-based material layers: (I) an oxide-based material layer containing Zr, at least one element selected from the group GL1 consisting of La, Ga and In, and oxygen (O); (II) an oxide-based material layer containing M1 (where M1 is a mixture of Zr and Hf, or Hf), at least one element selected from the group GL2 consisting of La, Ce, Al, Ga, In, Mg and Y, and O; (III) an oxide-based material layer containing at least one element selected from the group GM2 consisting of Zr and Hf, at least one element selected from the group GL2, Si, and O; and (IV) an oxide-based material layer containing at least one element selected from the group GM2, at least one element selected from the group GL2, Cr, and O. This oxide-based material layer can be used, for example, as a dielectric layer.

57 Claims, 10 Drawing Sheets

INFORMATION RECORDING MEDIUM AND METHOD FOR PRODUCING THE SAME

CROSS-REFERENCES TO RELATED APPLICATION

This application is a Division of application Ser. No. 10/895,870 filed Jul. 21, 2004, which application is incorporated herein by reference.

BACKGROUND OF THE INVENTION

1. Field of the Invention

The present invention relates to an information recording medium on/from which information can be recorded, erased, rewritten and reproduced optically or electrically and a method for producing the same.

2. Description of the Related Art

An example of the basic structure of an optical information recording medium is such that a first dielectric layer, a recording layer, a second dielectric layer and a reflective layer are formed in this order on a surface of a substrate. The first and the second dielectric layers serve to regulate the optical distance to increase the optical absorption efficiency of the recording layer and increase the difference between the reflectance of the crystalline phase and the reflectance of the amorphous phase to increase the signal amplitude. The dielectric layers also serve to protect the recording layer from moisture or the like. The dielectric layers are formed of, for example, a mixture of 80 mol % of ZnS and 20 mol % of $SiO_2$ (hereinafter, expressed by of "$(ZnS)_{80}$ $(SiO_2)_{20}$ (mol %)" or "$(ZnS)_{80}$ $(SiO_2)_{20}$"; other mixtures also are expressed in the same manner) (e.g., see Japanese Patent 1959977). This material is amorphous and has a low thermal conductivity, high transparency and a high refractive index. This material also has a high film-formation speed when a film is being formed, and excellent mechanical characteristics and moisture resistance. Thus, "$(ZnS)_{80}$ $(SiO_2)_{20}$" has been put into practical use as a material suitable for forming dielectric layers.

With a recent tendency toward increasing high density, the recording layer has been designed to be as thin as about ⅓ of that in 1990, the year that is in the early period of the practical use. This is for the purpose of reducing the heat capacity of the recording layer and letting heat escape to the reflective layer side rapidly after the temperature is increased in order to record small marks satisfactorily.

The inventors of the present invention found out a problem of $(ZnS)_{80}$ $(SiO_2)_{20}$ as the thickness of the recording layer is reduced. The problem is a phenomenon where, when the recording layer is irradiated with laser light to rewrite information repeatedly, S in $(ZnS)_{80}$ $(SiO_2)_{20}$ is diffused in the recording layer and the repeated rewriting performance is reduced significantly. In order to prevent this diffusion, the inventors of the present invention proposed that layers for serving as interface layers should be provided between the first dielectric layer and the recording layer and between the recording layer and the second dielectric layer (e.g., see N. Yamada et al., Japanese Journal of Applied Physics Vol. 37 (1998) pp. 2104-2110). A nitride containing Ge is disclosed as the material of the interface layers (e.g., see WO 97/34298). Materials containing S are not suitable. The interface layers improved the repeated rewriting performance significantly. An interface layer is provided in a 4.7 GB/DVD-RAM (Digital Versatile Disk-Random Access Memory) disk that already has been in practical use, such as an information recording medium 31 shown in FIG. 12. In this medium, a first dielectric layer 102, a first interface layer 103, a recording layer 4, a second interface layer 105, a second dielectric layer 106, an optical absorption correcting layer 7 and a reflective layer 8 are formed in this order on a surface of a substrate 1, and a dummy substrate 10 is attached to the reflective layer 8 with an adhesive layer 9 (e.g., see JP2001-322357). This configuration can provide large capacity and excellent repeated rewriting performance.

A layer made of a nitride containing Ge can be formed by using Ge or an alloy containing Ge for reactive film-formation in a high pressure atmosphere with a mixture of Ar gas and nitrogen gas. The repeated rewriting performance or the moisture resistance depend on the degree of this nitriding of Ge, so that the conditions for film-formation are determined strictly. In particular, reactive film-formation at a high pressure depends significantly on the structure of a film-formation apparatus and the conditions for film-formation. For example, it took time to determine the conditions for optimal pressure or gas flow rate when a film-formation apparatus for experiments was scaled up to a film-formation apparatus for mass production. Since there is such a problem, there is a demand for a material with which an interface layer can be formed by non-reactive film-formation, that is, can be formed in a low pressure atmosphere of Ar gas and is free from S. If the interface layer is used as a dielectric layer, it is possible to reduce the number of layers.

Furthermore, an example of materials suitable for the interface layer of an information recording medium is one proposed from the viewpoint of the relationship of the thermal conductivity (e.g., see JP2001-67722).

In order to solve the above-described conventional problems, the inventors of the present invention have proposed an interface layer that can be formed by non-reactive film-formation and has excellent moisture resistance and repeated rewriting performance, that is a dielectric material that can be provided in contact with the recording layer, can be used as the first or the second dielectric layer, and contains a mixture of $ZrO_2$, $SiO_2$ and $Cr_2O_3$, which exhibit excellent repeated rewriting performance. In this $ZrO_2$—$SiO_2$—$Cr_2O_3$, $ZrO_2$ and $SiO_2$ are transparent and thermally stable materials, and $Cr_2O_3$ is a material that has excellent adhesion with a chalcogen based recording layer. Therefore, both the thermal stability and the adhesion can be provided by mixing these three oxides. In order to ensure adhesion, a composition containing $Cr_2O_3$ in a content of 30 mol % or more is more preferable. An information recording medium in which $ZrO_2$—$SiO_2$—$Cr_2O_3$ material is used as an interface layer or a dielectric layer has excellent repeated rewriting performance and moisture resistance.

However, low thermal conductivity and transparency also are required for a material suitable for forming an interface layer or a dielectric layer. These two properties of $ZrO_2$—$SiO_2$—$Cr_2O_3$ are not comparable to those of $(ZnS)_{80}$ $(SiO_2)_{20}$. $ZrO_2$ and $SiO_2$ are substantially optically transparent (extinction coefficient 0.00 or less) in wavelength regions of 660 nm and 405 nm, whereas $Cr_2O_3$ absorbs light in the two regions and is not transparent. $Cr_2O_3$ absorbs light in a larger amount as the wavelength becomes shorter, and the extinction coefficient in the vicinity of 405 nm is nearly 0.3. For this reason, for example, in the case of a composition of mixed $(ZrO_2)_{25}(SiO_2)_{25}(Cr_2O_3)_{50}$ (mol %), the extinction coefficient in a wavelength region of 660 nm is 0.02, and the extinction coefficient in a wavelength region of 405 nm is 0.2. If the material is not transparent, the dielectric layer absorbs light, which reduces light absorption of the recording layer and increases the temperature of the dielectric layer. Phase change recording is performed by forming an amorphous mark in the recording layer by melting a laser light irradiation portion and cooling it rapidly (recording) and heating it to the crystallization temperature or more and then cooling it gradually for crystallization (erasure). When the light absorption of the recording layer is reduced, the recording sensitivity and the erasure sensitivity of the recording layer are reduced (laser light irradiation with larger power is necessary). When the temperature of the dielectric layer is increased, this makes it difficult to cool the recording layer rapidly and form satisfactory amorphous marks during recording. As a result, the signal quality is deteriorated.

Regarding the thermal conductivity, since it is difficult to measure the thermal conductivity of a thin film precisely, the magnitudes of the thermal conductivities are compared relatively, based on the difference in recording sensitivity between individual information recording media. For example, when the thermal conductivity of the second dielectric layer is low, heat is accumulated temporarily in the recording layer and then is diffused rapidly to the reflective layer without being diffused in the in-plane direction. In other words, the rapid cooling effect is increased, so that amorphous marks can be formed with a smaller laser power (high recording sensitivity). On the other hand, when the thermal conductivity of the second dielectric layer is high, heat is hardly accumulated in the recording layer and easily is diffused to the second dielectric layer. Thus, the rapid cooling effect is small and a large laser power is necessary to form amorphous marks (low recording sensitivity). For $ZrO_2$—$SiO_2$—$Cr_2O_3$, a larger laser power is required for recording than when $(ZnS)_{80}(SiO_2)_{20}$ is used as the second dielectric layer, so that it is determined that for $ZrO_2$—$SiO_2$—$Cr_2O_3$ has high thermal conductivity.

Thus, $ZrO_2$—$SiO_2$—$Cr_2O_3$ has problems in thermal conductivity and transparency. When $ZrO_2$—$SiO_2$—$Cr_2O_3$ is used as the first or the second dielectric layer in DVD-RAM disks and Blu-ray disks, the recording sensitivity is low, which requires improvement.

SUMMARY OF THE INVENTION

Therefore, with the foregoing in mind, it is an object of the present invention to provide a dielectric material having low thermal conductivity and high transparency, and to provide an information recording medium having good recording sensitivity while maintaining the conventional repeated rewriting performance and moisture resistance by employing this dielectric material.

A first information recording medium of the present invention is an information recording medium that allows at least one of recording and reproduction of information by irradiation of light or application of electric energy, comprising an oxide-based material layer containing Zr, at least one element selected from the group GL1 consisting of La, Ga and In, and oxygen (O).

A second information recording medium of the present invention is an information recording medium that allows at least one of recording and reproduction of information by irradiation of light or application of electric energy, comprising an oxide-based material layer containing M1 (where M1 is a mixture of Zr and Hf, or Hf), at least one element selected from the group GL2 consisting of La, Ce, Al, Ga, In, Mg and Y, and oxygen (O).

A third information recording medium of the present invention is an information recording medium that allows at least one of recording and reproduction of information by irradiation of light or application of electric energy, comprising an oxide-based material layer containing at least one element selected from the group GM2 consisting of Zr and Hf, at least one element selected from the group GL2 consisting of La, Ce, Al, Ga, In, Mg and Y, Si, and oxygen (O).

A fourth information recording medium of the present invention is an information recording medium that allows at least one of recording and reproduction of information by irradiation of light or application of electric energy, comprising an oxide-based material layer containing at least one element selected from the group GM2 consisting of Zr and Hf, at least one element selected from the group GL2 consisting of La, Ce, Al, Ga, In, Mg and Y, Cr, and oxygen (O).

A fifth information recording medium of the present invention is an information recording medium that allows at least one of recording and reproduction of information by irradiation of light or application of electric energy, comprising an oxide-based material layer containing at least one element selected from the group GM consisting of Zr and Hf, at least one element selected from the group GL consisting of La, Ce, Al, Ga, In, Mg and Y, and oxygen (O).

A first method for producing an information recording medium of the present invention is a method for producing an information recording medium containing an oxide-based material layer containing Zr, at least one element selected from the group GL1 consisting of La, Ga and In, and oxygen (O), comprising forming the oxide-based material layer by sputtering using a sputtering target containing Zr, at least one element selected from the group GL1 and oxygen (O).

A second method for producing an information recording medium of the present invention is a method for producing an information recording medium containing an oxide-based material layer containing M1 (where M1 is a mixture of Zr and Hf, or Hf), at least one element selected from the group GL2 consisting of La, Ce, Al, Ga, In, Mg and Y, and oxygen (O), comprising forming the oxide-based material layer by sputtering using a sputtering target containing the M1, at least one element selected from the group GL2 and oxygen (O).

A third method for producing an information recording medium of the present invention is a method for producing an information recording medium containing an oxide-based material layer containing at least one element selected from the group GM2 consisting of Zr and Hf, at least one element selected from the group GL2 consisting of La, Ce, Al, Ga, In, Mg and Y, Si, and oxygen (O), comprising forming the oxide-based material layer by sputtering using a sputtering target containing at least one element selected from the group GM2, at least one element selected from the group GL2, Si and oxygen (O).

A fourth method for producing an information recording medium of the present invention is a method for producing an information recording medium containing an oxide-based material layer containing at least one element selected from the group GM2 consisting of Zr and Hf, at least one element selected from the group GL2 consisting of La, Ce, Al, Ga, In, Mg and Y, Cr, and oxygen (O), comprising forming the oxide-based material layer by sputtering using a sputtering target containing at least one element selected from the group GM2, at least one element selected from the group GL2, Cr and oxygen (O).

A fifth method for producing an information recording medium of the present invention is a method for producing an information recording medium containing an oxide-based material layer containing at least one element selected from the group GM consisting of Zr and Hf, at least one element selected from the group GL consisting of La, Ce, Al, Ga, In, Mg and Y, and oxygen (O), comprising forming the oxide-based material layer by sputtering using a sputtering target containing at least one element selected from the group GM, at least one element selected from the group GL and oxygen (O).

DESCRIPTION OF THE PREFERRED EMBODIMENTS

Figure 1:
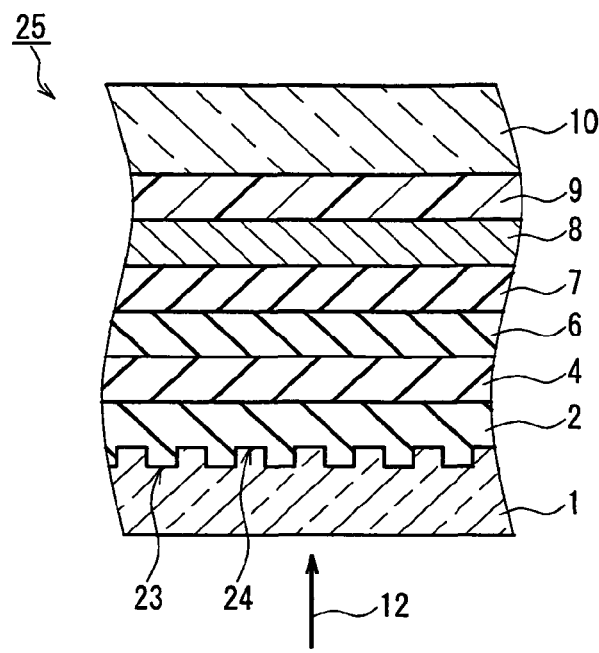
FIG. 1 is a partial cross-sectional view showing an example of an information recording medium of the present invention.

An oxide-based material layer contained in a first to a fifth information recording medium of the present invention has high transparency at least from a red wavelength region in the vicinity of 660 nm to a bluish-purple wavelength region in the vicinity of 405 nm and low thermal conductivity. Furthermore, this oxide-based material layer does not contain S and therefore it can be provided in contact with a recording layer, and has sufficient thermal stability and moisture resistance at the same time. Therefore, for example, by using this oxide-based material layer as a dielectric layer, an information recording medium having an improved recording sensitivity while maintaining sufficient reliability and excellent repeated rewriting performance can be realized. In an information recording medium utilizing electric energy for recording and reproduction of information, if this oxide-based material is used as a dielectric layer for insulating a recording layer, a phase change can be caused in the recording layer with a small amount of electric energy. According to a first to a fifth method for producing an information recording medium, an information recording medium having the above-described features can be produced.

A first information recording medium of the present invention contains an oxide-based material layer containing Zr, at least one element selected from the group GL1 consisting of La, Ga and In, and oxygen (O). It is preferable that the oxide-based material layer contains a material having a composition expressed by:

$$Zr_{Q1}L1_{T1}O_{100-Q1-T1} \text{(atom \%)} \quad (1)$$

where L1 is at least one element selected from the group GL1, Q1 and T1 satisfy $0<Q1<34$, $0<T1<50$, and $20<Q1+T1<60$. In the formula (1), it is more preferable that L1 is Ga.

Herein, "atom %" indicates that formula (1) is a composition formula expressed by taking the total number of Zr atoms, L1 atoms and O atoms as the reference (100%). When L1 includes at least two elements, T1 indicates the total number of atoms of all the contained elements. In formulae below, the indication of "atom %" is used in the same sense. In formula (1), only Zr atoms, L1 atoms and O atoms contained in the oxide-based material layer are counted and shown. Therefore, the oxide base material layer containing the material expressed by formula (1) may contain components other than these atoms.

As described above, in formula (1), it is preferable that Q1 and T1 satisfy $0<Q1<34$, $0<T1<50$, and $20<Q+T<60$. When Zr is contained in 34 atom % or more, the adhesion is deteriorated. When the element L1 is contained in 50 atom % or more, the repeated rewriting performance is deteriorated. When oxygen (O) is contained in less than 40 atom %, the transparency becomes poor. More preferably, $4<Q1<24$, $6<T1<37$, and $30<Q1+T1<50$.

In formula (1), each atom can be present in the form of any compound. The material is specified by such a formula for the following reason: when investigating the composition of a layer made of a thin film, it is difficult to obtain the composition of the compound, and therefore in reality, it is common to obtain only the element composition (i.e., ratio of the atoms). In the material expressed by formula (1), it is believed that most of Zr and the element L1 are present in the form of oxide in combination with oxygen atoms. Therefore, in this specification, even a layer containing the material expressed by formula (1) is referred to as "oxide-based material layer" for convenience. This applies to the following formulae (3), (5), (6), (9) and (10).

In the oxide-based material layer contained in the first information recording medium, when it is assumed that most of Zr and the element L1 are present in the form of oxide in combination with oxygen atoms, the contained material also can be expressed by formula (2) below:

$$(D1)_{X1}(E1)_{100-X1} \text{(mol \%)} \quad (2)$$

where D1 is an oxide of Zr, E1 is an oxide of at least one element selected from the group GL1, and X1 satisfies $0<X1<100$.

In formula (2), it is preferable that D1 is $ZrO_2$ and E1 is $Ga_2O_3$.

A second information recording medium of the present invention contains an oxide-based material layer containing M1 (where M1 is a mixture of Zr and Hf, or Hf), at least one element selected from the group GL2 consisting of La, Ce, Al, Ga, In, Mg and Y, and oxygen (O). It is preferable that the oxide-based material layer contains a material having a composition expressed by:

$$M1_{Q2}L2_{T2}O_{100-Q2-T2} \text{(atom \%)} \quad (3)$$

where M1 is a mixture of Zr and Hf, or Hf, L2 is at least one element selected from the group GL2, and Q2 and T2 satisfy 0<Q2<34, 0<T2<50, and 20<Q2+T2<60. In formula (3), it is more preferable that L2 is Ga.

Also in the second information recording medium of the present invention, "atom %" is used in the same sense as in the case of the first information recording medium. When M1 is a mixture of Zr and Hf, Q2 indicates the total number of atoms of Zr and Hf. When L2 includes at least two elements, T2 indicates the total number of atoms of all the contained elements. In formula (3), only M1 atoms, L2 atoms and O atoms contained in the oxide-based material layer are counted and shown. Therefore, the oxide base material layer containing the material expressed by formula (3) may contain components other than these atoms.

As described above, in formula (3), it is preferable that Q2 and T2 satisfy 0<Q2<34, 0<T2<50, and 20<Q2+T2<60. When M1 is contained in 34 atom % or more, the adhesion is deteriorated. When the element L2 is contained in 50 atom % or more, the repeated rewriting performance is deteriorated. When oxygen (O) is contained in less than 40 atom %, the transparency becomes poor. More preferably, 4<Q2<24, 6<T2<37, and 30<Q2+T2<50.

In formula (3) as well as in the case of formula (1), each atom can be present in the form of any compound. Also in the material expressed by formula (3), it is believed that most of M1 and the element L2 are present in the form of oxide in combination with oxygen atoms. When it is assumed that most of M1 and the element L2 are present in the form of oxide in combination with oxygen atoms, the material contained in the oxide-based material layer can be expressed by formula (4) below:

$$(D2)_{X2}(E2)_{100-X2} (\text{mol \%}) \quad (4)$$

where D2 is an oxide of M1, E2 is an oxide of at least one element selected from the group GL2, and X2 satisfies 0<X2<100.

In formula (4), it is preferable that E2 is $Ga_2O_3$.

A third information recording medium of the present invention contains an oxide-based material layer containing at least one element selected from the group GM2 consisting of Zr and Hf, at least one element selected from the group GL2 consisting of La, Ce, Al, Ga, In, Mg and Y, Si, and oxygen (O). It is preferable that the oxide-based material layer contains a material having a composition expressed by:

$$M2_{Q3}Si_{R1}L2_{T3}O_{100-Q3-R1-T3} (\text{atom \%}) \quad (5)$$

where M2 is at least one element selected from the group GM2, L2 is at least one element selected from the group GL2, and Q3, R1 and T3 satisfy $0<Q3\leq32$, $0<R1\leq32$, $3<T3<43$, and 20<Q3+R1+T3<60.

Furthermore, in the third information recording medium of the present invention, the oxide-based material layer may further contain at least one element selected from the group GK1 consisting of carbon (C), nitrogen (N) and Cr. In this case, it is preferable that the oxide-based material layer contains a material having a composition expressed by:

$$M2_{Q3}Si_{R1}L2_{T3}K1_{J1}O_{100-Q3-R1-T3-J1} (\text{atom \%}) \quad (6)$$

where M2 is at least one element selected from the group GM2, L2 is at least one element selected from the group GL2, and K1 is at least one element selected from the group GK1, and Q3, R1, T3 and J1 satisfy $0<Q3\leq32$, $0<R1\leq35$, $2<T3\leq40$, $0<J1\leq40$, and 20<Q3+R1+T3+J1<80.

In formulae (5) and (6), it is more preferable that M2 is Zr and L2 is Ga (i.e., $ZrQ_3Si_{R1}Ga_{T3}O_{100-Q3-R1-T3}$, $Zr_{Q3}Si_{R1}Ga_{T3}K1_{J1}O_{100-Q3-R1-T3-J1}$ are preferable).

Also in the third information recording medium of the present invention, "atom %" is used in the same sense as in the case of the first information recording medium. When M2 includes two elements, Q3 indicates the total number of atoms of the two elements. When L2 includes at least two elements, T3 indicates the total number of atoms of all the contained elements. When K1 includes at least two elements, J1 indicates the total number of atoms of all the contained elements. In formula (5), only M2 atoms, L2 atoms, Si atoms and O atoms contained in the oxide-based material layer are counted and shown. In formula (6), only M2 atoms, L2 atoms, Si atoms, K1 atoms and O atoms contained in the oxide-based material layer are counted and shown. Therefore, the oxide base material layer containing the material expressed by formula (5) or (6) may contain components other than these atoms.

As described above, in formula (5), it is preferable that Q3, R1 and T3 satisfy $0<Q3\leq32$, $0<R1\leq32$, $3<T3<43$, and 20<Q3+R1+T3<60. When M2 or Si is contained in 32 atom % or more, the adhesion with recording layer is deteriorated. When the element L2 is contained in 43 atom % or more, the repeated rewriting performance is deteriorated. When oxygen (O) is contained in less than 40 atom %, the transparency becomes poor. More preferably, 0<Q3<25, 0<R1<25, 6<T3<37, 30<Q3+R1+T3<50. Therefore, this oxide-based material layer is a material having excellent thermal stability, high transparency, adhesion, moisture resistance and low thermal conductivity.

In formulae (5) and (6) as well as in the case of formula (1), each atom can be present in the form of any compound. For example, in the material expressed by formula (5), it is believed that most of M2, Si and the element L2 are present in the form of oxide in combination with oxygen atoms. Si may be contained in the form of nitride or carbide. Thus, the material expressed by formula (5) or (6) contained in the oxide-based material layer can be expressed by formula (7) or (8) below:

$$(D3)_{X3}(g)_{Z1}(E2)_{100-X3-Z1} (\text{mol \%}) \quad (7)$$

where D3 is an oxide of at least one element selected from the group GM2, g is at least one compound selected from the group consisting of $SiO_2$, $Si_3N_4$ and SiC, E2 is an oxide of at least one element selected from the group GL2, and X3 and Z1 satisfy $10\leq X3<90$, $0<Z1\leq50$, and $10<X3+Z1\leq90$.

$$(D3)_{X3}(SiO_2)_{Z2}(f)_{A1}(E2)_{100-X3-Z2-A1} (\text{mol \%}) \quad (8)$$

where D3 and E2 are the same oxides as in formula (7), f is at least one compound selected from the group consisting of SiC, $Si_3N_4$, and $Cr_2O_3$, and X3, Z2 and A1 satisfy $10\leq X3<90$, $0<Z2\leq50$, $0<A1\leq50$, and $10<X3+Z2+A1\leq90$.

In formulae (7) and (8), it is preferable that D3 is $ZrO_2$, and E2 is $Ga_2O_3$.

A fourth information recording medium of the present invention contains an oxide-based material layer containing at least one element selected from the group GM2 consisting of Zr and Hf, at least one element selected from the group GL2 consisting of La, Ce, Al, Ga, In, Mg and Y, Cr, and oxygen (O). It is preferable that the oxide-based material layer contains a material having a composition expressed by:

$$M2_{Q4}Cr_{U}L2_{T4}O_{100-Q4-U-T4} (\text{atom \%}) \quad (9)$$

where M2 is at least one element selected from the group GM2, L2 is at least one element selected from the group GL2, and Q4, U and T4 satisfy $0<Q4\leq32$, $0<U\leq25$, $0<T4\leq40$, and 20<Q4+U+T4<60.

Furthermore, in the fourth information recording medium of the present invention, the oxide-based material layer may further contain at least one element selected from the group GK2 consisting of nitrogen (N) and carbon (C). In this case, it is preferable that the oxide-based material layer contains a material having a composition expressed by:

$$M2_{Q4}Cr_{U}L2_{T4}Si_{R2}K2_{J2}O_{100-Q4-U-T4-R2-J2}(\text{atom \%}) \quad (10)$$

where M2 is at least one element selected from the group GM2, L2 is at least one element selected from the group GL2, and K2 is at least one element selected from the group GK2 consisting of nitrogen (N) and carbon (C), and Q4, U, T4, R2 and J2 satisfy $0<Q4\leq32$, $0<U\leq25$, $0<T4\leq40$, $0<R2\leq30$, $0<J2\leq40$, and $25<Q4+U+T4+R2+J2<85$.

In formulae (9) and (10), it is preferable that M2 is Zr and L2 is Ga (i.e., $Zr_{Q4}Cr_{U}Ga_{T4}O_{100-Q4-U-T4}$, $Zr_{Q4}Cr_{U}Ga_{T4}Si_{R2}K2_{J2}O_{100-Q4-U-T4-R2-J2}$ are preferable).

In formula (10), it is preferable that Q4, U, T4, R2 and J2 satisfy $0<Q4\leq32$, $0<U\leq25$, $0<T4\leq40$, $0<R2\leq30$, $0<J2\leq40$, and $25<Q4+U+T4+R2+J2<85$. In the material system expressed by formula (10), when the element M2 is included, the heat resistance is improved. However, when the content exceeds 32 atom %, the adhesion with the recording layer is deteriorated, so that it is preferable that the content of the element M2 is 32 atom % or less. When Cr is contained in this material system, the adhesion with the recording layer is improved. However, it is preferable that the content of Cr is 25 atom % or less so as to prevent the transparency from deteriorating in the case where C and N are included. When the element L2 is contained in this material system, the transparency of the oxide-based material layer is improved. However, it is preferable that the content is 40 atom % or less so as to prevent the repeated rewriting performance from deteriorating. When Si is present in the form of nitride or carbide together with an oxide, the structure becomes complicated, so that the thermal conductivity of this material system can be reduced. However, in this material system, it is preferable that the content of Si is 30 atom % or less so as to prevent the adhesion with the recording layer from deteriorating. Since the element K2 (C, N) tends to form a compound with Si in this material system, the thermal conductivity can be reduced for the reason described above. However, it is preferable that the content of C is 20 atom % or less and the content of N is 40 atom % or less so as to prevent the transparency from deteriorating. In this material system, when N is included in a large amount, the transparency can be obtained with a smaller amount of O than in other material systems. However, when the content of O is 15 atom % or less, the transparency is deteriorated, and when it is 75 atom % or more, O becomes surplus and is combined more readily with Si than C or N, which makes it difficult to adjust the thermal conductivity. Therefore, it is preferable that the content of O is more than 15 atom %, and less than 75 atom %.

In formulae (9) and (10) as well as in the case of formula (1), each atom can be present in the form of any compound. For example, in the material expressed by formula (9), it is believed that most of M2, Cr and the element L2 are present in the form of oxide in combination with oxygen atoms. Furthermore, in the material expressed by formula (10), it is believed that Si is present in at least one form of oxide, nitride and carbide. Thus, the material expressed by formula (9) or (10) contained in the oxide-based material layer can be expressed by formula (11) or (12) below:

$$(D3)_{X4}(Cr_2O_3)_{A2}(E2)_{100-X4-A2}(\text{mol \%}) \quad (11)$$

where D3 is an oxide of at least one element selected from the group GM2, E2 is an oxide of at least one element selected from the group GL2, and X4 and A2 satisfy $10\leq X4<90$, $0<A2\leq40$, and $10<X4+A2\leq90$.

$$(D3)_{X4}(Cr_2O_3)_{A2}(h)_{Z3}(E2)_{100-X4-A2-Z3}(\text{mol \%}) \quad (12)$$

where D3 is an oxide of at least one element selected from the group GM2, h is at least one compound selected from the group consisting of $Si_3N_4$ and SiC, E2 is an oxide of at least one element selected from the group GL2, and X4, A2, and Z3 satisfy $10\leq X4<90$, $0<A2\leq40$, $0<Z3\leq40$, and $10<X4+A2+Z3\leq90$.

In the material systems expressed by formulae (11) and (12), when D3 is included, the heat resistance is improved. However, when the content exceeds 90 mol %, the adhesion with the recording layer is deteriorated, so that it is preferable that the content is 90 mol % or less. In this material system, when $Cr_2O_3$ is included, the adhesion with the recording layer is improved. However, it is preferable that the content is 40 mol % or less so as to prevent the transparency from deteriorating. In this material system, when the element E2 is included, the transparency is improved. However, it is preferable that the content is 90 mol % or less so as to prevent the repeated rewriting performance from deteriorating. The component h contained in the material expressed in formula (12) makes the structure complicated, so that the thermal conductivity of this material system can be reduced. However, in this material system, it is preferable that the content of h is 40 mol % or less so as to prevent the transparency from deteriorating.

In formulae (11) and (12), it is preferable that D3 is $ZrO_2$, and E2 is $Ga_2O_3$.

Both oxides of Zr and Hf are transparent, have high melting points and excellent thermal stability. It is believed that Zr and Hf are present in the oxide-based material layer substantially in the form of $ZrO_2$ and $HfO_2$, respectively. The information recording medium provided with a layer containing such a maternal having excellent thermal stability is hardly deteriorated even if information is rewritten repeatedly, and has excellent durability. $ZrO_2$ and $HfO_2$ exhibit substantially the same properties, but $ZrO_2$ is less expensive and therefore more useful. When Si is further included, flexibility can be obtained, in addition to thermal stability. Therefore, the resistance against damage from expansion and contraction of the film during rewriting can be large, which makes it difficult for the film to be cracked. An oxide of Si also has excellent transparency.

Any oxide of La, Ce, Al, Ga, In, Mg and Y is transparent in a laser wavelength in the vicinity of 405 nm, and the extinction coefficient is substantially 0.00. These elements are present in an oxide-based material layer in the form of $La_2O_3$, $CeO_2$, $Al_2O_3$, $Ga_2O_3$, $In_2O_3$, MgO and $Y_2O_3$, respectively. These oxides are insoluble in water and exhibit excellent moisture resistance, and are attached satisfactorily with a recording layer made of chalcogenide. In particular, $Ga_2O_3$ has excellent transparency and adhesion, and has a low thermal conductivity and a high film-formation speed, compared with $Cr_2O_3$, and thus $Ga_2O_3$ is a useful material.

The first to the fourth information recording media further include a recording layer, and the recording layer may be formed of a phase change material in which a phase transformation between amorphous and crystalline phases is caused. As the phase change material, either a write once type material in which irreversible phase transformation is caused or a rewritable material in which reversible phase transformation is caused can be used. More specifically, rewritable materials include any one material selected from the group consisting of Ge—Sb—Te, Ge—Sn—Sb—Te, Ge—Bi—Te, Ge—Sn—Bi—Te, Ge—Sb—Bi—Te, Ge—Sn—Sb—Bi—Te, Ag—In—Sb—Te and Sb—Te. The thickness of the recording layer preferably is 20 nm or less, more preferably 3 nm to 15 nm. Alternatively, magneto-optical materials such as Tb—Fe—Co, Gd—Tb—Fe—Co, Tb—Fe, Dy—Fe—Co, and Dy—Nd—Fe—Co can be used. A plurality of recording layers containing such a recording layer can be provided. The plurality layers may include other kind of recording layer. The oxide-based material layer can be applied, regardless of the kind or the number of the recording layer, and can be applied to media for recording with electric means, in addition to media for recording with optical means such as laser light.

The oxide-based material layer may be provided in contact with at least one surface of the recording layer. Since the oxide-based material layer is free from S, an information recording medium having good repeated rewriting performance and moisture resistance can be obtained, even if the oxide-based material layer is formed in direct contact with the recording layer.

Next, a first to a fourth method for producing an information recording medium of the present invention will be described.

The first to the fourth methods for producing an information recording medium of the present invention are methods including the step of forming an oxide-based material layer by sputtering. By sputtering, an oxide-based material layer having substantially the same composition as that of a sputtering target can be formed. Therefore, according to this production method, an oxide-based material layer having a desired composition can be formed easily by selecting a suitable sputtering target.

A first method for producing an information recording medium of the present invention is a method for producing an information recording medium containing an oxide-based material layer containing Zr, at least one element selected from the group GL1 consisting of La, Ga and In, and oxygen (O), comprising forming the oxide-based material layer by sputtering using a sputtering target containing Zr, at least one element selected from the group GL1 and oxygen (O). In this case, it is preferable that the sputtering target contains a material having a composition expressed by:

$$Zr_{q1}L1_{t1}O_{100-q1-t1}(\text{atom \%}) \tag{13}$$

where L1 is at least one element selected from the group GL1, q1 and t1 satisfy $0<q1<34$, $0<t1<50$, and $20<q1+t1<60$. In formula (13), it is more preferable that L1 is Ga.

Assuming that Zr and the element L1 are present in the form of oxide, the composition of the sputtering target can be expressed by formula (14) below:

$$(D1)_{x1}(E1)_{100-x1}(\text{mol \%}) \tag{14}$$

where D1 is an oxide of Zr, E1 is an oxide of at least one element selected from the group GL1, and x1 satisfies $0<x1<100$, preferably $20 \leq x1 \leq 80$.

The oxide-based material layer containing the material expressed by formula (1) can be formed by sputtering the sputtering target shown by formula (14). The experiments of the inventors of the present invention confirmed that the element composition (atom %) of the formed oxide-based material layer can have oxygen in 1 to 2 atom % less than that element composition (atom %) calculated from the indicated composition (mol %) of the sputtering target.

In formula (14), it is preferable that D1 is $ZrO_2$ and E1 is $Ga_2O_3$ (i.e., a sputtering target expressed by $(ZrO_2)_{x1}(Ga_2O_3)_{100-x1}$ (mol %) in the formula (14)).

When D1 contains two oxides, x1 denotes the total mole number of the two oxides. Similarly, when E1 contains two oxides, (100-x) denotes the total mole number of all the contained oxides.

The sputtering target is specified as above, because in general, the sputtering target containing Zr, an element selected from the group GL1 and oxygen (O) is supplied with an indication of the composition of an oxide of Zr and an oxide of an element selected from the group GL1. In the production process for the sputtering target, it is difficult to mix directly a low melting point material such as Ga and In and a high melting point material such as Zr, so that it is common to mix components in the form of oxide to produce a sputtering target.

The inventors of the present invention have confirmed that the element composition obtained by analyzing the sputtering target having a composition indicated in this manner with a X-ray microanalyzer is substantially equal to the element composition calculated from the indicated composition (i.e., the composition indication (nominal composition) is proper). Therefore, the sputtering target supplied in the form of a mixture of oxides preferably can be used in the first method for producing an information recording medium. It should be noted that this also applied to the second to the fourth methods for producing an information recording media described below.

A second method for producing an information recording medium of the present invention is a method for producing an information recording medium containing an oxide-based material layer containing M1 (where M1 is a mixture of Zr and Hf, or Hf), at least one element selected from the group GL2 consisting of La, Ce, Al, Ga, In, Mg and Y, and oxygen (O), comprising forming the oxide-based material layer by sputtering using a sputtering target containing the M1, at least one element selected from the group GL2 and oxygen (O). In this case, it is preferable that the sputtering target contains a material having a composition expressed by:

$$M1_{q2}L2_{t2}O_{100-q2-t2}(\text{atom \%}) \tag{15}$$

where M1 is a mixture of Zr and Hf, or Hf, L2 is at least one element selected from the group GL2, and q2 and t2 satisfy $0<q2<34$, $0<t2<50$, and $20<q2+t2<60$. In formula (15), it is more preferable that L2 is Ga.

Assuming that the element M1 and L2 are present in the form of oxide, the composition of the sputtering target can be expressed by formula (16) below:

$$(D2)_{x2}(E2)_{100-x2}(\text{mol \%}) \tag{16}$$

where D2 is an oxide of M1, E2 is an oxide of at least one element selected from the group GL2, and x2 satisfies $0<x2<100$, preferably $20 \leq x2 \leq 80$.

The oxide-based material layer containing the material expressed by formula (3) can be formed by sputtering the sputtering target shown by formula (16). The experiments of the inventors of the present invention confirmed that the element composition (atom %) of the formed oxide-based material layer can have oxygen in 1 to 2 atom % less than that element composition (atom %) calculated from the indicated composition (mol %) of the sputtering target.

In formula (16), it is preferable that E2 is $Ga_2O_3$.

A third method for producing an information recording medium of the present invention is a method for producing an information recording medium containing an oxide-based material layer containing at least one element selected from the group GM2 consisting of Zr and Hf, at least one element selected from the group GL2 consisting of La, Ce, Al, Ga, In, Mg and Y, Si, and oxygen (O), comprising forming the oxide-based material layer by sputtering using a sputtering target containing at least one element selected from the group GM2, at least one element selected from the group GL2, Si and oxygen (O). In this case, it is preferable that the sputtering target contains a material having a composition expressed by:

$$M2_{q3}Si_{r1}L2_{t3}O_{100-q3-r1-t3}(\text{atom \%}) \tag{17}$$

where M2 is at least one element selected from the group GM2, L2 is at least one element selected from the group GL2, and q3, r1 and t3 satisfy $0<q3\leq32$, $0<r1\leq32$, $3<t3<43$, and $20<q3+r1+t3<60$.

Furthermore, in the third method for producing of an information recording medium of the present invention, the sputtering target further may contain at least one element selected from the group GK1 consisting of carbon (C), nitrogen (N) and Cr. In this case, it is preferable that the sputtering target contains a material having a composition expressed by:

$$M2_{q3}Si_{r1}L2_{t3}K1_{j1}O_{100-q3-r1-t3-j1} \text{(atom \%)} \quad (18)$$

where M2 is at least one element selected from the group GM2, L2 is at least one element selected from the group GL2, and K1 is at least one element selected from the group GK1, and q3, r1, t3 and j1 satisfy $0<q3\leq32$, $0<r1\leq35$, $2<t3\leq40$, $0<j1\leq40$, $20<q3+r1+t3+j1<80$.

In formulae (17) and (18), it is more preferable that M2 is Zr and L2 is Ga.

Assuming that the element M2 and L2 are present in the form of oxide and that Si is present in at least one form of oxide, nitride and carbide, the composition of the sputtering target expressed by formula (17) can be expressed by formula (19) below:

$$(D3)_{x3}(g)_{z1}(E2)_{100-x3-z1} \text{(mol \%)} \quad (19)$$

where D3 is at least one element selected from the group GM2, g is at least one compound selected from the group consisting of $SiO_2$, $Si_3N_4$ and SiC, E2 is at least one element selected from the group GL2, x3 and z1 satisfy $10<x3<90$, (preferably $10\leq x3<70$), $0<z1\leq50$ (preferably $0<z1\leq50$), and $10<x3+z1\leq90$ (preferably $20\leq x3+z1\leq80$).

The oxide-based material layer containing the material expressed by formula (5) can be formed by sputtering the sputtering target shown by formula (19). The experiments of the inventors of the present invention confirmed that the element composition (atom %) of the formed oxide-based material layer can have oxygen in 1 to 2 atom % less than that element composition (atom %) calculated from the indicated composition (mol %) of the sputtering target.

Furthermore, the composition of the sputtering target expressed by formula (18) can be expressed by formula (20) below:

$$(D3)_{x3}(SiO_2)_{z2}(f)_{a1}(E2)_{100-x3-z2-a1} \text{(mol \%)} \quad (20)$$

where D3 is at least one element selected from the group GM2, f is at least one compound selected from the group consisting of SiC, $Si_3N_4$ and $Cr_2O_3$, E2 is at least one element selected from the group GL2, x3, z2 and a1 satisfy $10\leq x3<90$, $0<z2\leq50$, $0<a1\leq50$, and $10<x3+z2+a1\leq90$.

The oxide-based material layer containing the material expressed by formula (6) can be formed by sputtering the sputtering target shown by formula (19). The experiments of the inventors of the present invention confirmed that the element composition (atom %) of the formed oxide-based material layer can have oxygen in 1 to 2 atom % less than that element composition (atom %) calculated from the indicated composition (mol %) of the sputtering target.

In formulae (19) and (20), it is preferable that D3 is $ZrO_2$, and E2 is $Ga_2O_3$ (i.e., for example, in formula (19), a sputtering target of $(ZrO_2)_{x3}(SiO_2)_{z1}(Ga_2O_3)_{100-x3-z1}$ (mol %))

A fourth method for producing an information recording medium of the present invention is a method for producing an information recording medium containing an oxide-based material layer containing at least one element selected from the group GM2 consisting of Zr and Hf, at least one element selected from the group GL2 consisting of La, Ce, Al, Ga, In, Mg and Y, Cr, and oxygen (O), comprising forming the oxide-based material layer by sputtering using a sputtering target containing at least one element selected from the group GM2, at least one element selected from the group GL2, Cr and oxygen (O). In this case, it is preferable that the sputtering target contains a material having a composition expressed by:

$$M2_{q4}Cr_uL2_{t4}O_{100-q4-u-t4} \text{(atom \%)} \quad (21)$$

where M2 is at least one element selected from the group GM2, L2 is at least one element selected from the group GL2, and q4, u and t4 satisfy $0<q4\leq32$, $0<u\leq25$, $0<t4\leq40$, and $20<q4+u+t4<60$.

Furthermore, in the fourth method for producing of an information recording medium of the present invention, the sputtering target may further contain at least one element selected from the group GK2 consisting of nitrogen (N) and carbon (C). In this case, it is preferable that the sputtering target contains a material having a composition expressed by:

$$M2_{q4}Cr_uL2_{t4}Si_{r2}K2_{j2}O_{100-q4-u-t4-r2-j2} \text{(atom \%)} \quad (22)$$

where M2 is at least one element selected from the group GM2, L2 is at least one element selected from the group GL2, and K2 is at least one element selected from the group GK2 consisting of nitrogen (N) and carbon (C), and q4, u, t4, r2 and j2 satisfy $0<q4\leq32$, $0<u\leq25$, $0<t4\leq40$, $0<r2\leq30$, $0<j2\leq40$, and $25<q4+u+t4+r2+j2<85$.

In formulae (21) and (22), it is more preferable that M2 is Zr and L2 is Ga.

The sputtering target containing the materials expressed by formulae (21) and (22) can be expressed by formulae (23) and (24) below:

$$(D3)_{x4}(Cr_2O_3)_{a2}(E2)_{100-x4-a2} \text{(mol \%)} \quad (23)$$

where D3 is an oxide of at least one element selected from the group GM2, E2 is an oxide of at least one element selected from the group GL2, and x4 and a2 satisfy $10\leq x4<90$, $0<a2\leq40$, and $10<x4+a2\leq90$.

$$(D3)_{x4}(Cr_2O_3)_{a2}(h)_{z3}(E2)_{100-x4-a2-z3} \text{(mol \%)} \quad (24)$$

where D3 is an oxide of at least one element selected from the group GM2, h is at least one compound selected from the group consisting of $Si_3N_4$ and SiC, E2 is an oxide of at least one element selected from the group GL2, and x4, a2 and z3 satisfy $10\leq x4<90$, $0<a2\leq40$, $0<z3\leq4$, and $10<x4+a2+z3\leq90$.

In formulae (22) and (23), it is preferable that D3 is $ZrO_2$, and E2 is $Ga_2O_3$.

For example, in the formula (19), in the case of a sputtering target in which D3 is $ZrO_2$, g is $SiO_2$, and x3=z1, a complex oxide $ZrSiO_4$ containing $ZrO_2$ and $SiO_2$ in a substantially equal ratio may be included. Other than that, the material expressed by either one of the formulae (2), (4), (14), (16) and (19) may include a complex oxide such as $CeZrO_4$, $Hf_2La_2O_7$, $LaAlO_3$, $LaGaO_3$, $Mg_2SiO_4$, $MgSiO_3$, $MgZrO_3$, $Y_3Al_5O_{12}$, $Y_3Ga_5O_{12}$, $Y_{0.15}Zr_{0.85}O_{1.93}$, or $ZrSiO_4$. For example, a complex oxide may be formed of two or more oxides such that $MgSiO_3$ is present as a complex oxide of MgO and $SiO_2$, and $ZrSiO_4$ is present as a complex oxide of $ZrO_2$ and $SiO_2$, which provides even better thermal stability.

Hereinafter, embodiments of the present invention will be described with reference to the accompanying drawings. The following embodiments are only illustrative, and the present invention is not limited to the following embodiments.

Embodiment 1

As Embodiment 1 of the present invention, an example of an optical information recording medium on/from which information is recorded/reproduced using laser light will be described. FIG. 1 shows a partial cross-sectional view of the optical information recording medium.

Figure 12:
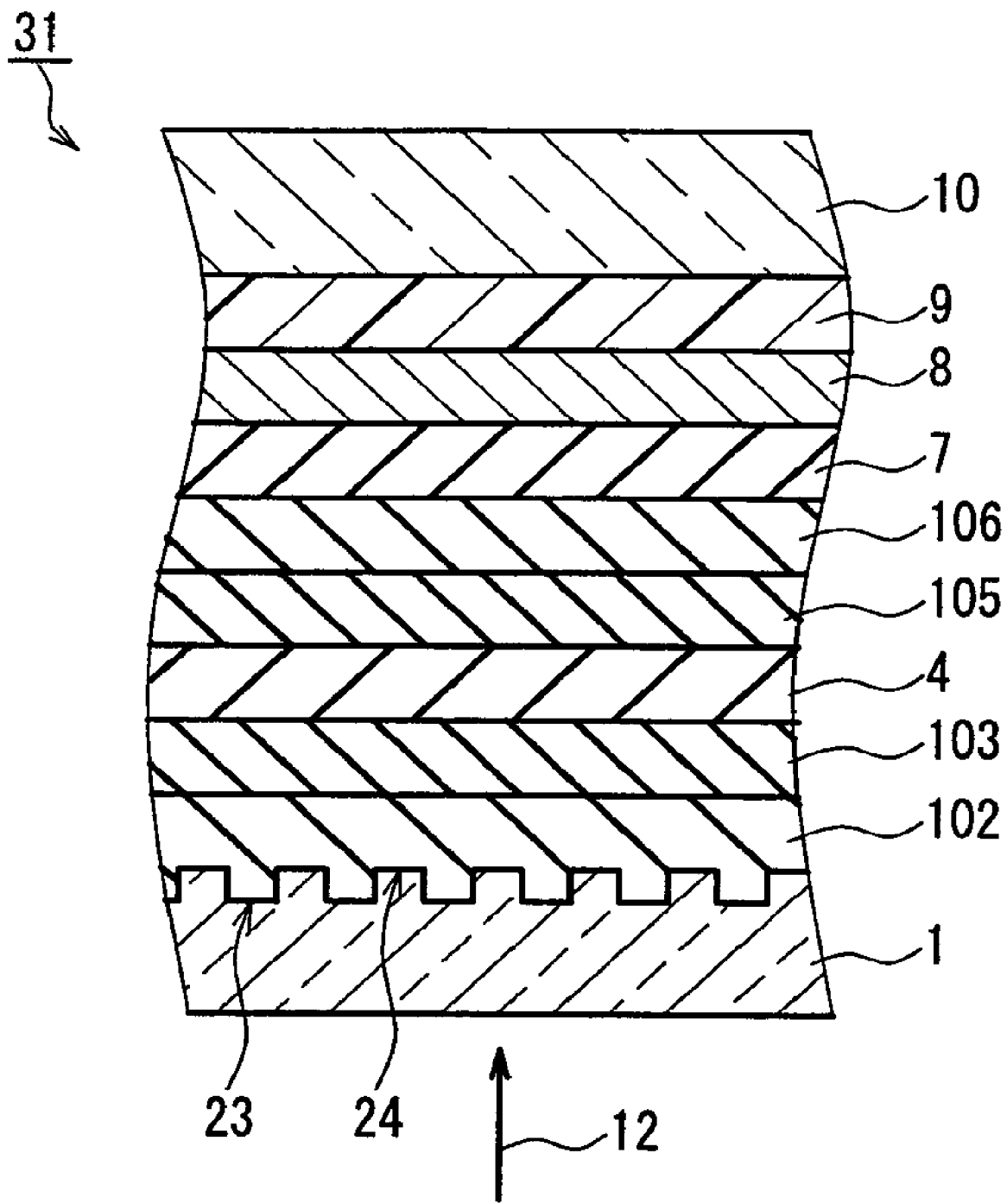
FIG. 12 is a partial cross-sectional view showing an example of a conventional information recording medium.

An information recording medium 25 shown in FIG. 1 has the following structure. A first dielectric layer 2, a recording layer 4, a second dielectric layer 6, a light-absorption correction layer 7 and a reflective layer 8 are formed on one surface of a substrate 1 in this order. Furthermore, a dummy substrate 10 is attached to the reflective layer 8 with an adhesive layer 9. In order words, the reflective layer 8 is formed on the light-absorption correction layer 7, the light-absorption correction layer 7 is formed on the second dielectric layer 6, the second dielectric layer 6 is formed on the recording layer 4, and the recording layer 4 is formed on the first dielectric layer 2. The information recording medium having this structure can be used as 4.7 GB/DVD-RAM on/from which information is recorded/reproduced with laser beams in a red region in the vicinity of a wavelength of 660 nm. Laser light 12 is incident on the information recording medium 25 having this structure from the side of the substrate 1, and thus information is recorded and reproduced. The information recording medium 25 is different from the conventional information recording medium 31 shown in FIG. 12 in that the first interface layer 103 and the second interface layer 105 are not included.

In Embodiment 1, both the first dielectric layer 2 and the second dielectric layer 6 are oxide-based material layers. As described above, the oxide-based material layer is one of the following four layers:

(I) An oxide-based material layer containing Zr, at least one element selected from the group GL1 consisting of La, Ga and In, and oxygen (O).
(II) An oxide-based material layer containing M1 (where M1 is a mixture of Zr and Hf, or Hf), at least one element selected from the group GL2 consisting of La, Ce, Al, Ga, In, Mg and Y, and oxygen (O).
(III) An oxide-based material layer containing at least one element selected from the group GM2 consisting of Zr and Hf, at least one element selected from the group GL2 consisting of La, Ce, Al, Ga, In, Mg and Y, Si, and oxygen (O).
(IV) An oxide-based material layer containing at least one element selected from the group GM2 consisting of Zr and Hf, at least one element selected from the group GL2 consisting of La, Ce, Al, Ga, In, Mg and Y, Cr, and oxygen (O).

In general, for the material of the dielectric layers, the following properties are required: being transparent; having a high melting point; not melting during recording; and having good adhesion with a recording layer that is made of chalcogenide. Being transparent is a property necessary for letting the laser light 12 incident from the side of the substrate 1 pass through the dielectric layer and reach the recording layer 4. This property is required especially for the first dielectric layer on the light-incident side. Having a high melting point is a property necessary for ensuring that the recording layer is not contaminated by the material of the dielectric layer when being irradiated with laser light at the peak power level, and is required for both the first and the second dielectric layers. When the recording layer is contaminated by the material of the dielectric layer, the repeated rewriting performance is deteriorated. Having good adhesion with the recording layer that is made of chalcogenide is a property necessary for ensuring the reliability of the information recording medium, and is required for both the first and the second dielectric layers. Furthermore, it is necessary to select the material of the dielectric layer such that the obtained information recording medium has a recording sensitivity comparable to or higher than the conventional information recording medium (i.e., a medium in which interface layers are provided between the dielectric layers made of $(ZnS)_{80}(SiO_2)_{20}$ (mol %) and the recording layer).

Among the components contained in the oxide-based material layers (I) to (IV), an oxide of each of Zr and Hf is transparent and has a high melting point and excellent thermal stability. Therefore, these compounds ensure the repeated rewriting performance of the information recording medium. Among the components contained in the oxide-based material layers (I) to (IV), an oxide of each of La, Ce, Al, Ga, In, Mg and Y also is transparent and has excellent adhesion with the recording layer and moisture resistance. Therefore, these compounds ensure the moisture resistance of the information recording medium. An oxide of each of Zr and Hf contains, for example, $ZrO_2$ and $HfO_2$, respectively. An oxide of each of La, Ce, Al, Ga, In, Mg and Y contains, for example, $La_2O_3$, $CeO_2$, $Al_2O_3$, $Ga_2O_3$, $In_2O_3$, $MgO$ and $Y_2O_3$, respectively. $SiO_2$ may be contained. The melting points of these oxides (literature data) are as follows: about 2700° C. for $ZrO_2$ and $HfO_2$; about 2300° C. for $La_2O_3$; about 2000° C. for $CeO_2$; about 2000° C. for $Al_2O_3$; about 1700° C. for $Ga_2O_3$; about 1900° C. for $In_2O_3$; about 2800° C. for $MgO$; about 2400° C. for $Y_2O_3$; and about 1700° C. for $SiO_2$. All of these melting points are higher than that of the recording layer, which is 500 to 700° C., and the possibility that the layers are melted during recording and diffused in the recording layer is very low. Furthermore, a complex oxide containing oxides of at least two elements as above can be formed. For example, $ZrSiO_4$ containing $ZrO_2$ and $SiO_2$ in a substantially equal ratio or $MgSiO_3$ containing $MgO$ and $SiO_2$ in a substantially equal ratio may be formed.

Layers containing a material in which these oxides are mixed are formed into the first dielectric layer 2 and the second dielectric layer 6 so as to be in contact with the recording layer 4 as shown in FIG. 1, and thus the information recording medium 25 having excellent repeated rewriting performance, and good adhesion between the recording layer and the dielectric layers can be realized.

When the oxide-based material layer (I) is used as the dielectric layers 2 and 6, the oxide-based material layer contains a material having a composition expressed by $Zr_{Q1}L1_{T1}O_{100-Q1-T1}$ (atom %), where L1 is at least one element selected from the group GL1, Q1 and T1 satisfy 0<Q1<34, 0<T1<50, and 20<Q1+T1<60. When Zr is contained in 34 atom % or more, the adhesion is deteriorated. When the element L1 is contained in 50 atom % or more, the repeated rewriting performance is deteriorated. When oxygen (O) is contained in less than 40 atom %, the transparency becomes poor. More preferably, 4<Q1<24, 6<T1<37, and 30<Q1+T1<50 are satisfied.

When the oxide-based material layer (II) is used as the dielectric layers 2 and 6, the oxide-based material layer contains a material having a composition expressed by $M1_{Q2}L2_{T2}O_{100-Q2-T2}$ (atom %), where M1 is a mixture of Zr and Hf, or Hf, L2 is at least one element selected from the group GL2, and Q2 and T2 satisfy 0<Q2<34, 0<T2<50, and 20<Q2+T2<60. When M1 is contained in 34 atom % or more, the adhesion is deteriorated. When the element L2 is contained in 50 atom % or more, the repeated rewriting performance is deteriorated. When oxygen (O) is contained in less than 40 atom %, the transparency becomes poor. More preferably, 4<Q2<24, 6<T2<37, and 30<Q2+T2<50 are satisfied.

Examples of constituent elements of the oxide-based material layers (I) and (II) include Zr—La—O, Zr—Hf—La—O, Hf—La—O, Zr—Hf—Ce—O, Hf—Ce—O, Zr—Hf—Al—O, Hf—Al—O, Zr—Ga—O, Zr—Hf—Ga—O, Hf—Ga—O, Zr—In—O, Zr—Hf—In—O, Hf—In—O, Zr—Hf—

Mg—O, Hf—Mg—O, Zr—Hf—Y—O, and Hf—Y—O, and it is believed that they are present in the layer in the form where at least two oxides are mixed. When the composition of the oxide-based material layer is analyzed with a X-ray microanalyzer, the atom % of each element (Q1, T1, 100-Q1-T1, Q2, T2, 100-Q2-T2) can be obtained. For example, in the case of Zr—Ga—O, the oxide-based material layer is present substantially in the form of $ZrO_2$—$Ga_2O_3$. Zr—Ga—O is an excellent material having high transparency, low thermal conductivity, high adhesion, and high film-formation speed.

Regarding other materials than Zr—Ga—O, the elements also are believed to be present in the following form of a mixed material: $ZrO_2$—$La_2O_3$, $ZrO_2$—$HfO_2$—$La_2O_3$, $HfO_2$—$La_2O_3$, $ZrO_2$—$HfO_2$—$CeO_2$, $HfO_2$—$CeO_2$, $ZrO_2$—$HfO_2$—$Al_2O_3$, $HfO_2$—$Al_2O_3$, $ZrO_2$—$Ga_2O_3$, $ZrO_2$—$HfO_2$—$Ga_2O_3$, $HfO_2$—$Ga_2O_3$, $ZrO_2$—$In_2O_3$, $ZrO_2$—$HfO_2$—$In_2O_3$, $HfO_2$—$In_2O_3$, $ZrO_2$—$HfO_2$—MgO, $HfO_2$—MgO, $ZrO_2$—$HfO_2$—$Y_2O_3$, and $HfO_2$—$Y_2O_3$.

When the oxide-based material layer (III) is used as the dielectric layers 2 and 6, the oxide-based material layer contains a material having a composition expressed by $M2_{Q3}Si_{R1}L2_{T3}O_{100-Q3-R1-T3}$ (atom %), where M2 is at least one element selected from the group GM2, L2 is at least one element selected from the group GL2, and Q3, R1 and T3 satisfy $0<Q3\leq32$, $0<R1\leq32$, $3<T3<43$, and $20<Q3+R1+T3<60$. When M2 or Si is contained in 32 atom % or more, the adhesion is deteriorated. When the element L2 is contained in 43 atom % or more, the repeated rewriting performance is deteriorated. When oxygen (O) is contained in less than 40 atom %, the transparency becomes poor. More preferably, $0<Q3<25$, $0<R1<25$, $6<T3<37$, and $30<Q3+R1+T3<50$ are satisfied.

Examples of constituent elements of the oxide-based material layers (III) include Zr—Si—La—O, Zr—Si—Hf—La—O, Hf—Si—La—O, Zr—Si—Ce—O, Zr—Si—Hf—Ce—O, Hf—Si—Ce—O, Zr—Si—Al—O, Zr—Si—Hf—Al—O, Hf—Si—Al—O, Zr—Si—Ga—O, Zr—Si—Hf—Ga—O, Hf—Si—Ga—O, Zr—Si—In—O, Zr—Si—Hf—In—O, Hf—Si—In—O, Zr—Si—Mg—O, Zr—Si—Hf—Mg—O, Hf—Si—Mg—O, Zr—Si—Y—O, Zr—Hf—Si—Y—O, Hf—Si—Y—O, and Zr—Si—Ga—Y—O, and it is believed that all of them are present in the layer in the form where at least two oxides are mixed. For example, Zr—Si—Ga—O is present substantially in the form of $ZrO_2$—$SiO_2$—$Ga_2O_3$. In particular, Zr—Si—Ga—O is an excellent material having high transparency, low thermal conductivity, high adhesion, high repeated rewriting performance, and high film-formation speed.

Regarding materials other than Zr—Si—Ga—O, the elements also are believed to be present in the following form of a mixed material: $ZrO_2$—$SiO_2$—$La_2O_3$, $ZrO_2$—$HfO_2$—$SiO_2$—$La_2O_3$, $HfO_2$—$SiO_2$—$La_2O_3$, $ZrO_2$—$SiO_2$—$CeO_2$, $ZrO_2$—$HfO_2$—$SiO_2$—$CeO_2$, $HfO_2$—$SiO_2$—$CeO_2$, $ZrO_2$—$SiO_2$—$Al_2O_3$, $ZrO_2$—$HfO_2$—$SiO_2$—$Al_2O_3$, $HfO_2$—$SiO_2$—$Al_2O_3$, $ZrO_2$—$SiO_2$—$Ga_2O_3$, $ZrO_2$—$HfO_2$—$SiO_2$—$Ga_2O_3$, $HfO_2$—$SiO_2$—$Ga_2O_3$, $ZrO_2$—$SiO_2$—$In_2O_3$, $ZrO_2$—$HfO_2$—$SiO_2$—$In_2O_3$, $HfO_2$—$SiO_2$—$In_2O_3$, $ZrO_2$—$SiO_2$—MgO ($ZrO_2$—$MgSiO_3$), $ZrO_2$—$HfO_2$—$SiO_2$—MgO, $HfO_2$—$SiO_2$—MgO, $ZrO_2$—$SiO_2$—$Y_2O_3$, $ZrO_2$—$HfO_2$—$SiO_2$—$Y_2O_3$, $HfO_2$—$SiO_2$—$Y_2O_3$, and $ZrO_2$—$SiO_2$—$Ga_2O_3$—$Y_2O_3$.

The oxide-based material layer (III) may further contain at least one element K1 selected from the group GK1 consisting of C, N and Cr. The oxide-based material layer contains a material having a composition expressed by $M2_{Q3}Si_{R1}L2_{T3}K1_{J1}O_{100-Q3-R1-T3-J1}$ (atom %), where M2 is at least one element selected from the group GM2, L2 is at least one element selected from the group GL2, and K1 is at least one element selected from the group GK1, and Q3, R1, T3 and J1 satisfy $0<Q3\leq32$, $0<R1\leq35$, $2<T3\leq40$, $0<J1\leq40$, and $20<Q3+R1+T3+J1<80$. When oxides of M2 and Si are included, the repeated rewriting performance is improved, and an oxide of Si also serves to improve the transparency. An oxide of the element L2 has high transparency and excellent adhesion with the recording layer. When the element K1 is included, the thermal conductivity of the oxide-based material layer can be reduced, or the adhesion with the recording layer can be further improved. More specifically, when the element K1 is C, it is expected that a carbide of Si is present together with oxides of M2 and L2, and these oxides can form a complex structure without being mixed with each other. Similarly, when K1 is N, it is expected that a nitride of Si is present together with oxides of M2 and L2, and these oxides can form a complex structure without being mixed with each other. It is believed that a complex structure makes it difficult for heat to be transmitted, so that the thermal conductivity can be reduced. An oxide of Cr contained in the group GK1 has good adhesion with the recording layer. For these seasons above, a system of $M2_{Q3}Si_{R1}L2_{T3}K1_{J1}O_{100-Q3-R1-T3-J1}$ (atom %) is an excellent oxide-based material layer. Preferable atom concentrations are shown above. When M2 is contained in 32 atom % or more or Si is contained in 35 atom % or more, the adhesion with the recording layer is deteriorated. When the element L2 is contained in 40 atom % or more, the repeated rewriting performance is deteriorated. When the element K1 exceeds 40 atom %, the transparency is deteriorated. In this oxide-based material layer, when oxygen (O) is contained in less than 20 atom %, the transparency becomes poor. In a more preferable atom concentration, $0<Q3<25$, $0<R1<25$, $6<T3<37$, $0<J1<35$, and $30<Q3+R1+T3+J1<50$ are satisfied.

Examples of constituent elements when the element K1 is contained in the oxide-based material layers (III) include Zr—Si—La—Cr—O, Zr—Si—La—N—O, Zr—Si—La—C—O, Zr—Si—Ga—Cr—O, Zr—Si—La—N—O, Zr—Si—La—C—O, Zr—Si—Y—Cr—O, Zr—Si—Y—N—O, and Zr—Si—Y—C—O, and it is believed that they are present in the layer in the form where at least two oxides are mixed. For example, Zr—Si—La—Cr—O is present substantially in the form of $ZrO_2$—$SiO_2$—$La_2O_3$—$Cr_2O_3$. In particular, Zr—Si—Ga—Cr—O is an excellent material having high transparency, low thermal conductivity, high adhesion, high repeated rewriting performance, and high film-formation speed.

Regarding other materials than Zr—Si—La—Cr—O, the elements also are believed to be present in the following form of a mixed material: $ZrO_2$—$SiO_2$—$La_2O_3$—$Si_3N_4$, $ZrO_2$—$SiO_2$—$La_2O_3$—SiC, $ZrO_2$—$SiO_2$—$Ga_2O_3$—$Si_3N_4$, $ZrO_2$—$SiO_2$—$Ga_2O_3$—SiC, $ZrO_2$—$SiO_2$—$Ga_2O_3$—$Cr_2O_3$, $ZrO_2$—$SiO_2$—$In_2O_3$—$Si_3N_4$, $ZrO_2$—$SiO_2$—$In_2O_3$—SiC, $ZrO_2$—$SiO_2$—$In_2O_3$—$Cr_2O_3$, and $HfO_2$—$SiO_2$—$La_2O_3$—$Si_3N_4$, $HfO_2$—$SiO_2$—$La_2O_3$—SiC, $HfO_2$—$SiO_2$—$La_2O_3$—$Cr_2O_3$, $HfO_2$—$SiO_2$—$Ga_2O_3$—$Si_3N_4$, $HfO_2$—$SiO_2$—$Ga_2O_3$—SiC, $HfO_2$—$SiO_2$—$Ga_2O_3$—$Cr_2O_3$, $HfO_2$—$SiO_2$—$In_2O_3$—$Si_3N_4$, $HfO_2$—$SiO_2$—$In_2O_3$—SiC, and $HfO_2$—$SiO_2$—$In_2O_3$—$Cr_2O_3$.

Furthermore, Si may form only a carbide or a nitride, and in this case, the elements are believed to be present in the following form of a mixed material: $ZrO_2$—$La_2O_3$—$Si_3N_4$, $ZrO_2$—$La_2O_3$—SiC, $ZrO_2$—$Ga_2O_3$—$Si_3N_4$, $ZrO_2$—$Ga_2O_3$—SiC, $ZrO_2$—$In_2O_3$—$Si_3N_4$, $ZrO_2$—$In_2O_3$—SiC, $ZrO_2$—$In_2O_3$—$Cr_2O_3$, and $HfO_2$—$CeO_2$—$Si_3N_4$, $HfO_2$—

CeO$_2$—SiC, HfO$_2$—Al$_2$O$_3$—Si$_3$N$_4$, HfO$_2$—Ga$_2$O$_3$—Si$_3$N$_4$, HfO$_2$—Ga$_2$O$_3$—SiC, HfO$_2$—In$_2$O$_3$—Si$_3$N$_4$, and HfO$_2$—In$_2$O$_3$—SiC.

When the oxide-based material layer (IV) is used as the dielectric layers 2 and 6, the oxide-based material layer contains a material having a composition expressed by M2$_{Q4}$Cr$_U$L2$_{T4}$O$_{100-Q4-U-T4}$ (atom %), where M2 is at least one element selected from the group GM2 consisting of Zr and Hf, L2 is at least one element selected from the group GL2, and Q4, U and T4 satisfy 0<Q4≦32, 0<U≦25, 0<T4≦40, and 20<Q4+U+T4<60. When the element M4 is contained in 32 atom % or more, in particular, the adhesion with the recording layer is deteriorated. When Cr is included, the adhesion with the recording layer is improved. When Cr is contained in 25 atom % or more, the transparency of the oxide-based material layer is deteriorated. When the element L2 is contained in 40 atom % or more, the repeated rewriting performance is deteriorated. When oxygen (O) is contained in less than 40 atom %, the transparency becomes poor. More preferably, 0<Q4<25, 0<U<18, 6<T4<20, and 30<Q4+U+T4<50 are satisfied.

Examples of constituent elements of the oxide-based material layers in this case include Zr—Cr—La—O, Zr—Cr—Hf—La—O, Hf—Cr—La—O, Zr—Cr—Ce—O, Zr—Cr—Hf—Ce—O, Hf—Cr—Ce—O, Zr—Cr—Al—O, Zr—Cr—Hf—Al—O, Hf—Cr—Al—O, Zr—Cr—Ga—O, Zr—Cr—Hf—Ga—O, Hf—Cr—Ga—O, Zr—Cr—In—O, Zr—Cr—Hf—In—O, Hf—Cr—In—O, Zr—Cr—Hf—Mg—O, Hf—Cr—Mg—O, Zr—Cr—Mg—O, Zr—Cr—Y—O, Zr—Hf—Cr—Y—O, and Hf—Cr—Y—O, and it is believed that they are present in the layer in the form where at least two oxides are mixed. For example, Zr—Cr—Ga—O is present substantially in the form of ZrO$_2$—Cr$_2$O$_3$—Ga$_2$O$_3$. In particular, Zr—Cr—Ga—O is an excellent material having high transparency, low thermal conductivity, high adhesion, high repeated rewriting performance, and high film-formation speed.

Regarding other materials than Zr—Cr—Ga—O, the elements are believed to be present in the following form of a mixed material: ZrO$_2$—Cr$_2$O$_3$—La$_2$O$_3$, ZrO$_2$—HfO$_2$—Cr$_2$O$_3$—La$_2$O$_3$, HfO$_2$—Cr$_2$O$_3$—La$_2$O$_3$, ZrO$_2$—Cr$_2$O$_3$—CeO$_2$, ZrO$_2$—HfO$_2$—Cr$_2$O$_3$—CeO$_2$, HfO$_2$—Cr$_2$O$_3$—CeO$_2$, ZrO$_2$—Cr$_2$O$_3$—Al$_2$O$_3$, ZrO$_2$—HfO$_2$—Cr$_2$O$_3$—Al$_2$O$_3$, HfO$_2$—Cr$_2$O$_3$—Al$_2$O$_3$, ZrO$_2$—Cr$_2$O$_3$—Ga$_2$O$_3$, ZrO$_2$—HfO$_2$—Cr$_2$O$_3$—Ga$_2$O$_3$, HfO$_2$—Cr$_2$O$_3$—Ga$_2$O$_3$, ZrO$_2$—Cr$_2$O$_3$—In$_2$O$_3$, ZrO$_2$—HfO$_2$—Cr$_2$O$_3$—In$_2$O$_3$, HfO$_2$—Cr$_2$O$_3$—In$_2$O$_3$, ZrO$_2$—Cr$_2$O$_3$—MgO, ZrO$_2$—HfO$_2$—Cr$_2$O$_3$—MgO, HfO$_2$—Cr$_2$O$_3$—MgO, ZrO$_2$—Cr$_2$O$_3$—Y$_2$O$_3$, ZrO$_2$—HfO$_2$—Cr$_2$O$_3$—Y$_2$O$_3$, HfO$_2$—Cr$_2$O$_3$—Y$_2$O$_3$, and ZrO$_2$—Cr$_2$O$_3$—Ga$_2$O$_3$—Y$_2$O$_3$.

Figure 7:
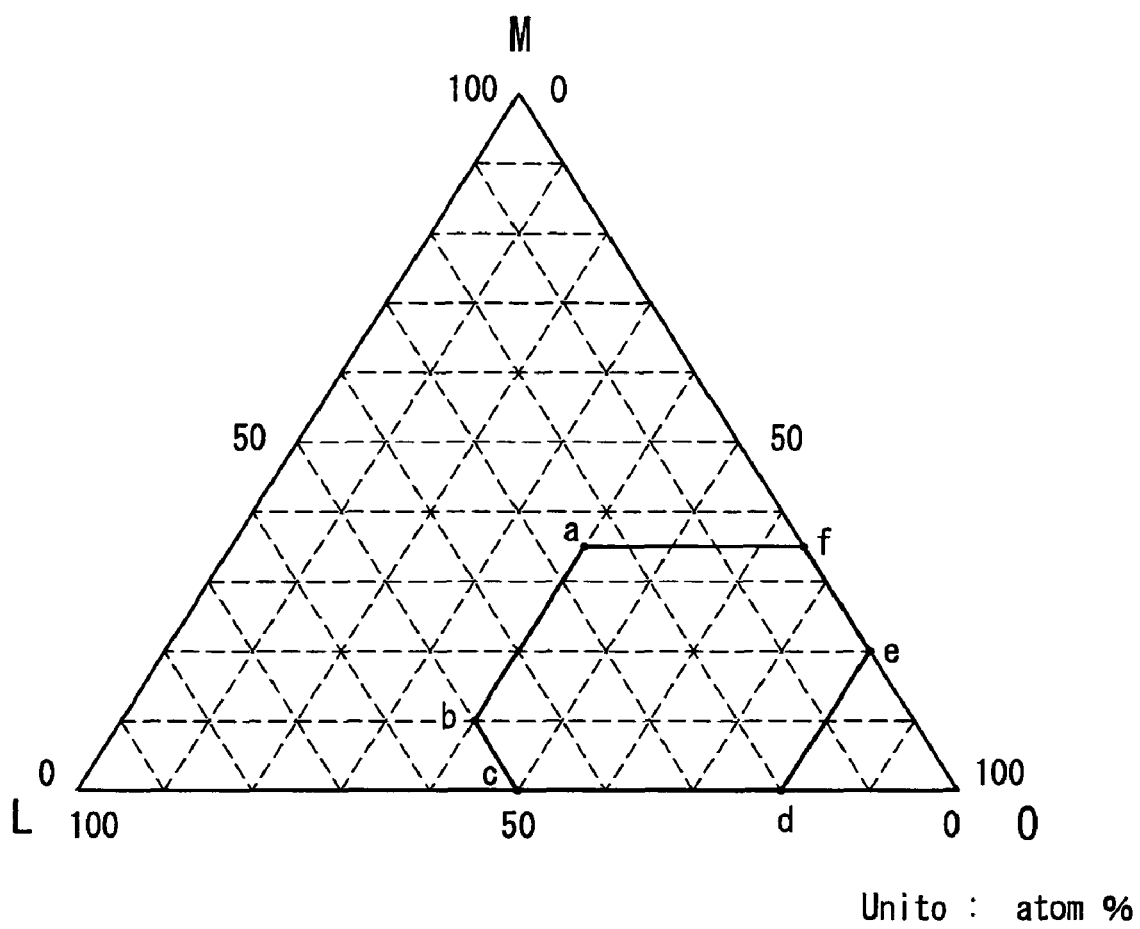
FIG. 7 is a triangular diagram showing a composition range of a material expressed by formula (1) or (3) of an example of the present invention.

FIG. 7 shows the composition range of a material expressed by formula (1) or (3). In FIG. 7, the coordinate is (M, L, O), and the unit is atom %. The coordinate M is Zr or the element M1, and the coordinate L is the element L1 or L2. In this diagram, the material expressed by formula (1) or (3) is a material that falls into the range (the line is not included) enclosed by the segments connecting a (34, 26, 40), b (10, 50, 40), c (0, 50, 50), d (0, 20, 80), e (20, 0, 80), and f (34, 0, 66).

It is preferable that the oxide-based material layer (I) contains an oxide of Zr and an oxide of an element selected from the group GL1 in a combined content of 90 mol % or more. It is preferable that the oxide-based material layer (II) contains an oxide of M1 and an oxide of an element selected from the group GL2 in a combined content of 90 mol % or more. It is preferable that the oxide-based material layer (III) contains an oxide of an element selected from the group GM2, an oxide of an element selected from the group GL2 and an oxide of Si in a combined content of 90 mol % or more. It is preferable that the oxide-based material layer (IV) contains an oxide of an element selected from the group GM2, an oxide of an element selected from the group GL2 and an oxide of Cr in a combined content of 90 mol % or more. The thermal stability and the moisture resistance of the layer containing these compounds in a combined content of 90 mol % or more are not changed even if a third component other than those is included, and this layer preferably can be used as the first dielectric layer 2 and the second dielectric layer 6. The third component is a substance that is inevitably contained when forming the oxide-based material layer, a substance that is allowed to be added, or a substance that is inevitably formed. As the third component, for example, dielectrics, metal, semi-metal, semiconductors, and or non-metal can be contained in the oxide-based material layer. The dielectrics can be contained in about 10 mol %, and the content of metal preferably is 2 mol % or less. The content of semi-metal, semiconductors, or non-metal preferably is 5 mol % or less.

Specific examples of dielectrics contained as the third component include Bi$_2$O$_3$, Cr$_2$O$_3$, CuO, Cu$_2$O, Er$_2$O$_3$, FeO, Fe$_2$O$_3$, Fe$_3$O$_4$, Ho$_2$O$_3$, GeO, GeO$_2$, and a mixture of In$_2$O$_3$ and SnO$_2$, Mn$_3$O$_4$, Nb$_2$O$_5$, Nd$_2$O$_3$, NiO, Sb$_2$O$_3$, Sb$_2$O$_4$, Sc$_2$O$_3$, SiO$_2$, Sm$_2$O$_3$, SnO, SnO$_2$, Ta$_2$O$_5$, Tb$_4$O$_7$, TeO$_2$, TiO$_2$, WO$_3$, Yb$_2$O$_3$, ZnO, AlN, BN, CrN, Cr$_2$N, HfN, NbN, Si$_3$N$_4$, TaN, TiN, VN, ZrN, B$_4$C, Cr$_3$C$_2$, HfC, Mo$_2$C, NbC, SiC, TaC, TiC, VC, W$_2$C, WC and ZrC.

Specific examples of metal contained as the third component include Sc, Y, Ti, Zr, Hf, V, Nb, Ta, Cr, Mo, W, Mn, Fe, Ni, Pd, Pt, Cu, Ag, Au, Zn, La, Ce, Nd, Sm, Gd, Tb, Dy and Yb.

Specific examples of semi-metal and semiconductors contained as the third component include B, Al, C, Si, Ge and Sn. Specific examples of non-metal contained as the third component include Sb, Bi, Te, and Se.

The first dielectric layer 2 and the second dielectric layer 6 serve to adjust the light absorptance Ac (%) of the recording layer 4 in the crystalline phase and the light absorptance Aa (%) of the recording layer 4 in the amorphous phase, the light reflectance Rc (%) of the information recording medium 25 when the recording layer 4 is in the crystalline phase and the light reflectance Ra (%) of the information recording medium 25 when the recording layer 4 is in the amorphous phase, and the phase difference ΔΦ of light between a crystalline portion and an amorphous portion of the recording layer 4 of the information recording medium 25 by changing the optical path length (i.e., a product nd of the refractive index n of the dielectric layers and the thickness d of the dielectric layers). In order to improve the signal quality by increasing the reproduction signal amplitude of a recording mark, it is preferable that the difference in the reflectance (|Rc−Ra|) or the reflectance ratio (Rc/Ra) is large. Furthermore, it also is preferable that Ac and Aa are large so that the recording layer 4 absorbs laser light. The optical path lengths of the first dielectric layer 2 and the second dielectric layer 6 are determined so as to satisfy these conditions at the same time. The optical path lengths that satisfy these conditions can be determined precisely by calculations based on a matrix method (e.g., see the third chapter of "Wave Optics" by Hiroshi Kubota, published by Iwanami Shinsho, 1971).

The above-described oxide-based material layer has a refractive index that varies depending on the composition. The optical path length nd can be expressed as nd=aλ, where n is the refractive index of the dielectric layer, d (nm) is the thickness of the dielectric layer, and λ(nm) is the wavelength of the laser light 12. Here, a is a positive number. In order to improve the signal quality by increasing the reproduction signal amplitude of a recording mark of the information recording medium 25, for example, it is preferable that 15%≦Rc and Ra≦2%. In order to eliminate or minimize mark strain due to rewriting, it is preferable to satisfy 1.1≦Ac/Aa. The optical path lengths (aλ) of the first dielectric layer 2 and the second dielectric layer 6 were obtained precisely so as to satisfy these preferable conditions at the same time by calculations based on a matrix method. The thickness d of the dielectric layers was obtained based on the obtained optical path length (aλ), and λ and n. As a result, it was found out that, for example, when the first dielectric layer 2 was formed of a material expressed by $Zr_{Q3}Si_{R1}Ga_{T3}O_{100-Q3-R1-T3}$ (atom %) (which can be expressed as $(ZrO_2)_{X3}(SiO_2)_{Z1}(Ga_2O_3)_{100-X3-Z1}$ (mol %)) and having a refractive index n of 1.7 to 2.3, the thickness preferably was 100 nm to 200 nm. It also was found that when the second dielectric layer 6 was formed of this material, the thickness preferably was 20 nm to 80 nm.

In the information recording medium of Embodiment 1, the oxide-based material layer of the present invention is used both in the first dielectric layer 2 and the second dielectric layer 6, for example. However, it is possible to use the same material, materials having the same constituent elements but different composition ratios, or materials having different constituent elements. For example, $Zr_6Si_6Ga_{25}O_{63}$ (atom %) can be used for the first dielectric layer 2 and the second dielectric layer 6. Alternatively, $Zr_{16}Si_4Ga_{17}O_{63}$ (atom %) can be used for the first dielectric layer 2, and $Zr_3Si_{13}Ga_{21}O_{63}$ (atom %) can be used for the second dielectric layer 6. Alternatively, $Zr_{13}Ga_{13}Y_{12}O_{62}$ (atom %) can be used for the first dielectric layer 2, and $Hf_3Zr_5Si_8La_{12}Mg_{10}O_{62}$ (atom %) can be used for the second dielectric layer 6.

The substrate 1 generally is a transparent disk-like plate. Guide grooves for guiding laser light may be formed on a surface on which the dielectric layers and the recording layer or the like are to be formed. When guide grooves are formed on the substrate, groove portions and land portions are formed when the cross-section of the substrate is viewed. In this specification, the surface nearer to the incident side of the laser light 12 is referred to as "groove surface" for convenience, and the surface farther from the incident side of the laser light 12 is referred to as "land surface" for convenience. In FIG. 1, the bottom surface 23 of the guide grooves in the substrate corresponds to the groove surface, and the top surface 24 corresponds to the land surface. This applies to FIGS. 2, 3, and 4.

The step between the groove surface 23 and the land surface 24 of the substrate 1 in the embodiment shown in FIG. 1 preferably is 40 nm to 60 nm. Also in the substrate 1 constituting the information recording media of embodiments shown in FIGS. 2, 3, and 4, it is preferable that the step between the groove surface 23 and the land surface 24 is in this range. The distance between the grooves and the lands (from the center of the groove surface 23 to the center of the land surface 24) is, for example, about 0.615 µm in the case of 4.7 GB/DVD-RAM. It is preferable that the surface on which the layers are not formed is smooth.

As a material of the substrate 1, resin such as polycarbonate, amorphous polyolefin or polymethyl methacrylate (PMMA) or glass can be used. In view of the formability, the cost, and the mechanical strength, polycarbonate is used preferably. In the embodiment shown, the thickness of the substrate 1 is about 0.5 to 0.7 mm.

The recording layer 4 is a layer in which a recording mark is formed by light irradiation or the application of electric energy to cause phase transformation between a crystalline phase and an amorphous phase. If the phase transformation is reversible, erasure and rewriting can be performed.

As a reversible phase transformation material, it is preferable to use Ge—Sb—Te or Ge—Sn—Sb—Te, which are high speed crystallization materials. More specifically, in the case of Ge—Sb—Te, GeTe—$Sb_2Te_3$ pseudo-binary system composition is preferable. In this case, it is preferable that $Sb_2Te_3 \leq GeTe \leq 50Sb_2Te_3$ is satisfied. In the case of GeTe<$Sb_2Te_3$, the change in the reflected light amount between before and after recording is small so that the quality of read-out signals is deteriorated. In the case of $50Sb_2Te_3$<GeTe, the change in volume between the crystalline phase and the amorphous phase is large, and the repeated rewriting performance is deteriorated.

Ge—Sn—Sb—Te has a higher crystallization rate than that of Ge—Sb—Te. Ge—Sn—Sb—Te is, for example, a substance in which a part of Ge of a GeTe—$Sb_2Te_3$ pseudo-binary composition is substituted with Sn. In the recording layer 4, it is preferable that the content of Sn is 20 atom % or less. When it exceeds 20 atom %, the crystallization rate is too high, and therefore the stability of the amorphous phase is impaired, and the reliability of recording marks is deteriorated. The content of Sn can be adjusted in accordance with the recording conditions.

The recording layer 4 can be formed of a material containing Bi such as Ge—Bi—Te, Ge—Sn—Bi—Te, Ge—Sb—Bi—Te, or Ge—Sn—Sb—Bi—Te. Bi is crystallized more readily than Sb. Therefore, the crystallization rate of the recording layer 4 can be improved by substituting at least a part of Sb with Bi.

Ge—Bi—Te is a mixture of GeTe and $Bi_2Te_3$. In this mixture, it is preferable that $4Bi_2Te_3 \leq GeTe \leq 50Bi_2Te_3$ is satisfied. In the case of GeTe<$4Bi_2Te_3$, the crystallization temperature is reduced, and the archival characteristic tends to be deteriorated. In the case of $50Bi_2Te_3$<GeTe, the change in volume between the crystalline phase and the amorphous phase is large, and the repeated rewriting performance is deteriorated.

Ge—Sn—Bi—Te corresponds to a substance in which a part of Ge of Ge—Bi—Te is substituted with Sn. It is possible to control the crystallization rate in accordance with the recording conditions by adjusting the concentration of substitution with Sn. Sn substitution is more suitable for fine tuning of the crystallization rate of the recording layer than Bi substitution. In the recording layer, it is preferable that the content of Sn is 10 atom % or less. When it exceeds 10 atom %, the crystallization rate is too high, and therefore the stability of the amorphous phase is impaired, and the reliability of recording marks is deteriorated.

Ge—Sn—Sb—Bi—Te corresponds to a substance in which a part of Ge of Ge—Sb—Te is substituted with Sn, and a part of Sb is substituted with Bi. This corresponds to a mixture of GeTe, SnTe, $Sb_2Te_3$ and $Bi_2Te_3$. In this mixture, it is possible to control the crystallization rate in accordance with the recording conditions by adjusting the Sn substitution concentration and the Bi substitution concentration. In Ge—Sn—Sb—Bi—Te, it is preferable that $2(Sb—Bi)_2Te_3 \leq (Ge—Sn)Te \leq 50(Sb—Bi)_2Te_3$ is satisfied. In the case of $(Ge—Sn)Te<2(Sb—Bi)_2Te_3$, the change in the reflected light amount between before and after recording is small so that the quality of read-out signals is deteriorated. In the case of $50(Sb—Bi)_2Te_3<(Ge—Sn)Te$, the change in volume between the crystalline phase and the amorphous phase is large, and the repeated rewriting performance is deteriorated. In the recording layer, it is preferable that the content of Bi is 10 atom % or less and that the content of Sn is 20 atom % or less. When the contents of Bi and Sn are in the above-described ranges, good preservability of recording marks can be obtained.

As other materials causing reversible phase transformation, materials containing Ag—In—Sb—Te, Ag—In—Sb—Te—Ge or Sb—Te containing 70 atom % or more of Sb can be used.

As an irreversible phase transformation material, it is preferable to use TeOx+α (α is Pd, Ge or the like), as disclosed in, for example, JP7-25209B (Japanese Patent No. 2006849). The information recording medium in which the recording layer is made of an irreversible material is a so-called write-once type that allows recording only once. In such an information recording medium as well, there is a problem that atoms in the dielectric layer are diffused into the recording layer due to heat during recording, and the quality of signals is deteriorated. Therefore, the present invention can apply preferably, not only to a rewritable information recording medium, but also to a write-once type information recording medium.

When the recording layer 4 is formed of a material whose phase is changed reversibly (i.e., the information recording medium is a rewritable information recording medium), it is preferable that the thickness of the recording layer 4 is 20 nm or less, and more preferably 15 nm or less.

For the recording layer, a magneto-optical material on which recording, erasure and reproduction are performed by application of a magnetic field and irradiation of light may be used. A material containing at least one element selected from a rare earth metal group of consisting of Tb, Gd, Dy, Nd, and Sm, and at least one element selected from a transition metal group of consisting of Sc, Cr, Fe, Co, and Ni can be used. More specifically, Tb—Fe, Tb—Fe—Co, Gd—Fe, Gd—Fe—Co, Dy—Fe—Co, Nd—Fe—Co, Sm—Co, Tb—Fe—Ni, Gd—Tb—Fe—Co, and Dy—Sc—Fe—Co can be used. In the case where the material of the recording layer is a magneto-optical material, the structure of the information recording medium does not necessarily match those shown in FIGS. 1 to 6, but the oxide-based material layer of the present invention can be used as a dielectric layer, regardless of the recording material or the layer structure.

The light-absorption correction layer 7 serves to adjust the ratio Ac/Aa of the light absorptance Ac when the recording layer 4 is in a crystalline state and the light absorptance Aa when the recording layer 4 is in an amorphous state, and prevent the mark shape from being distorted at the time of rewriting. It is preferable that the light-absorption correction layer 7 is formed of a material that has a high refractive layer and absorbs light in a suitable amount. For example, the light-absorption correction layer 7 can be formed of a material having a refractive index n of 3 or more and 6 or less and an extinction coefficient k of 1 or more and 4 or less. More specifically, it is preferable to use a material selected from amorphous Ge alloys such as Ge—Cr, Ge—Mo, and Ge—W, amorphous Si alloys such as Si—Cr, Si—Mo, and Si—W, and crystalline metals, semi-metal and semiconductor materials such as Ti, Zr, Nb, Ta, Cr, Mo, W, SnTe and PbTe. It is preferable that the thickness of the light-absorption correction layer 7 is 20 nm to 60 nm.

The reflective layer 8 serves to facilitate a change to the amorphous stable, optically by increasing the light amount that is absorbed by the recording layer 4, and thermally by diffusing heat generated in the recording layer 4 to cool the recording layer 4 rapidly. Furthermore, the reflective layer 8 protects the multilayer including the light-absorption correction layer 7, the recording layer 4, the dielectric layers 2 and 6 from the environment of use. As a material of the reflective layer 8, for example, a single metal material having a high thermal conductivity such as Al, Au, Ag, and Cu can be used. The reflective layer 8 may be formed of a material in which another element or a plurality of other elements are added to one or a plurality of elements selected from the aforementioned metal materials for the purpose of improving the moisture resistance and/or adjusting the thermal conductivity or optical characteristics (i.e., light reflectance, light absorptance or light transmission). More specifically, alloy materials such as Al—Cr, Al—Ti, Ag—Pd, Ag—Pd—Cu, Ag—Pd—Ti, or Au—Cr can be used. All of these materials have excellent corrosion resistance and a rapid cooling function and thus are excellent materials. The same purposes also can be attained by forming the reflective layer 8 with at least two layers. The thickness of the reflective layer 8 preferably is 50 to 180 nm, and more preferably 60 nm to 120 nm.

In the information recording medium 25 shown in FIG. 1, the adhesive layer 9 is provided to attach the dummy substrate 10 to the reflective layer 8. The adhesive layer 9 may be formed of a material having high heat resistance and high adhesion, for example, an adhesive resin such as TV curable resin. More specifically, the adhesive layer 9 can be formed of a material having acrylic resin as the main component or a material having epoxy resin as the main component. A protective layer with the thickness of 2 to 20 μm that is made of UV curable resin may be provided on a surface of the reflective layer 8, if necessary, before forming the adhesive layer 9. The thickness of the adhesive layer 9 preferably is 15 to 40 μm, and more preferably 20 to 35 μm.

The dummy substrate 10 enhances the mechanical strength of the information recording medium 25 and protects the laminate from the first dielectric layer 102 to the reflective layer 8. The preferable material of the dummy substrate 10 is the same as that of the substrate 1. In the information recording medium 25 to which the dummy substrate 10 is attached, it is preferable that the dummy substrate 10 and the substrate 1 are formed of substantially the same material and have the same thickness so as to prevent mechanical curvature or distortion from occurring.

The information recording medium of Embodiment 1 is a one-surface disk having one recording layer. The information recording medium of the present invention may have two recording layers. For example, in Embodiment 1, two multi-layered products obtained by laminating layers up to the reflective layers 8 are attached via an adhesive layer with the reflective layers 8 opposed to each other, so that an information recording medium having a two-surface structure can be obtained. In this case, the two multilayered products are attached by forming the adhesive layer with a slow-cure resin and utilizing the action of pressure and heat. In the case where a protective layer is provided on the reflective layer 8, multi-layered products obtained by laminating layers up to the protective layers are attached with the protective layers opposed to each other, so that an information recording medium having a two-surface structure can be obtained.

Next, a method for producing the information recording medium 25 of Embodiment 1 will be described. The information recording medium 25 is produced by performing the step (step a) of arranging the substrate 1 (e.g., thickness: 0.6 mm) provided with guide grooves (groove surfaces 23 and land surfaces 24) in a film forming apparatus and forming the first dielectric layer 2 on the surface of the substrate 1 on which the guide grooves are formed, the step (step b) of forming the recording layer 4, the step (step c) of forming the second dielectric layer 6, the step (step d) of forming the light-absorption correction layer 7 and the step (step e) of forming the reflective layer 8 in this order, further by performing the step of forming the adhesive layer 9 on the surface of the reflective layer 8 and the step of attaching the dummy substrate 10. In this specification including the following description, with respect to each layer, when "surface" is referred to, unless otherwise, it refers to the surface exposed when each layer is formed (surface perpendicular to the thickness direction).

Figure 11:
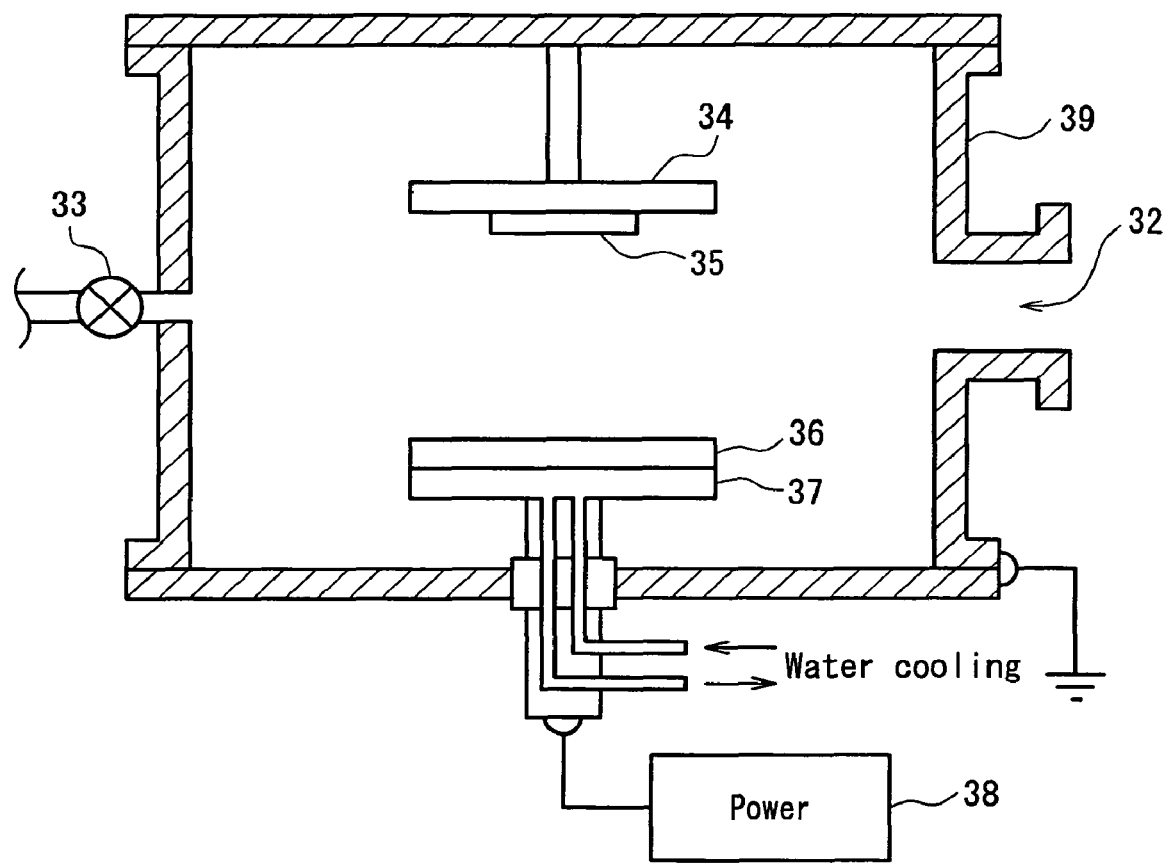
FIG. 11 is a schematic view showing an example of a sputtering apparatus used in a method for producing an information recording medium of the present invention.

First, the step a of the forming the first dielectric layer 2 on the surface on which the guide grooves are formed of the substrate 1 is performed. The step a is performed by sputtering. First, an example of a sputtering apparatus used in this embodiment will be described. FIG. 11 shows the manner in which a film is formed with a sputtering apparatus. As shown in FIG. 11, this sputtering apparatus is configured such that a vacuum pump (not shown) is connected to a vacuum container 39 through an exhaust port 32, and a high vacuum is maintained in the vacuum container 39. A predetermined flow rate of gas can be supplied from a gas supply port 33. A substrate 35 (the substrate herein refers to a base material on which films are deposited) is mounted on a positive electrode 34. The vacuum container 39 and the substrate 35 are maintained to be positive by grounding the vacuum container 39. A sputtering target 36 is connected to a negative electrode 37, and is connected to a power source via a switch (not shown). A thin film is formed on the substrate 35 with particles released from the sputtering target 36 by applying a predetermined voltage between the positive electrode 34 and the negative electrode 37. The same apparatus can be used in the following steps.

The sputtering in the step a is performed in an Ar gas atmosphere using a high frequency power. The sputtering may be performed in a mixed gas atmosphere with Ar gas and 5% or less of at least one of oxygen gas and nitrogen gas. Since the sputtering target is a mixture of oxides, reactive sputtering is not necessary, and an oxide-based material layer can be formed even in an atmosphere of Ar gas alone. For the conditions of sputtering, since the number of elements is small, the conditions can be determined easily, and thus this method is suitable for mass production. When more than 5% of oxygen gas and/or nitrogen gas are mixed with Ar gas, an oxide in a form having a different valence than a desired valence may be formed, depending on the element, and thus an oxide-based material layer having desired characteristics may not be formed. A direct current power that generates pulses may be used, if sputtering continues stably.

As the sputtering target used in the step a, any one of the following targets can be used:
(i) A sputtering target containing Zr, at least one element selected from the group GL1 consisting of La, Ga and In, and oxygen (O) (e.g., a sputtering target containing an oxide of Zr and an oxide of at least one element selected from the group GL1).
(ii) A sputtering target containing M1 (where M1 is a mixture of Zr and Hf, or Hf), at least one element selected from the group GL2 consisting of La, Ce, Al, Ga, In, Mg and Y, and oxygen (O) (e.g., a sputtering target containing an oxide of M1 and an oxide of at least one element selected from the group GL2).
(iii) A sputtering target containing at least one element selected from the group GM2 consisting of Zr and Hf, at least one element selected from the group GL2 consisting of La, Ce, Al, Ga, In, Mg and Y, Si, and oxygen (O) (e.g., a sputtering target containing an oxide of at least one element selected from the group GM2, an oxide of at least one element selected from the group GL2 and an oxide of Si).
(iv) A sputtering target containing at least one element selected from the group GM2 consisting of Zr and Hf, at least one element selected from the group GL2 consisting of La, Ce, Al, Ga, In, Mg and Y, Cr, and oxygen (O) (e.g., a sputtering target containing an oxide of at least one element selected from the group GM2, an oxide of at least one element selected from the group GL2 and an oxide of Cr).

Regarding the sputtering targets (i) to (iv), it is preferable that the oxides of essential elements (e.g., an oxide of Zr and an oxide of at least one element selected from the group GL1 in the case of (i)) are included in a combined amount of 98 mol % or more. In this case, for less than 2 mol %, which is the remaining ratio, the third component as described above that is allowed to be contained in the oxide-based material layer may be included.

More specifically, for example, the following sputtering targets can be used: a sputtering target containing a material expressed by $(D1)_{x1}(E1)_{100-x1}$ (mol %), where D1 is an oxide of Zr, E1 is an oxide of at least one element selected from the group GL1, and x1 satisfies $0<x1<100$; a sputtering target containing a material expressed by $(D2)_{x2}(E2)_{100-x2}$ (mol %), where D2 is an oxide of M1, E2 is an oxide of at least one element selected from the group GL2, and x2 satisfies $0<x2<100$; and a sputtering target containing a material expressed by $(D3)_{x3}(SiO)_{z1}(E2)_{100-x3-z1}$ (mol %), where D3 is at least one element selected from the group GM2, E2 is at least one element selected from the group GL2, X3 and z1 satisfy $10 \leq x3<90$, $0<z1 \leq 50$, and $10<x3+z1 \leq 90$. When these sputtering targets are used, the following oxide-based material layers can be formed: an oxide-based material layer containing a material expressed by $Zr_{Q1}L1_{T1}O_{100-Q1-T1}$ (atom %), where L1 is at least one element selected from the group GL1, and Q1 and T1 satisfy $0<Q1<34$, $0<T1<50$, and $20<Q1+T1<60$; an oxide-based material layer containing a material expressed by $M1_{Q2}L2_{T2}O_{100-Q2-T2}$ (atom %), where M1 is a mixture of Zr and Hf, or Hf, L2 is at least one element selected from the group GL2, and Q2 and T2 satisfy $0<Q2<34$, $0<T2<50$, and $20<Q2+T2<60$; and an oxide-based material layer containing a material expressed by $M2_{Q3}Si_{R1}L2_{T3}O_{100-Q3-R1-T3}$ (atom %), where M2 is at least one element selected from the group GM2, L2 is at least one element selected from the group GL2, and Q3, R1 and T3 satisfy $0<Q3 \leq 32$, $0<R1 \leq 32$, $3<T3<43$, and $20<Q3+R1+T3<60$. In particular, when a $ZrO_2$—$SiO_2$—$Ga_2O_3$ sputtering target is used, an excellent Zr—Ga—O oxide-based material layer can be formed. When the $ZrO_2$ and $SiO_2$ are included in the same mol concentration, $ZrSiO_4$, which is a complex oxide of $ZrO_2$ and $SiO_2$, can be formed. In this case, for example, a sputtering target containing a material expressed by $(ZrSiO_4)_a(E2)_{100-a}$ (mol %) (where a satisfies $11 \leq a \leq 82$) can be used. When this sputtering target is used, an oxide-based material layer containing a material expressed by $Zr_{Q3}Si_{R1}L2_{T3}O_{100-Q3-R1-T3}$ (atom %) can be formed. For example, a sputtering target expressed by $(ZrO_2)_{x3}(SiO_2)_{z1}(Ga_2O_3)_{100-x3-z1}$ (mol %) generally is produced by mixing powders of $ZrO_2$, $SiO_2$ and $Ga_2O_3$ rather than mixing powders of Zr, Si, Ga and O (Ga and O have low melting points, and it is difficult to handle them at room temperature), and solidifying the powders under optimal conditions of temperature and pressure. Furthermore, since some elements can form a plurality of oxides having the same elements but different valences, it is important to express them in such a manner as $(D1)_{x1}(E1)_{100-x1}$ (mol %), $(D2)_{x2}(E2)_{100-x2}$ (mol %), or $(D3)_{x3}(SiO_2)_{z1}(E2)_{100-x3-z1}$ (mol %), which indicate the radio of oxides, in order to form a desired oxide-based material layer. If necessary, the powders of the thus expressed sputtering targets can be analyzed with a X-ray microanalyzer or the like, and the composition ratio of each element can be obtained as $Zr_{q1}L1_{t1}O_{100-q1-t1}$ (atom %), $M1_{q2}L2_{t2}O_{100-q2-t2}$ (atom %), $M2_{q3}Si_{r1}L2_{t3}O_{100-q3-r1-t3}$ (atom %), in the same manner as the oxide-based material layers.

Figure 8:
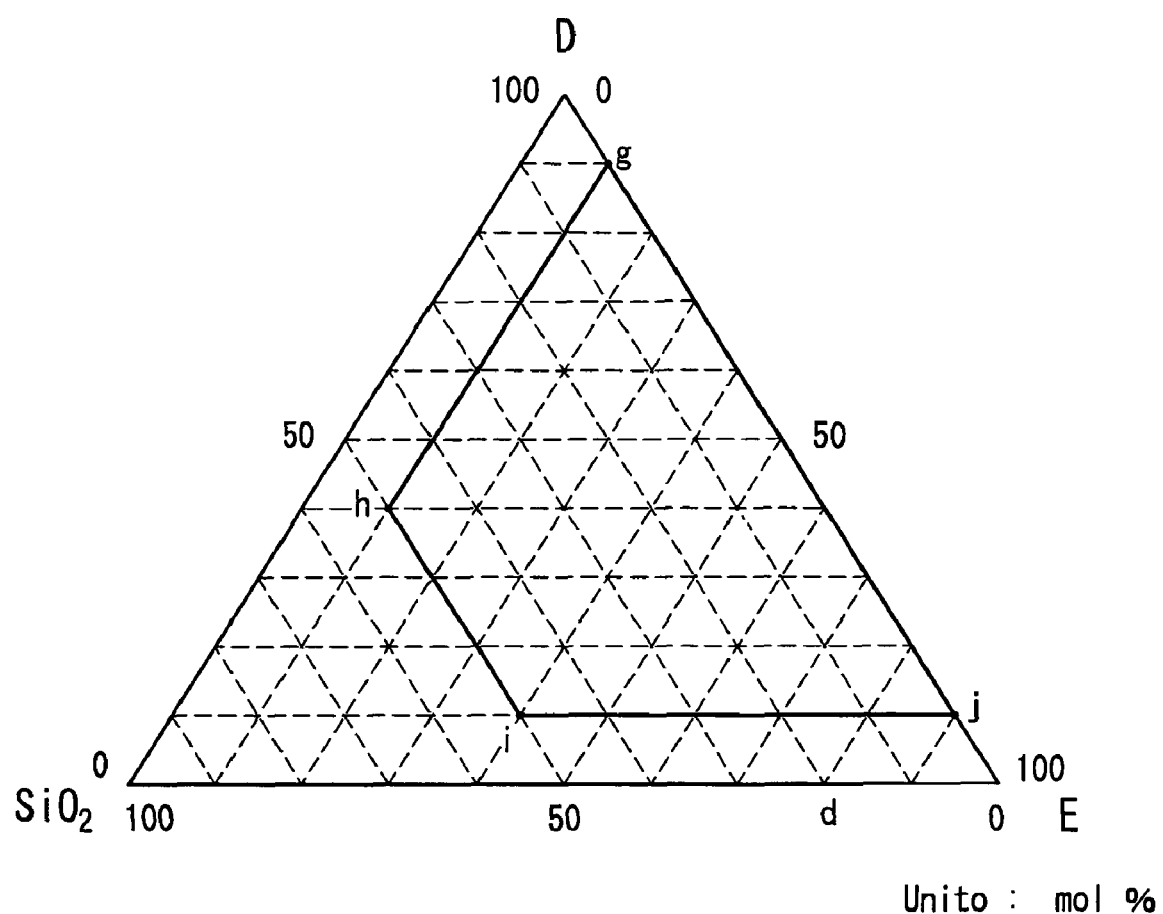
FIG. 8 is a triangular diagram showing a composition range of a material expressed by formula (19) of an example of the present invention.

FIG. 8 shows the composition range when $SiO_2$ is used as g in the material expressed by formula (19). In FIG. 8, the coordinate is (D3, $SiO_2$, E2), and the unit is mol %. In FIG. 8, the material expressed by formula (20) is a material that falls into the range (the line g-h-i-j is included, and the line g-j is not included) enclosed by the segments connecting g (90, 0, 10), h (40, 50, 10), i (10, 50, 40), and j (10, 0, 90).

Next, the step b is performed to form the recording layer 4 on the surface of the first dielectric layer 2. The step b also is performed by sputtering. Sputtering is performed in an Ar gas atmosphere or a mixed gas atmosphere of Ar gas and $N_2$ gas, using a direct current power. As the sputtering target, a sputtering target containing any one material selected from the group consisting of Ge—Sb—Te, Ge—Sn—Sb—Te, Ge—Bi—Te, Ge—Sn—Bi—Te, Ge—Sb—Bi—Te, Ge—Sn—Sb—Bi—Te, Ag—In—Sb—Te and Sb—Te is used. The recording layer 4 that has been formed is in an amorphous state.

Next, the step c is performed to form the second dielectric layer 6 on the surface of the recording layer 4. The step c is performed in the same manner as the step a. The second dielectric layer 6 can be formed by using a sputtering target containing the same oxides at the same ratio as the first dielectric layer 2, a sputtering target containing the same oxides at a different ratio, or a sputtering target containing different oxides selected from each group.

For example, in the steps a and c, a sputtering target containing $(ZrO_2)_{30}(SiO_2)_{20}(Ga_2O_3)_{50}$ (mol %) may be used. Alternatively, in the step a, a sputtering target containing $(ZrO_2)_{30}(SiO_2)_{20}(Ga_2O_3)_{50}$ (mol %) may be used, and in the step c, a sputtering target containing $(ZrO_2)_{40}(SiO_2)_{30}(Ga_2O_3)_{30}$ (mol %) may be used. Alternatively, in the step a, a sputtering target containing a $HfO_2$—$Ga_2O_3$ mixed material may be used, and in the step c, a sputtering target containing a $ZrO_2$—$SiO_2$—$Y_2O_3$ mixed material may be used.

Next, the step d is performed to form the light-absorption correction layer 7 on the surface of the second dielectric layer 6. In the step d, sputtering is performed, using a direct current power or a high frequency power. As the sputtering target, a material selected from amorphous Ge alloys such as Ge—Cr, Ge—Mo and Ge—W, amorphous Si alloys such as Si—Cr, Si—Mo and Si—W, tellurides, and crystalline metals, semimetal and semiconductor materials such as Ti, Zr, Nb, Ta, Cr, Mo, W, SnTe and PbTe. Sputtering is performed in an Ar gas atmosphere.

Next, the step e is performed to form the reflective layer 8 on the surface of the light-absorption correction layer 7. The step e is performed by sputtering. The sputtering is performed in an Ar gas atmosphere, using a direct current power or a high frequency power. As the sputtering target, a single sputtering target of a high heat conductivity material such as Au, Al, Ag and Cu or an alloy sputtering target such as Al—Cr, Al—Ti, Ag—Pd, Ag—Pb—Cu, Ag—Pd—Ti and Au—Cr can be used.

As described above, all of the steps a to e are sputtering steps. Therefore, the steps a to e may be performed continuously while sequentially changing sputtering targets in one vacuum chamber of a sputtering apparatus as shown in FIG. 11. Alternatively, the steps a to e may be performed with each sputtering target arranged in an independent vacuum chamber in a sputtering apparatus.

After the reflective layer 8 is formed, the substrate 1 on which the layers from the first dielectric layer 2 to the reflective layer 8 are laminated sequentially is removed from the sputtering apparatus. Then, UV curable resin is applied to the surface of the reflective layer 8 by, for example, spin-coating. The dummy substrate 10 is attached to the applied UV curable resin, followed by irradiation of ultraviolet rays from the side of the dummy substrate 10 to cure the resin. This ends the attachment step.

After the attachment step ends, if necessary, an initialization step is performed. The initialization step is a step in which the recording layer 4 in an amorphous state is, for example, irradiated with a semiconductor laser to be heated to a crystallization temperature for crystallization. The initialization step may be performed before the attachment step. Thus, the steps a to e, the step of forming the adhesive layer and the step of attaching the dummy substrate are performed sequentially, so that the information recording medium 25 of Embodiment 1 can be produced.

Embodiment 2

Figure 2:
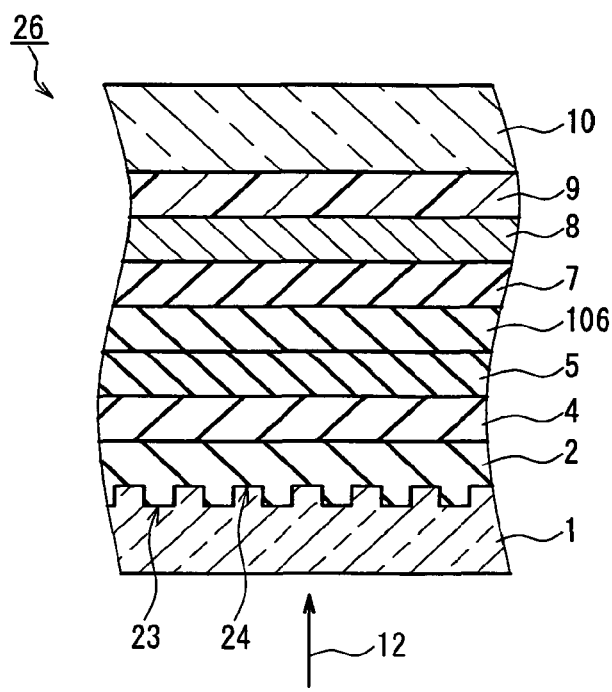
FIG. 2 is a partial cross-sectional view showing another example of an information recording medium of the present invention.

As Embodiment 2 of the present invention, another example of an optical information recording medium on/from which information is recorded/reproduced using laser light will be described. FIG. 2 shows a partial cross-sectional view of the optical information recording medium. An information recording medium 26 shown in FIG. 2 has the following structure. A first dielectric layer 2, a recording layer 4, a second interface layer 5, a second dielectric layer 106, a light-absorption correction layer 7 and a reflective layer 8 are formed on one surface of a substrate 1 in this order. Furthermore, a dummy substrate 10 is attached to the reflective layer 8 with an adhesive layer 9. The information recording medium 26 shown in FIG. 2 is different from the conventional information recording medium 31 shown in FIG. 12 in that the first interface layer 103 is not included. The information recording medium 26 is different from the information recording medium 25 of Embodiment 1 shown in FIG. 1 in that the second dielectric layer 106 is laminated on the recording layer 4 via the second interface layer 5. In the information recording medium 26, the first dielectric layer 2 is an oxide-based material layer as in Embodiment 1. In addition, in FIG. 2, the same reference numerals as those used in FIG. 1 indicate the same elements, and are formed with the material and the method described with reference to FIG. 1. Therefore, the elements that already have been described with reference to FIG. 1 will not be described further. In this embodiment, only one interface layer is provided, but this layer is positioned between the second dielectric layer 106 and the recording layer 4, and therefore this interface layer is referred to as "second interface 5" for convenience.

The information recording medium 26 in this embodiment corresponds to the structure in which the second dielectric layer 106 is formed of $(ZnS)_{80}(SiO_2)_{20}$ (mol %), which is used in the conventional information recording medium. Therefore, the second interface layer 5 is provided to prevent substance movement that might be caused between the second dielectric layer 106 and the recording layer 4 by repeated recording.

The oxide-based material layer of the present invention can be used for the second interface layer 5. The second interface layer 5 is a layer containing at least one element selected from the group GM consisting of Zr and Hf, at least one element selected from the group GL consisting of La, Ce, Al, Ga, In, Mg and Y, and oxygen (O), as in the first dielectric layer 2 and the second dielectric layer 6 of Embodiment 1. Si may be included, and a third component may be included in a content of less than 10 atom %.

Furthermore, the second interface layer 5 may be formed of a material containing Ge—N, which is conventionally used, or may be formed of a material containing $ZrO_2$—$SiO_2$—$Cr_2O_3$ or a material containing $HfO_2$—$SiO_2$—$Cr_2O_3$. In addition, the second interface layer 5 may be formed of a nitride such as Si—N, Al—N, Zr—N, Ti—N or Ta—N or nitroxides containing these nitrides, a carbide such as SiC or C (carbon). The thickness of the interface layer preferably is 1 to 10 nm, more preferably 2 to 7 nm. When the thickness of the interface layer is large, the light reflectance and the light absorptance of a multilayered product from the first dielectric layer 2 to the reflective layer 8 formed on the surface of the substrate 1 are changed, which affects the recording and erasure performance.

Next, a method for producing the information recording medium 26 of Embodiment 2 will be described. The information recording medium 26 is produced by performing the step (step a) of forming the first dielectric layer 2 on the surface of the substrate 1 on which guide grooves are formed, the step (step b) of forming the recording layer 4, the step (step f) of forming the second interface layer 5, the step (step g) of forming the second dielectric layer 106, the step (step d) of forming the light-absorption correction layer 7 and the step (step e) of forming the reflective layer 8 in this order, further by performing the step of forming the adhesive layer 9 on the surface of the reflective layer 8 and the step of attaching the dummy substrate 10. The steps a, b, d and e are performed in the same manner as described in Embodiment 1, and are not described further in this embodiment. Only the steps that are not performed in the production of the information recording medium of Embodiment 1 will be described below.

The step f is performed after the recording layer 4 is formed, and in this step, the second interface layer 5 is formed on the surface of the recording layer 4. In the step f, sputtering is performed using a high frequency power. For the sputtering target used in the step f, the sputtering targets (i) to (iv) described in Embodiment 1 can be used. In this case, a sputtering target in which the oxides of essential elements (e.g., an oxide of Zr and an oxide of at least one element selected from the group GL1 in the case of (i)) are included in a combined amount of 90 mol % or more can be used. For less than 10 mol %, which is the remaining ratio, the third component as described above that is allowed to be contained in the oxide-based material layer may be included. The sputtering in the step f is performed using a high frequency power in an Ar gas atmosphere or in a mixed gas atmosphere with Ar gas and 5% or less of at least either one of oxygen gas and nitrogen gas. Since the sputtering target is a mixture of oxides, reactive sputtering is not necessary, and an oxide-based material layer can be formed even in an atmosphere of Ar gas alone.

As the sputtering target used in the step f, a sputtering target containing conventional $ZrO_2$—$SiO_2$—$Cr_2O_3$ or a sputtering target containing $HfO_2$—$SiO_2$—$Cr_2O_3$ may be used. Also in this case, sputtering may be performed using a high frequency power in an Ar gas atmosphere or in a mixed gas atmosphere with Ar gas and 5% or less of at least either one of oxygen gas and nitrogen gas. Alternatively, the sputtering may be reactive sputtering that is performed with a sputtering target containing Ge—Cr, Ge, Si, Al, Zr, Ti, or Ta in a mixed gas atmosphere of Ar gas and $N_2$ gas. This reactive sputtering allows the second interface layer 5 containing Ge—Cr—N, Ge—N, Si—N, Al—N, Zr—N, Ti—N, or Ta—N to be formed on the surface of the recording layer 4. In addition, sputtering can be performed with a sputtering target containing a carbide such as SiC or C (carbon) in Ar gas so that the layer can be formed of a carbide such as SiC or C (carbon).

Next, the step g is performed to form the second dielectric layer 106 on the surface of the second interface layer 5. In the step g, sputtering is performed using a high frequency power and a sputtering target of $(ZnS)_{80}(SiO_2)_{20}$ (mol %) in an Ar gas atmosphere or a mixed gas atmosphere of Ar gas and $O_2$ gas. Thus, a layer made of $(ZnS)_{80}(SiO_2)_{20}$ (mol %) can be formed. Thereafter, after the step of attaching the dummy substrate 10 ends, as described in Embodiment 1, the initialization step is performed, if necessary, and thus the information recording medium 26 is obtained.

Embodiment 3

Figure 3:
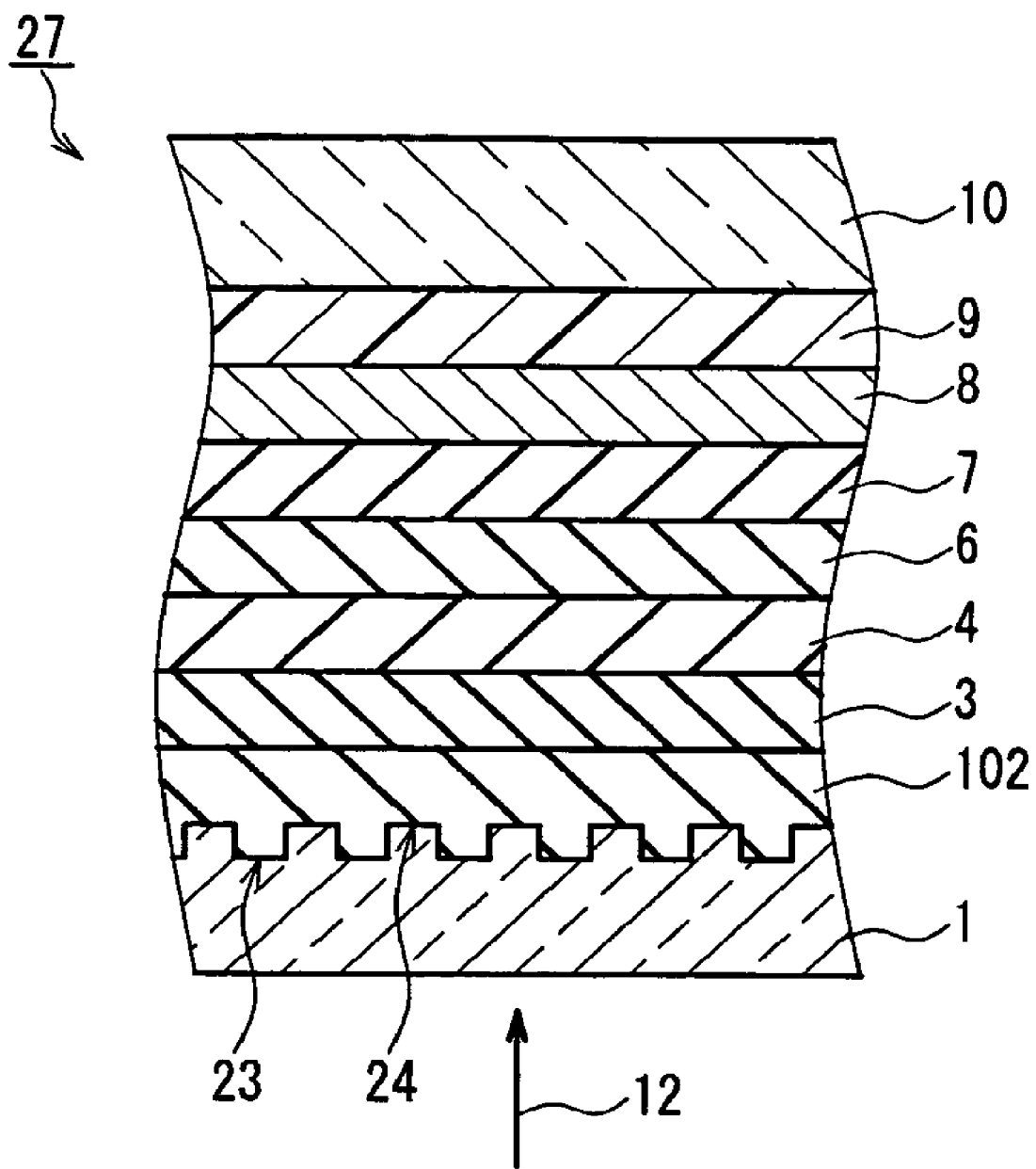
FIG. 3 is a partial cross-sectional view showing yet another example of an information recording medium of the present invention.

As Embodiment 3 of the present invention, another example of an optical information recording medium on/from which information is recorded/reproduced using laser light will be described. FIG. 3 shows a partial cross-sectional view of the optical information recording medium.

An information recording medium 27 shown in FIG. 3 has the following structure. A first dielectric layer 102, a first interface layer 3, a recording layer 4, a second dielectric layer 6, a light-absorption correction layer 7 and a reflective layer 8 are formed on one surface of a substrate 1 in this order. Furthermore, a dummy substrate 10 is attached to the reflective layer 8 with an adhesive layer 9. The information recording medium 27 shown in FIG. 3 is different from the conventional information recording medium 31 shown in FIG. 12 in that the second interface layer 105 is not included. The information recording medium 27 is different from the information recording medium 25 of Embodiment 1 shown in FIG. 1 in that the first dielectric layer 102 and the first interface layer 3 are laminated in this order between the substrate 1 and the recording layer 4. In the information recording medium 27, the second dielectric layer 6 is an oxide-based material layer as in Embodiment 1. In addition, in FIG. 3, the same reference numerals as those used in FIG. 1 indicate the same elements, and are formed with the material and the method described with reference to FIG. 1. Therefore, the elements that already have been described with reference to FIG. 1 will not be described further.

The information recording medium 27 in this embodiment corresponds to the structure in which the first dielectric layer 102 is formed of $(ZnS)_{80}(SiO_2)_{20}$ (mol %), which is used in the conventional information recording medium. Therefore, the first interface layer 3 is provided to prevent substance movement that might be caused between the first dielectric layer 102 and the recording layer 4 by repeated recording. The preferable material and thickness of the first interface layer 3 are the same as those of the second interface layer 5 of the information recording medium 26 of Embodiment 2 described with reference to FIG. 2. Therefore, they will not be described in detail.

Next, a method for producing the information recording medium 27 of Embodiment 3 will be described. The information recording medium 27 is produced by performing the step (step h) of forming the first dielectric layer 102 on the surface on which guide grooves are formed of the substrate 1, the step (step i) of forming the first interface layer 3, the step (step b) of forming the recording layer 4, the step (step c) of forming the second dielectric layer 6, the step (step d) of forming the light-absorption correction layer 7 and the step (step e) of forming the reflective layer 8 in this order, further by performing the step of forming the adhesive layer 9 on the surface of the reflective layer 8 and the step of attaching the dummy substrate 10. The steps b, c, d and e are performed in the same manner as described in Embodiment 1, and are not described further in this embodiment. Only the steps that are not performed in production of the information recording medium of Embodiment 1 will be described below.

The step h is a step of forming the first dielectric layer 102 on the surface of the substrate 1. A specific method is the same as the step g described in connection with the production method of Embodiment 2. The step i is a step of forming the first interface layer 3 on the surface of the first dielectric layer 102. A specific method is the same as the step f described in connection with the production method of Embodiment 2. Thereafter, after the step of attaching the dummy substrate 10 ends, as described in Embodiment 1, the initialization step is performed, if necessary, and thus the information recording medium 27 is obtained.

Embodiment 4

Figure 4:
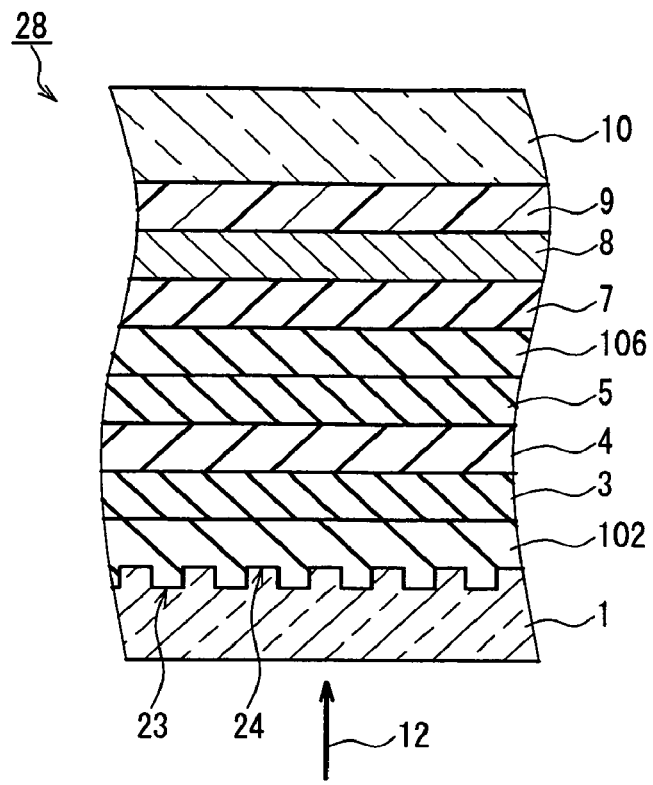
FIG. 4 is a partial cross-sectional view showing still another example of an information recording medium of the present invention.

As Embodiment 4 of the present invention, another example of an optical information recording medium on/from which information is recorded/reproduced using laser light will be described. FIG. 4 shows a partial cross-sectional view of the optical information recording medium.

An information recording medium 28 shown in FIG. 4 has the following structure. A first dielectric layer 102, a first interface layer 3, a recording layer 4, a second interface layer 5, a second dielectric layer 106, a light-absorption correction layer 7 and a reflective layer 8 are formed on one surface of a substrate 1 in this order. Furthermore, a dummy substrate 10 is attached to the reflective layer 8 with an adhesive layer 9. In the information recording medium 28 shown in FIG. 4, the first and the second interface layers 3 and 5 are oxide-based material layers. In FIG. 4, the same reference numerals as those used in FIGS. 1 to 3 indicate the same elements, and are formed with the material and the method described with reference to FIGS. 1 to 3. Therefore, the elements that already have been described with reference to FIGS. 1 to 3 will not be described further.

The information recording medium of this embodiment corresponds to the structure in which the first and the second dielectric layers 102 and 106 are formed of $(ZnS)_{80}(SiO_2)_{20}$ (mol %), which is used in the conventional information recording medium, and the first and the second interface layers 3 and 5 are formed of oxide-based material layers. The preferable materials and thicknesses of the first and the second interface layers 3 and 5 are the same as those of the first and the second dielectric layers 2 and 6 of Embodiment 1. Therefore, they will not be described in detail. The thickness of the first and the second interface layers 3 and 5 preferably is 1 to 10 nm, more preferably is about 2 to 7 nm not to affect the recording and erasure properties. The interface layer, which is an oxide-based material layer, has the following advantages, compared with a conventional interface layer made of a nitride containing Ge: the material cost of is inexpensive; the extinction coefficient is small (transparency is high); and the melting point is high so that the interface layer is thermally stable.

The first and the second dielectric layers 102 and 106 may be formed of the same material or different materials.

Next, a method for producing the information recording medium 28 of Embodiment 4 will be described. The information recording medium 28 is produced by performing the step (step h) of forming the first dielectric layer 102 on the surface on which guide grooves are formed of the substrate 1, the step (step i) of forming the first interface layer 3, the step (step b) of forming the recording layer 4, the step (step f) of forming the second interface layer 5, the step (step g) of forming the second dielectric layer 106, the step (step d) of forming the light-absorption correction layer 7 and the step (step e) of forming the reflective layer 8 in this order, further by performing the step of forming the adhesive layer 9 on the surface of the reflective layer 8 and the step of attaching the dummy substrate 10. The step h is performed in the same manner as described in Embodiment 3, the steps b, d and e are performed in the same manner as described in Embodiment 1, and the step g is performed in the same manner as described in Embodiment 2, and therefore are not described further in this embodiment.

The second dielectric layer 106 may be formed using a sputtering target containing the same material as the first dielectric layer 102, or a sputtering target containing a different material. For example, in both the steps h and g, sputtering targets containing $(ZnS)_{80}(SiO_2)_{20}$ (mol %) may be used, or in the step h, a sputtering target containing $(ZnS)_{80}(SiO_2)_{20}$ (mol %) may be used, and in the step g, a sputtering target containing $(ZrO_2)_{30}(SiO_2)_{30}(Cr_2O_3)_{20}(LaF_3)_{20}$ (mol %) may be used. Sputtering in these steps can be performed using a high frequency power and in an Ar gas atmosphere or a mixed gas atmosphere of Ar gas and at least either one of oxygen gas and nitrogen gas.

The step i is a step of forming the first interface layer 3 on the surface of the first dielectric layer 102. The step i is performed in the same manner as in Embodiment 3. For the sputtering target used in the step i, the sputtering targets (i) to (iv) described in Embodiment 1 can be used. In this case, a sputtering target in which the oxides of essential elements (e.g., an oxide of Zr and an oxide of at least one element selected from the group GL1 in the case of (i)) are included in a combined amount of 90 mol % or more can be used. For less than 10 mol %, which is the remaining ratio, the third component as described above that is allowed to be contained in the oxide-based material layer may be included. In this case, sputtering is performed using a high frequency power in an Ar gas atmosphere or in a mixed gas atmosphere with Ar gas and 5% or less of at least either one of oxygen gas and nitrogen gas. Since the sputtering target is a mixture of oxides, reactive sputtering is not necessary, and an oxide-based material layer can be formed even in an atmosphere of Ar gas alone.

In the information recording medium in Embodiment 4, the oxide-based material layer of the present invention is used for both the first and the second interface layers 3 and 5, for example. However, the oxide-based material layer of the present invention can be used only for the first interface layer 3, and another material can be used for the second interface layer. Alternatively, the oxide-based material layer of the present invention can be used only for the second interface layer 5, and another material can be used for the first interface layer. When the oxide-based material layer of the present invention is used for both the first and the second interface layers 3 and 5, different compositions in the range shown in FIG. 7 can be used for the interface layers.

The step f is a step of forming the second interface layer 5 on the surface of the recording layer 4. The step f is performed in the same manner as in Embodiment 2. The sputtering target used in the step f is the same sputtering target as used in the step i.

After the step of attaching the dummy substrate 10 ends, as described in Embodiment 1, the initialization step is performed, if necessary, and thus the information recording medium 28 is obtained.

Embodiment 5

Figure 5:
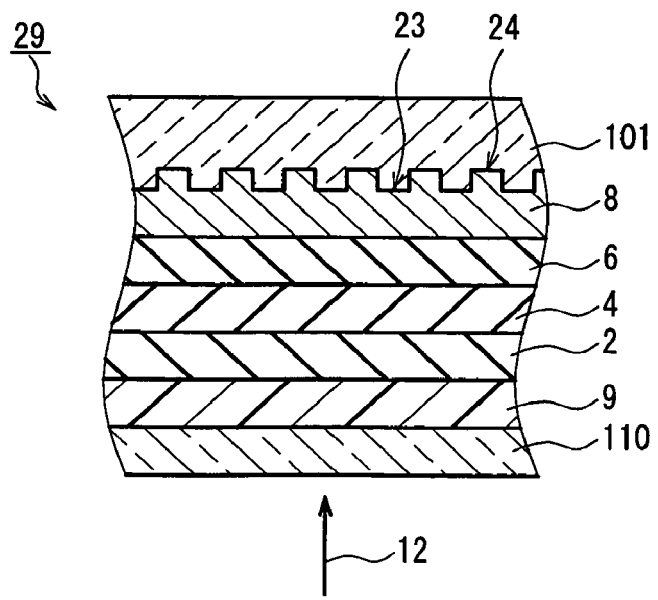
FIG. 5 is a partial cross-sectional view showing another example of an information recording medium of the present invention.

As Embodiment 5 of the present invention, another example of an optical information recording medium on/from which information is recorded/reproduced using laser light will be described. FIG. 5 shows a partial cross-sectional view of the optical information recording medium.

An information recording medium 29 shown in FIG. 5 has the following structure. A reflective layer 8, a second dielectric layer 6, a recording layer 4, and a first dielectric layer 2 are formed on one surface of a substrate 101 in this order. Furthermore, a dummy substrate 110 is attached to the first dielectric layer 2 with an adhesive layer 9. This information recording medium 29 is different from the conventional information recording medium 31 shown in FIG. 12 in that the first interface layer 103 and the second interface layer 105 are not included and that the substrates 101 and 110 are used. The information recording medium having this structure is different from the information recording medium 25 shown in FIG. 1 in that the light-absorption correction layer 7 is not included.

The information recording medium 29 in this embodiment is irradiated with laser light 12 from the dummy substrate 110 side, and thus information is recorded and reproduced. In order to increase the recording density of the information recording medium, laser light with a short wavelength is used, and it is necessary to form a small recording mark in the recording layer by focusing a laser beam on a smaller spot. In order to focusing a laser-beam on a smaller spot, it is necessary to increase the numerical aperture NA of an objective lens. However, when NA is increased, the focus position becomes shorter. Therefore, it is necessary to reduce the thickness of the substrate on which laser light is incident. In the information recording medium 29 shown in FIG. 5, the dummy substrate 110 on which laser light is incident does not have to serve as a support when the recording layer and other layers are formed, and therefore the thickness thereof can be reduced. Therefore, this structure can provide a large capacity information recording medium 29 that allows for higher density recording. More specifically, this structure can provide an information recording medium with a capacity of 25 GB for which laser light in a bluish-purple range of a wavelength of about 405 nm is used for recording and reproduction.

In this information recording medium as well, the first and the second dielectric layers 2 and 6 are oxide-based material layers as in Embodiment 1. The oxide-based material layer can be used as a dielectric layer, regardless of the order of forming the reflective layer and other layers and the recording capacity. The materials contained in the oxide-based material layer are such as described in Embodiment 1, and therefore will not be described further.

As described above, the information recording medium 29 is suitable for recording and reproduction with laser light with a short wavelength. Therefore, the thickness of the first and the second dielectric layers 2 and 6 are obtained based on a preferable optical path length, for example, when λ=405 nm. In order to improve the signal quality by increasing the reproduction signal amplitude of the recording mark of the information recording medium 29, for example, the optical path length nd of the first dielectric layer 2 and second dielectric layer 6 was determined strictly by calculations based on the matrix method so as to satisfy 20%≦Rc and Ra≦5%. As a result, it was discovered that when an oxide-based material layer having a refractive index of 1.8 to 2.5 is used for the first and the second dielectric layers 2 and 6, the thickness of the first dielectric layer 2 preferably is 30 nm to 100 nm, and more preferably 50 nm to 80 nm. It also was discovered that the thickness of the second dielectric layer 6 preferably is 3 nm to 50 nm, and more preferably 10 nm to 30 nm.

The substrate 101 is a transparent disk-like plate, like the substrate 1 of Embodiment 1. Guide grooves for guiding laser light may be formed on the surface of the substrate 101 on which the reflective layer or the like is to be formed. When guide grooves are formed, as described in Embodiment 1, the surface 23 that is nearer to the laser light 12 is referred to as "groove surface" for convenience, and the surface 24 that is farther from the laser light 12 is referred to as "land surface" for convenience. The step between the groove surface 23 and the land surface 24 of the substrate 101 preferably is 10 nm to 30 nm, and more preferably 15 nm to 25 nm. Furthermore, it is preferable that the surface on which the layers are not formed is smooth. As the material of the substrate 101, the same materials as those for the substrate 1 of Embodiment 1 can be used. The thickness of the substrate 101 preferably is about 1.0 to 1.2 mm. A preferable thickness of the substrate 101 is larger than that of the substrate 1 of Embodiment 1. This is because the thickness of the dummy substrate 110 is smaller, as described later, and therefore it is necessary to ensure the strength of the information recording medium with the substrate 101.

The dummy substrate 110 is a transparent disk-like plate, like the substrate 101. As described above, according to the structure shown in FIG. 4, it is possible to record information with laser light with a short wavelength by reducing the thickness of the dummy substrate 110. Therefore, the thickness of the dummy substrate 110 preferably is about 40 μm to 110 μm. It is more preferable that the combined thickness of the adhesive layer 9 and the dummy substrate 110 is 50 μm to 120 μm.

Since the dummy substrate 110 is thin, it is preferable that the dummy substrate is formed of resin such as polycarbonate, amorphous polyolefin or PMMA, and in particular, polycarbonate is preferable. Since the dummy substrate 110 is positioned on the laser light 12 incident side, it is optically preferable that the dummy substrate 110 has a small birefringence range and is transparent in a short wavelength.

It is preferable that the adhesive layer 9 is formed of a transparent UV curable resin. The thickness of the adhesive layer 9 preferably is about 5 to 15 μm. If the adhesive layer 9 has the function of the dummy substrate 110 and can be formed in a thickness of 50 μm to 120 μm, the dummy substrate 110 can be eliminated.

The elements having the same numeral references as in Embodiment 1 are such as already have been described in Embodiment 1, and will not be described in this embodiment.

In a variation example of the information recording medium of this embodiment, for example, only the first dielectric layer is formed of an oxide-based material layer, the second dielectric layer is formed of $(ZnS)_{80}(SiO_2)_{20}$ (mol %), and the second interface layer is formed between the second dielectric layer and the recording layer. In another variation example of the information recording medium of this embodiment, for example, only the second dielectric layer is formed of an oxide-based material layer, the first dielectric layer is formed of $(ZnS)_{80}(SiO_2)_{20}$ (mol %), and the first interface layer is formed between the first dielectric layer and the recording layer.

Next, a method for producing the information recording medium 29 of Embodiment 5 will be described. The information recording medium 29 is produced by performing the step (step e) of arranging the substrate 101 (e.g., thickness: 1.1 mm) in which guide grooves (groove surface 23 and land surface 24) are formed in a film-formation apparatus and forming the reflective layer 8 on the surface on which the guide grooves are formed of the substrate 101, the step (step c) of forming the second dielectric layer 6, the step (step b) of forming the recording layer 4, and the step (step a) of forming the first dielectric layer 2 in this order, further by performing the step of forming the adhesive layer 9 on the surface of the first dielectric layer 2 and the step of attaching the dummy substrate 110.

First, the step e is performed so that the reflective layer 8 is formed on the surface on which the guide grooves are formed of the substrate 101. The specific method for performing the step e is such as described in Embodiment 1. Next, the steps c, b and a are performed in this order. The specific methods for performing the steps c, b and a are such as described in Embodiment 1. In production of the information recording medium of this embodiment as well as the information recording medium of Embodiment 1, the sputtering target used in the step c may be different from the sputtering target used in the step a. In production of the information recording medium of this embodiment, the order of performing the steps is different from that in the method for producing the information recording medium of Embodiment 1.

After forming the first dielectric layer 2, the substrate 101 on which the layers from the reflective layer 8 to the first dielectric layer 2 are laminated sequentially is removed from the sputtering apparatus. Then, UV curable resin is applied on the first dielectric layer 2 by, for example, spin-coating. The dummy substrate 110 is attached tightly to the applied UV curable resin, and irradiation of ultraviolet rays is performed from the dummy substrate 110 side to cure the resin, and thus the attachment step is completed. The adhesive layer 9 is formed to a thickness of 50 μm to 120 μm, and is irradiated with ultraviolet rays, which may eliminate the step of attaching the dummy substrate 110. This is because if the adhesive layer 9 is formed in a thickness of 50 μm to 120 μm, the adhesive layer 9 serves as the dummy substrate 110.

After the attachment step ends, as described in Embodiment 1, the initialization step is performed, if necessary. The method for the initialization is as described in Embodiment 1.

Embodiment 6

Figure 6:
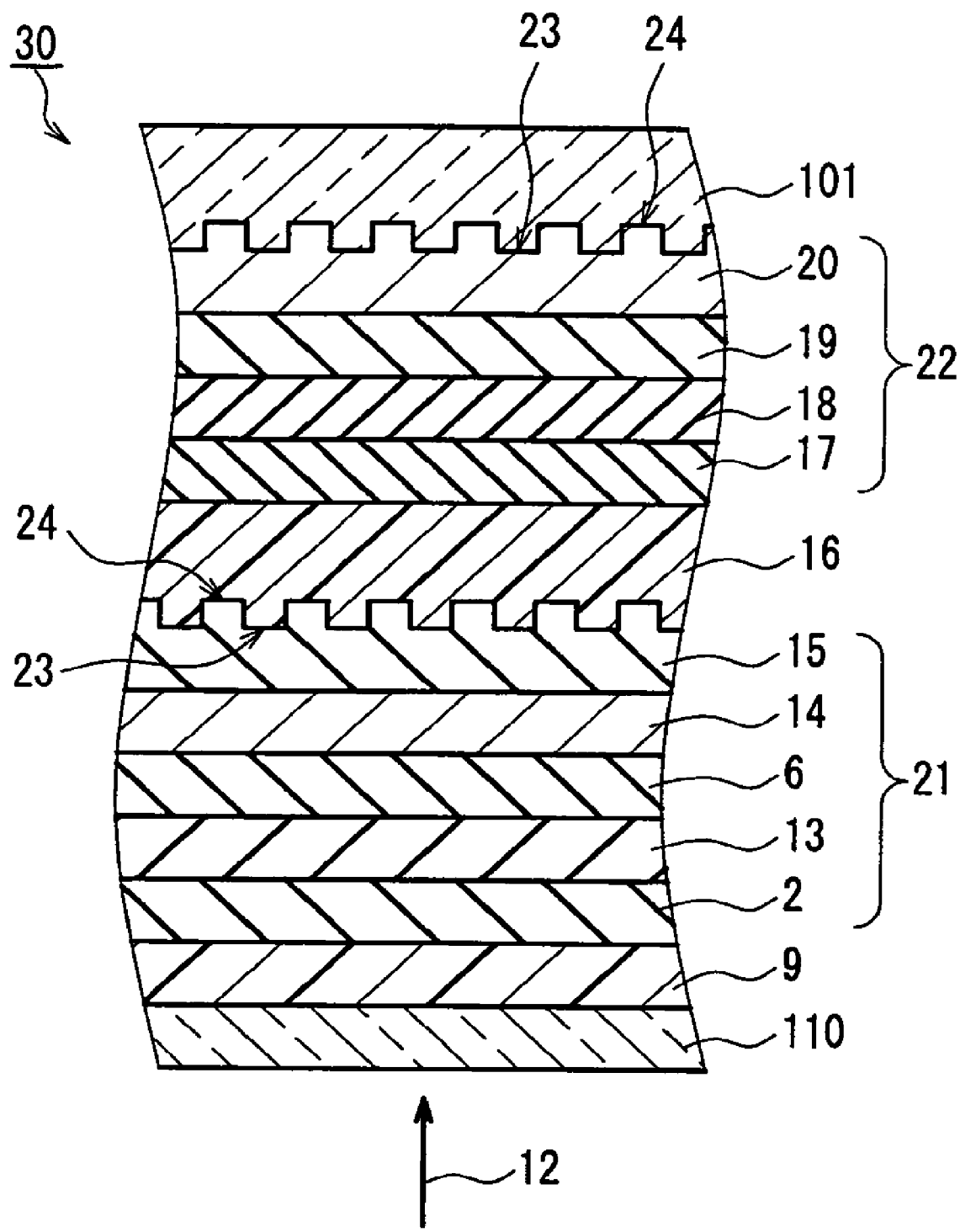
FIG. 6 is a partial cross-sectional view showing yet another example of an information recording medium of the present invention.

As Embodiment 6 of the present invention, yet another example of an optical information recording medium on/from which information is recorded/reproduced using laser light will be described. FIG. 6 shows a partial cross-sectional view of the optical information recording medium.

An information recording medium 30 shown in FIG. 6 has the following structure. A second information layer 22, an intermediate layer 16, and a first information layer 21 are formed on one surface of a substrate 101 in this order. Furthermore, a dummy substrate 110 is attached to the first information layer 21 via an adhesive layer 9. More specifically, the second information layer 22 is obtained by forming a second reflective layer 20, a fifth dielectric layer 19, a second recording layer 18, and a fourth dielectric layer 17 on one surface of the substrate 101 in this order. The intermediate layer 16 is formed on a surface of the fourth dielectric layer 17. The first information layer 21 is obtained by forming a third dielectric layer 15, a first reflective layer 14, a second dielectric layer 6, a first recording layer 13, and a first dielectric layer 2 on the surface of the intermediate layer 16 in this order. Also in this embodiment, the laser light 12 is incident from the side of the dummy substrate 110. Furthermore, in the information recording medium of this embodiment, information can be recorded in each of the two recording layers. Therefore, this structure can provide an information recording medium that has a capacity twice that of Embodiment 5 above. More specifically, this structure can provide an information recording medium with a capacity of 50 GB for which laser light in a bluish-purple range of a wavelength in the vicinity of 405 nm is used for recording and reproduction.

Information is recorded on/reproduced from the first information layer 21 by laser light 12 that has passed through the dummy substrate 110. Information is recorded on/reproduced from the second information layer 22 by laser light 12 that has passed through the dummy substrate 110, the first information layer 21 and the intermediate layer 16.

In the information recording medium 30 shown in FIG. 6, oxide-based material layers can be used for the fifth dielectric layer 19, the fourth dielectric layer 17, the second dielectric layer 6, and the first dielectric layer 2. If the oxide-based material layer is used, an interface layer is not necessary between the first recording layer 13 and the first dielectric layer 2, between the first recording layer 13 and the second dielectric layer 6, between the second recording layer 18 and the fourth dielectric layer 17, between the second recording layer 18 and the fifth dielectric layer 19. The specific materials of the oxide-based material layers are such as described in Embodiment 1 and therefore are not described further.

The fifth dielectric layer 19 and the second dielectric layer 6 serve as thermal insulating layers between the reflective layers and the recording layers. Therefore, it is preferable to form the fifth and the second dielectric layers 19 and 6 by selecting materials such that the thermal conductivity of the layers becomes low and the effect of cooling the second and the first recording layers 18 and 13 rapidly is increased. More specifically, it is preferable that these layers contain a material expressed by, for example, $Zr_{15}Si_{11}Ga_{11}O_{63}$ (atom %) (oxide representation $(ZrO_2)_{40}(SiO_2)_{30}(Ga_2O_3)_{30}$ (mol %)). Furthermore, the thickness of the fifth and the second dielectric layers 19 and 6 preferably is 3 nm to 50 nm, more preferably 10 nm to 30 nm.

In the second information layer 22 and the first information layer 21, the laser light 12 is incident to the fourth dielectric layer 17 and the first dielectric layer 2 before reaching the second recording layer 18 and the first recording layer 13. Therefore, it is preferable that the fourth dielectric layer 17 and the first dielectric layer 2 are formed of transparent materials having low thermal conductivity. More specifically, it is preferable that these layers contain materials expressed by, for example, $Zr_6Si_6Ga_{25}O_{63}$ (atom %) (oxide representation $(ZrO_2)_{25}(SiO_2)_{25}(Ga_2O_3)_{50}$ (mol %)). The thickness of the fourth and the first dielectric layers 17 and 2 preferably is 30 nm to 80 nm.

Thus, also in the information recording medium having one-surface two layer structure as shown in FIG. 6, the dielectric layers can be in direct contact with the recording layers without an interface layer interposed therebetween by using oxide-based material layers for the dielectric layers positioned on both sides of the recording layer. Therefore, according to the present invention, regarding the information recording medium having a one-surface two layer structure, the number of the layers constituting the entire medium can be reduced. Furthermore, the refractive index and/or the recording sensitivity of the medium are adjusted and optimized depending on the type of the information recording medium by using a plurality of oxides to be contained in the material constituting the dielectric layer and/or selecting the type of oxide as appropriate.

The third dielectric layer 15 is positioned between the intermediate layer 16 and the first reflective layer 14. It is preferable that the third dielectric layer 15 is transparent and has a high refractive index so as to have a function of increasing the light transmission of the first information layer 21. It is preferable that the third dielectric layer 15 is formed of a material having a high thermal conductivity so as to have a function of allowing heat of the first recording layer 13 to be diffused rapidly. The material that satisfies these conditions is $TiO_2$. $TiO_2$ is included in a content of 90 mol % or more. When a $TiO_2$ based material is used, a layer having a large refractive index of about 2.7 can be formed. It is preferable that the thickness of the third dielectric layer 15 is 10 nm to 30 nm.

The substrate 101 is the same as the substrate 101 of Embodiment 5. Therefore, the substrate 101 is not described in detail in this embodiment.

The second reflective layer 20 is the same as the reflective layer 8 of Embodiment 1. The second recording layer 18 is the same as the recording layer 4 of Embodiment 1. Therefore, the second reflective layer 20 and the second recording layer 18 are not described in detail in this embodiment.

The intermediate layer 16 is provided to make the focus position of laser light in the first information layer 21 significantly different from the focus position in the second information layer 22. Guide grooves are formed on the first information layer 21 side of the intermediate layer 16, if necessary. The intermediate layer 16 can be formed with UV curable resin. It is preferable that the intermediate layer 16 is transparent with respect to light with a wavelength λ for recording and reproduction so that the laser light 12 can reach the second information layer 22 efficiently. The thickness of the intermediate layer 16 is required to be equal to the focal depth $\Delta Z$ or more that is determined by the numerical aperture NA of the objective lens and the wavelength λ of the laser light. $\Delta Z$ can be approximated with $\Delta Z = \lambda / \{2 (NA)^2\}$. $\Delta Z$ is 0.28 μm at λ=405 nm and NA=0.85. Since the range±0.3 μm of this value is included in the range of the focal depth, the intermediate layer 16 is required to have a thickness of 0.8 μm or more It is preferable that the thickness of the intermediate layer 16 is within the substrate thickness tolerance that can be allowed with respect to an objective lens used, in combination with the thickness of the dummy substrate 110, so that the distance between the first recording layer 13 of the first information layer 21 and the second recording layer 18 of the second information layer 22 is within the range in which the objective lens can focus light. Therefore, the thickness of the intermediate layer is preferably 10 μm to 40 μm. The intermediate layer 16 may be configured with a plurality of laminated layers made of resin, if necessary. More specifically, the intermediate layer 16 may be formed of two layers of a layer for protecting the fourth dielectric layer 17 and a layer provided with guide grooves.

The first reflective layer 14 serves to diffuse heat in the first recording layer 13 rapidly. When the second information layer 22 is subjected to recording and reproduction, laser light 12 that has been transmitted through the first information layer 21 is used, and therefore, the first information layer 21 has to have high light transmission as a whole, and preferably has a light transmission of 45% or more. For this reason, the material and the thickness of the first reflective layer 14 are limited, compared to the second reflective layer 20. In order to reduce light absorption of the first reflective layer 14, it is preferable that the first reflective layer 14 has a small thickness so as to have a small extinction coefficient and a large thermal conductivity. More specifically, the first reflective layer 14 is formed of, preferably, an alloy containing Ag in a thickness of 5 nm or more and 15 nm or less.

In order to ensure a high light transmission of the first information layer 21, the material and the thickness of the first recording layer 13 also are limited, compared to the second recording layer 18. The first recording layer 13 is formed such that the average of the transmission in the crystalline phase and the transmission in the amorphous phase is 45% or more. For this reason, the thickness of the first recording layer 13 preferably is 7 nm or less. The material of the first recording layer 13 is selected such that even with such a small thickness, it is ensured that good recording marks are formed by melting and rapid cooling, high quality signals can be reproduced, and recording marks are erased by heating and gradually cooling. More specifically, it is preferable that the first recording layer 13 is formed of Ge—Sb—Te such as GeTe—$Sb_2Te_3$ based materials, which are reversible phase change materials, or Ge—Sn—Sb—Te in which a part of Ge of a GeTe—$Sb_2Te_3$ based material is substituted with Sn. Ge—Bi—Te such as GeTe—$Bi_2Te_3$ based materials or Ge—Sn—Bi—Te in which a part of Ge of Ge—Bi—Te is substituted with Sn can be used. More specifically, for example, $Ge_{22}Sb_2Te_{25}$ with GeTe:$Sb_2Te_3$=22:1 or $Ge_{19}Sn_3Sb_2Te_{25}$ can be used preferably.

It is preferable that the adhesive layer 9 is formed of a transparent UV curable resin, similarly to the adhesive layer 9 of Embodiment 5. It is preferable that the thickness of the adhesive layer 9 is 5 to 15 μm.

The dummy substrate 110 is the same as the dummy substrate 110 of Embodiment 5. Therefore the dummy substrate is not described further. In this embodiment as well, if the adhesive layer 9 also serves as the dummy substrate 110 and can be formed in a thickness of 50 μm to 120 μm, the dummy substrate 110 can be eliminated.

In the information recording medium of this embodiment, only one dielectric layer of the first dielectric layer 2, the second dielectric layer 6, the fourth dielectric layer 17 and the fifth dielectric layer 19 may be an oxide-based material layer. Alternatively, two or three dielectric layers may be oxide-based material layers. When one dielectric layer is an oxide-based material layer, at least one interface layer can be eliminated. When two dielectric layers are oxide-based material layers, at least two interface layers can be eliminated. Therefore, in the information recording medium of this embodiment, as many as four interface layers can be eliminated. Between the dielectric layer that is not an oxide-based material layer and the recording layer, if necessary, an interface layer for preventing substance movement between the recording layer and the dielectric layer may be provided. In this case, the interface layer can be made of an oxide-based material layer having a very small thickness of about 5 nm.

The information recording medium having two information layers having recording layers has been described above. The structure of an information recording medium having a plurality of recording layers is not limited thereto, and can have three or more information layers. In a variation example of the embodiment shown in FIG. 6, for example, one information layer of the two information layers has a recording layer in which a reversible phase change is caused, and the other information layer has a recording layer in which an irreversible phase change is caused. Alternatively, an information recording medium having three information layers can have the following structure: one of the three information layers is a read-only information layer, another information layer has a recording layer in which a reversible phase change is caused, and the other information layer has a recording layer in which an irreversible phase change is caused. Thus, the information recording medium having two or more information layers can be varied. In any embodiment, it is possible to eliminate the interface layer between the recording layer and the dielectric layer by using the oxide-based material layer as the dielectric layer.

In the information recording medium having at least two recording layers, the oxide-based material layer may be present as an interface layer positioned between the recording layer and the dielectric layer. Such an interface layer can be formed so as to have a very small thickness of about 5 nm.

Next, a method for producing the information recording medium 30 of Embodiment 6 will be described. The information recording medium 30 is produced by performing the step (step j) of forming the second reflective layer 20 on the substrate 101, the step (step k) of forming the fifth dielectric layer 19, the step (step l) of forming the second recording layer 18, and the step (step m) of forming the fourth dielectric layer 17 in this order, further by performing the step of forming the intermediate layer 16 on the surface of the fourth dielectric layer 17, the step (step n) of forming the third dielectric layer 15 on the surface of the intermediate layer 16, the step (step o) of forming the first reflective layer 14, the step (step p) of forming the second dielectric layer 6, the step (step q) of forming the first recording layer 13, and the step (step r) of forming the first dielectric layer 2 in this order, and further performing the step of forming the adhesive layer 9 on the surface of the first dielectric layer 2 and the step of attaching the dummy substrate 110.

The steps j to m correspond to the step of forming the second information layer 22. The step j is a step of forming the second reflective layer 20 on the surface of the substrate 101 on which guide grooves are formed. The step j is performed in the same manner as the step e of Embodiment 1. Next, the step k is performed so that the fifth dielectric layer 19 is formed on the surface of the second reflective layer 20. The step k is performed in the same manner as the step c of Embodiment 1. Then, the step l is performed so that the second recording layer 18 is formed on the fifth dielectric layer 19. The step l is performed in the same manner as the step b of Embodiment 1. Finally, the step m is performed so that the fourth dielectric layer 17 is formed on the surface of the second recording layer 18. The step m is performed in the same manner as the step a of Embodiment 1.

The substrate 101 in which the second information layer 22 is formed by the steps j to m is removed from the sputtering apparatus, and the intermediate layer 16 is formed. The intermediate layer 16 is formed in the following manner. First, UV curable resin is applied on the surface of fourth dielectric layer 17 by, for example, spin-coating. Next, the rough surface of a polycarbonate substrate having concavities and convexities that is complementary to the guide grooves to be formed in the intermediate layer is attached tightly to the UV curable resin. In this state, the resin is irradiated with ultraviolet rays to be cured, and then the polycarbonate substrate having concavities and convexities is detached. Thus, the guide grooves having a complementary shape to the concavities and convexities are formed on the UV curable resin, and thus the intermediate layer 16 having the guide grooves shown in FIG. 6 is formed. In another method, the intermediate layer 16 is formed by forming a layer for protecting the fourth dielectric layer 17 with UV curable resin, and forming a layer having guide grooves thereon. In this case, the obtained intermediate layer 16 has a two-layer structure. Alternatively, the intermediate layer may be obtained by laminating three or more layers.

The substrate 101 on which the layers up to the intermediate layer 16 is placed again in the sputtering apparatus and the first information layer 21 is formed on the surface of the intermediate layer 16. The steps of forming the first information layer 21 correspond to the steps n to r.

The step n is a step of forming the third dielectric layer 15 on the surface provided with the guide grooves of the intermediate layer 16. In step n, sputtering is performed in an Ar gas atmosphere or a mixed gas atmosphere of Ar gas and $O_2$ gas, using a high frequency power and a sputtering target containing a $TiO_2$ material. If the sputtering target is $TiO_2$ with oxygen depleted, sputtering can be performed using a direct current power of a pulse generation type.

Then, the step o is performed so that the first reflective layer 14 is formed on the surface of the third dielectric layer 15. In the step o, sputtering is performed in an Ar gas atmosphere, using a direct current power and a sputtering target of an alloy containing Ag. Next, the step p is performed so that the second dielectric layer 6 is formed on the surface of the first reflective layer 14. The step p is performed in the same manner as the step k.

Next, the step q is performed so that the first recording layer 13 is formed on the surface of the second dielectric layer 6. In the step q, sputtering is performed in an Ar gas atmosphere or a mixed gas atmosphere of Ar gas and $N_2$ gas, using a direct current power and a sputtering target containing any one material selected from the group consisting of Ge—Sb—Te which is a GeTe—$Sb_2Te_3$ based material, or Ge—Sn—Sb—Te in which a part of Ge of a GeTe—$Sb_2Te_3$ based material is substituted with Sn, Ge—Bi—Te, Ge—Sn—Bi—Te, Ge—Sb—Bi—Te, and Ge—Sn—Sb—Bi—Te.

Next, the step r is performed so that the first dielectric layer 2 is formed on the surface of the first recording layer 13. The step r is performed in the same manner as the step m. Thus, the steps n to r are performed sequentially so that the first information layer 21 is formed.

The substrate 101 in which the layers up to the first information layer 21 are formed is removed from the sputtering apparatus. Then, UV curable resin is applied onto the surface of the first dielectric layer 2 by, for example, spin-coating. Next, the dummy substrate 110 is attached tightly to the applied UV curable resin, the irradiation of ultraviolet rays is performed from the side of the dummy substrate 110 to cure the resin and thus the attachment step is completed. Also in the method for producing the information recording medium of Embodiment 6, the step of attaching the dummy substrate 110 can be eliminated, in the same manner as the method for producing the information recording medium of Embodiment 5.

After the attachment step ends, the initialization step of the second information layer 22 and the first information layer 21 is performed, if necessary. With respect to the second information layer 22, the initialization step may be performed before or after the intermediate layer is formed, and with respect to the first information layer 21, the initialization step may be performed before or after the attachment step of the dummy substrate 110. The method for performing the initialization step is such as described in Embodiment 1.

An optical information recording medium for recoding and reproducing information with laser light has been described as embodiments of the information recording medium of the present invention with reference to FIGS. 1 to 6. The optical information recording medium of the present invention is not limited thereto. In the optical information recording medium of the present invention, an oxide-based material layer can be provided in contact with the recording layer as one constituent layer, and can take any forms. Furthermore, even if the oxide-based material layer is not in contact with the recording layer, it can be used arbitrarily as a dielectric layer contained in the information recording medium. That is to say, the present invention can be applied, regardless of the order of forming the layers on the substrate, the number of the recording layer, the recording conditions, the recording capacity and the like. The optical information recording medium of the present invention is suitable for recording in various wavelengths. Therefore, the optical information recording medium of the present invention may be, for example, DVD-RAM or DVD-R for recording and reproduction with laser light with a wavelength 630 to 680 nm or a large capacity optical disk for recording and reproduction with laser light with a wavelength 400 to 450 nm.

Embodiment 7

Figure 9:
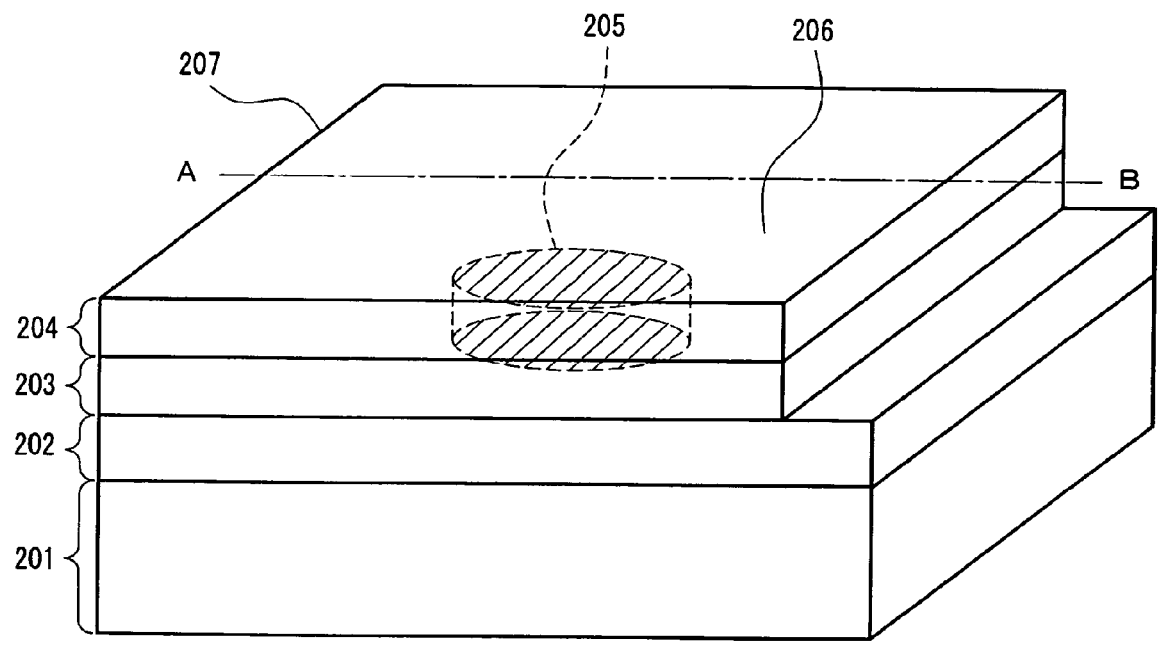
FIG. 9 is a schematic view showing an example of an information recording medium of the present invention on which information is recorded by application of electric energy.

As Embodiment 7 of the present invention, one example of an information recording medium on/from which information is recorded/reproduced by application of electric energy will be described. FIG. 9 shows a partial cross-sectional view of the information recording medium.

FIG. 9 shows a memory 207 in which a lower electrode 202, a recording portion 203 and an upper electrode 204 are formed on a surface of a substrate 201 in this order. The recording portion 203 of the memory 207 has a structure including a cylindrical recording layer 205 and a dielectric layer 206 enclosing the recording layer 205. Unlike the optical information recording medium described with reference to FIGS. 1 to 6, in the memory 207 of this embodiment, the recording layer 205 and the dielectric layer 206 are formed on the same plane and are not laminated. However, both the recording layer 205 and the dielectric layer 206 constitute a part of a multilayered product including the substrate 201, the lower and the upper electrode 202 and 204, and therefore they can be referred to as "layers". Thus, the information recording medium of the present invention includes the embodiment in which the recording layer and the dielectric layer are formed on the same plane.

More specifically, as the substrate 201, semiconductor substrates such as Si substrate, polycarbonate substrates, and insulating substrates such as $SiO_2$ substrates and $Al_2O_3$ substrates can be used. The lower electrode 202 and the upper electrode 204 are formed of a suitable conductive material. The lower electrode 202 and the upper electrode 204 can be formed by, for example, sputtering a metal such as Au, Ag, Pt, Al, Ti, W and Cr and a mixture of these metals.

The recording layer 205 constituting the recording portion 203 is formed of a material that is phase-changed by applying electric energy and thus can be referred to "phase change portion". The recording layer 205 is formed of a material that is phase-changed between the crystalline phase and the amorphous phase by Joule heat generated by applying electric energy. As the material of the recording layer 205, for example, Ge—Sb—Te, Ge—Sn—Sb—Te, Ge—Bi—Te, Ge—Sn—Bi—Te, Ge—Sb—Bi—Te, and Ge—Sn—Sb—Bi—Te based materials can be used. More specifically, GeTe—$Sb_2Te_3$ or GeTe—$Bi_2Te_3$ based materials can be used.

The dielectric layer 206 constituting the recording portion 203 serves to prevent current flowing through the recording layer 205 from escaping to the periphery when applying a voltage between the upper electrode 204 and the lower electrode 202, and to insulate the recording layer 205 electrically and thermally. Therefore, the dielectric layer 206 can be referred to as "thermal insulating portion". The dielectric layer 206 is an oxide-based material layer, and more specifically, one of the oxide-based material layers (I) to (IV) described above. The oxide-based material layer can be used preferably for the following reasons: the melting point is high; the atoms in the material layer are hardly diffused even if it is heated; and the thermal conductivity is low.

This memory 207 will be described more specifically by way of examples below together with a method for operating this memory.

EXAMPLES

Next, the present invention will be described more specifically by way of examples.
Test 1

The relationship between the nominal composition (in other words, the composition indicated nominally by a sputtering target manufacturer when being supplied) of the sputtering target made of an oxide-based material used in the production of the information recording medium of the present invention and the analyzed composition was confirmed by a test.

In this test, the sputtering target indicated as $(ZrO_2)_{25}(SiO_2)_{25}(Ga_2O_3)_{50}$ (mol %) corresponding to the formula (19) as the nominal composition was made into powder, and the composition was analyzed by the X-ray microanalyzer method. As a result, the analyzed composition of the sputtering target was obtained, not as the formula (19) indicated by the ratio of the compounds (mol %), but as the formula (17) indicated by the ratio of the elements (atom %). Table 1 shows the analyzed results. Furthermore, Table 1 also shows the converted composition that is an element composition obtained based on the nominal composition.

TABLE 1

| nominal composition of target $(ZrO_2)_{x3}(SiO_2)_{z1}(Ga_2O_3)_{100-x3-z1}$ (mol %) (=converted composition (atom %)) | analyzed composition of target (atom %) $Zr_{q3}Si_{r1}Ga_{t3}O_{100-q3-r1-t3}$ |
|---|---|
| $(ZrO_2)_{25}(SiO_2)_{25}(Ga_2O_3)_{50}$ $(Zr_{6.3}Si_{6.3}Ga_{25.0}O_{62.4})$ | $Zr_{6.2}Si_{6.5}Ga_{25.0}O_{62.3}$ |

As shown in Table 1, the analyzed composition was substantially equal to the converted composition. These results confirmed that the actual composition (i.e., analyzed composition) of the sputtering target indicated by the formula (19) substantially matched the element composition (i.e., converted composition) obtained by calculations, and therefore the nominal composition was proper.
Test 2

The relationship between the nominal composition of the sputtering target made of an oxide-based material used in the production of the information recording medium of the present invention and the analyzed composition of an oxide-based material layer formed using this sputtering target was confirmed by a test. More specifically, a sputtering target (diameter: 100 mm, thickness: 6 mm) indicated by $(ZrO_2)_{25}(SiO_2)_{25}(Ga_2O_3)_{50}$ (mol %) as the nominal composition corresponding to the formula (19) was placed in a film-formation apparatus (i.e., sputtering apparatus) and subjected to sputtering in an Ar gas atmosphere with a pressure of 0.13 Pa at a power of 400 W, using a high frequency power. By this sputtering, an oxide-based material layer having a thickness of 500 nm was formed on a Si substrate. The composition of this oxide-based material layer also was analyzed by the X-ray microanalyzer method. The analyzed composition of the oxide-based material layer also was obtained not as the formula (7) indicated by the ratio of the compounds (mol %), but as the formula (5) indicated by the ratio of the elements (atom %). Table 2 shows the analyzed results. Furthermore, Table 2 also shows the converted composition obtained based on the nominal composition of the sputtering target.

TABLE 2

| nominal composition of target $(ZrO_2)_{x3}(SiO_2)_{z1}(Ga_2O_3)_{100-x3-z1}$ (mol %) (=converted composition (atom %)) | analysis composition of oxide-based material layer (atom %) $Zr_{Q3}Si_{R1}Ga_{T3}O_{100-Q3-R1-T3}$ |
|---|---|
| $(ZrO_2)_{25}(SiO_2)_{25}(Ga_2O_3)_{50}$ $(Zr_{6.3}Si_{6.3}Ga_{25.0}O_{62.4})$ | $Zr_{6.8}Si_{6.8}Ga_{25.1}O_{61.3}$ |

As shown in Table 2, the analyzed composition of the layer was substantially equal to the converted composition of the sputtering target. These results confirmed that the actual composition of the oxide-based material layer formed with the sputtering target indicated by the formula (19) substantially matched the converted composition obtained by calculations based on the nominal composition of the sputtering target. Consequently, it was confirmed that films having substantially the same composition were obtained, if the sputtering target indicated by the formula (19) was used.

It is believed that the same results as those of Tests 1 and 2 can be obtained with other sputtering targets provided with an indication of the mixture ratio of an oxide of at least one element selected from Zr and Hf, and a mixture ratio of at least one element selected from the group consisting of La, Ce, Al, Ga, In, Mg and Y. Therefore, the composition of the sputtering targets is shown by the nominal composition (mol %) in the following examples. Furthermore, it was determined that the nominal composition of a sputtering target can be regarded as being equal to the composition (mol %) of the oxide-based material layer formed by sputtering using the sputtering target. Therefore, the composition of the dielectric layer is indicated by the indication of the composition of the sputtering target in the following examples. In some of the following examples, the compositions of the sputtering target and the oxide-based material layer are indicated only by the ratio (mol %) of the compounds. Those skilled in the art would calculate easily the element composition (atom %) of the sputtering target and the oxide-based material layer, based on the ratio (mol %) of the compounds.

Example 1

In Example 1, in order to investigate the transparency of the oxide-based material layer, the complex refractive indexes (n-ki, n: refractive index, k: extinction coefficient) in a red region (wavelength 660 nm) and a bluish-purple region (wavelength 405 nm) were measured. In the procedure, a sample was prepared in which a thin film containing an oxide-based material is formed on a quartz glass substrate, and the complex refractive index of the thin film was measured by ellipsometry. The prepared oxide-based materials are mixtures of an oxide of at least one element selected from the group consisting of Zr and Hf and an oxide of at least one element selected from the group consisting of La, Ce, Al, Ga, In, Mg and Y, and mixtures further mixed with Si. The prepared oxide-based materials are 16 types as bellow: $(ZrO_2)_{20}(La_2O_3)_{80}$, $(ZrO_2)_{20}(CeO_2)_{80}$, $(ZrO_2)_{20}(Al_2O_3)_{80}$, $(ZrO_2)_{20}(Ga_2O_3)_{80}$, $(ZrO_2)_{20}(In_2O_3)_{80}$, $(ZrO_2)_{20}(MgO)_{80}$, and $(ZrO_2)_{20}(Y_2O_3)_{80}$, which are mixtures of the two oxides; $(ZrO_2)_{20}(Cr_2O_3)_{80}$ as a comparative example; and $(ZrO_2)_{25}(SiO_2)_{25}(La_2O_3)_{50}$, $(ZrO_2)_{25}(SiO_2)_{25}(CeO_2)_{50}$, $(ZrO_2)_{25}(SiO_2)_{25}(Al_2O_3)_{50}$, $(ZrO_2)_{25}(SiO_2)_{25}(Ga_2O_3)_{50}$, $(ZrO_2)_{25}(SiO_2)_{25}(In_2O_3)_{50}$, $(ZrO_2)_{25}(SiO_2)_{25}(MgO)_{50}$, and $(ZrO_2)_{25}(SiO_2)_{25}(Y_2O_3)_{50}$, which are mixtures further mixed with $SiO_2$; and $(ZrO_2)_{25}(SiO_2)_{25}(Cr_2O_3)_{50}$ as a comparative example.

A sputtering target (diameter: 100 mm, thickness: 6 mm) containing an oxide-based material was provided in a vacuum chamber of a sputtering apparatus, and as a substrate, a quartz glass (length: 18 mm, width: 12 mm, and thickness: 1.2 mm) was opposed to the sputtering target. Sputtering was performed in an Ar gas atmosphere with a pressure of 0.13 Pa at a power of 400 W, using a high frequency power. The 16 types of the materials were subjected to sputtering under the same conditions to form an oxide-based material layer in a thickness of 0.20 nm each on the quartz glass substrate. The quartz glass sample piece was removed from the vacuum chamber, and the complex refractive indexes (n-ki, n: refractive index, k: extinction coefficient) in a red region (wavelength $\lambda$=660 nm) and a blue violet region (wavelength $\lambda$=405 nm) were measured by ellipsometry. Table 3 shows the measurement results.

TABLE 3

| Sample No. | oxide-based material layer (mol %) | complex refractive index (n-ki) $\lambda$ = 660 nm | $\lambda$ = 405 nm |
|---|---|---|---|
| 1-1 | $(ZrO_2)_{20}(La_2O_3)_{80}$ | 2.1-0.00i | 2.1-0.00i |
| 1-2 | $(ZrO_2)_{20}(CeO_2)_{80}$ | 2.1-0.00i | 2.1-0.00i |
| 1-3 | $(ZrO_2)_{20}(Al_2O_3)_{80}$ | 2.1-0.00i | 2.0-0.00i |
| 1-4 | $(ZrO_2)_{20}(Ga_2O_3)_{80}$ | 2.0-0.00i | 2.0-0.00i |
| 1-5 | $(ZrO_2)_{20}(In_2O_3)_{80}$ | 2.1-0.00i | 2.1-0.00i |
| 1-6 | $(ZrO_2)_{20}(MgO)_{80}$ | 2.3-0.00i | 2.2-0.00i |
| 1-7 | $(ZrO_2)_{20}(Y_2O_3)_{80}$ | 2.1-0.00i | 2.1-0.00i |
| Com. Ex. 1-1 | $(ZrO_2)_{20}(Cr_2O_3)_{80}$ | 2.5-0.06i | 2.7-0.20i |
| 1-8 | $(ZrO_2)_{25}(SiO_2)_{25}(La_2O_3)_{50}$ | 2.0-0.00i | 2.0-0.00i |
| 1-9 | $(ZrO_2)_{25}(SiO_2)_{25}(CeO_2)_{50}$ | 2.0-0.00i | 2.0-0.00i |
| 1-10 | $(ZrO_2)_{25}(SiO_2)_{25}(Al_2O_3)_{50}$ | 2.0-0.00i | 1.9-0.00i |
| 1-11 | $(ZrO_2)_{25}(SiO_2)_{25}(Ga_2O_3)_{50}$ | 1.9-0.00i | 2.0-0.00i |
| 1-12 | $(ZrO_2)_{25}(SiO_2)_{25}(In_2O_3)_{50}$ | 2.0-0.00i | 2.0-0.00i |
| 1-13 | $(ZrO_2)_{25}(SiO_2)_{25}(MgO)_{50}$ | 2.1-0.00i | 2.0-0.00i |
| 1-14 | $(ZrO_2)_{25}(SiO_2)_{25}(Y_2O_3)_{50}$ | 2.0-0.00i | 2.0-0.00i |
| Com. Ex. 1-2 | $(ZrO_2)_{25}(SiO_2)_{25}(Cr_2O_3)_{50}$ | 2.2-0.04i | 2.3-0.13i |

As shown in Table 3, in all of the materials of samples 1-1 to 1-14 except $(ZrO_2)_{20}(Cr_2O_3)_{80}$ and $(ZrO_2)_{25}(SiO_2)_{25}(Cr_2O_3)_{50}$, k=0.00 at $\lambda$=660 nm and $\lambda$=405 nm. That is to say, it was confirmed that they were transparent. In the materials containing $Cr_2O_3$, 0<k was obtained and it was confirmed that the transparency was low.

The complex refractive index can be obtained by calculations by measuring the reflectance and the transmission of the sample pieces with a spectroscope. This method also can provide precise complex refractive indexes.

Example 2

When the same oxide-based material layer as in Example 1 except that $HfO_2$ is contained instead of $ZrO_2$ was used to investigate its transparency, the same results as in Example 1 were obtained. More specifically, with $(HfO_2)_{X1}(E1)_{100-X1}$ (mol %) and $(HfO_2)_{X1}(SiO_2)_Z(E)_{100-X1-Z}$ (mol %), k=0.00 was obtained at $\lambda$=660 nm and $\lambda$=405 nm. That is to say, it was confirmed that they were transparent.

Example 3

In Example 3, the information recording medium 25 was produced using the oxide-based material layer. More specifically, the oxide-based material layer made of a material of $(ZrO_2)_{50}(E)_{50}$ (mol %) was used for the first dielectric layer 2 and the second dielectric layer 6. E shown herein indicates either one of $La_2O_3$, $CeO_2$, $Al_2O_3$, $Ga_2O_3$, $In_2O_3$, MgO, and $Y_2O_3$. Using such oxide-based material layers, seven types of medium samples (sample 3-1 to 3-7) were produced, and the adhesion, the repeated rewriting performance, and the recording sensitivity were evaluated.

Hereinafter, the method for producing the information recording medium 25 will be described. In the following description, the same reference numerals as those of the components shown in FIG. 1 are used as the reference numerals of the components for easy understanding. In the information recording media of the examples below as well, the same reference numerals as those of the components of the corresponding information recording medium are used as the reference numerals of the components.

First, a round polycarbonate substrate having a diameter of 120 mm and a thickness of 0.6 mm that are previously provided with guide grooves having a depth of 56 nm and a track pitch (distance between the centers of the groove surface and the land surface in a plane parallel to the main plane of the substrate) of 0.615 μm on one surface was prepared as a substrate 1. A first dielectric layer 2 having a thickness of 150 nm, a recording layer 4 having a thickness of 9 nm, a second dielectric layer 6 having a thickness of 50 nm, a light-absorption correction layer 7 having a thickness of 40 nm, and a reflective layer 8 having a thickness of 80 nm were formed on the substrate 1 in this order by sputtering in the following method.

In the step of forming the first dielectric layer 2 and the second dielectric layer 6, a sputtering target (diameter: 100 mm, thickness: 6 mm) made of the $(ZrO_2)_{50}(E)_{50}$ (mol %) material as described above was provided in a film-formation apparatus, and sputtering was performed in an Ar gas atmosphere with a pressure of 0.13 Pa at a high frequency power of 400 W.

In the step of forming the recording layer 4, a sputtering target (diameter: 100 mm, thickness: 6 mm) made of the Ge—Sn—Sb—Te material in which a part of Ge of a GeTe—$Sb_2Te_3$ pseudo-binary composition is substituted with Sn was provided in a film-formation apparatus, and DC sputtering was performed. The power was 100 W. During sputtering, a mixed gas of Ar gas (97%) and $N_2$ gas (3%) was introduced. The pressure during sputtering was 0.13 Pa. The composition of the recording layer was $Ge_{27}Sn_8Sb_{12}Te_{53}$ (atom %).

In the step of forming the light-absorption correction layer 7, a sputtering target (diameter: 100 mm, thickness: 6 mm) made of a material having a composition of $Ge_{80}Cr_{20}$ (atom %) was provided in a film-formation apparatus, and DC sputtering was performed in an Ar gas atmosphere with a pressure of about 0.4 Pa at a power of 300 W.

In the step of forming the reflective layer 8, a sputtering target (diameter: 100 mm, thickness: 6 mm) made of a Ag—Pd—Cu alloy was provided in a film-formation apparatus, and DC sputtering was performed in an Ar gas atmosphere with a pressure of about 0.4 Pa at a power of 200 W.

After the reflective layer 8 was formed, UV curable resin was applied onto the reflective layer 8. A dummy substrate 10 made of polycarbonate having a diameter of 120 mm and a thickness of 0.6 mm was attached tightly onto the applied UV curable resin. Then, irradiation of ultraviolet rays was performed from the side of the dummy substrate 10 to cure the resin. Thus, the adhesive layer 9 made of the cured resin was formed in a thickness of 30 μm, and the dummy substrate 10 was attached onto the reflective layer 8 via the adhesive layer 9 at the same time.

After the dummy substrate 10 was attached, the initialization step was performed using a semiconductor laser having a wavelength of 810 nm. In the initialization step, substantially the entire recording layer 4 positioned in a circular region in a 22 to 60 mm range of the radius of the information recording medium 25 was crystallized. The production of the information recording medium 25 was finished with the end of the initialization.

As a comparative example, a medium sample (comparative example 3-1) in which the first dielectric layer 2 and the second dielectric layer 6 were formed of $(ZrO_2)_{50}(Cr_2O_3)_{50}$ (mol %) was produced. In the production process, a sputtering target (diameter: 100 mm, thickness: 6 mm) made of the $(ZrO_2)_{50}(Cr_2O_3)_{50}$ (mol %) material was provided in a film-formation apparatus, and sputtering was performed in an Ar gas atmosphere with a pressure of 0.13 Pa at a high frequency power of 400 W. The materials and the steps of the other layers were the same as above.

Next, a method for evaluating the information recording media will be described. The adhesion of the dielectric layer in the information recording medium 25 was evaluated based on the presence or the absence of the peeling under high temperature and high humidity conductions. More specifically, the information recording medium 25 after the initialization step was left in a high temperature and high humidity bath at a temperature of 90° C. and a relative humidity of 80% for 100 hours, and then it was examined visually with an optical microscope as to whether peeling occurs between the recording layer and the dielectric layer in contact with this recording layer, more specifically, at least one of the interface between the recording layer 4 and the first dielectric layer 2 and the interface between the recording layer 4 and the second dielectric layer 6. Samples without peeling were evaluated to have good adhesion, and samples with peeling were evaluated to have poor adhesion.

The repeated rewriting performance of the information recording medium 25 was evaluated based on the number of repetitions. The number of repetitions was determined in the following conditions.

An information recording system having a general structure including a spindle motor for rotating the information recording medium 25, an optical head provided with a semiconductor laser emitting laser light 12, and an objective lens for focusing the laser light 12 on the recording layer 4 of the information recording medium 25 was used to record information in the information recording medium 25. For evaluation of the information recording medium 25, recording corresponding to a capacity of 4.7 GB was performed using a semiconductor laser with a wavelength of 660 nm and an objective lens having a numerical aperture of 0.6. The linear velocity at which the information recording medium 25 was rotated was 8.2 m/sec. A time interval analyzer was used to measure the jitter value to obtain the average jitter value as described below.

First, a peak power (Pp) and a bias power (Pb) were set in the following procedure in order to determine the measurement conditions for determining the number of repetitions. Using the above-describe system, the information recording medium 25 was irradiated with the laser light 12 while changing the power between a peak power (mW) in a high power level and a bias power (mW) in a low power level, and a random signal having a mark length of 0.42 μm (3T) to 1.96 μm (14T) was recoded (by groove recording) ten times on the same groove surface of the recording layer 4. Then, the jitter value between the front ends and the jitter value between the rear ends were measured and then the average of these jitter values was obtained. The bias power was fixed to a predetermined value, and the average jitter value was measured with respect to different recording conditions in which the peak power was changed variously. The peak power was gradually increased, and the power 1.3 times larger than the peak power when the average jitter value of the random signal reached 13% was taken as Pp1 for example. Then, the peak power was fixed to Pp1 and the average jitter value was measured with respect to different recording conditions in which the bias power was changed variously. The average of the upper limit and the lower limit of the bias power when the average jitter value of the random signal became 13% or less was set to Pb. Then, the bias power was fixed to Pb, and the average jitter value was measured with respect to each recording condition in which the peak power was changed variously. The peak power was gradually increased, and the power 1.3 times larger than the power when the average jitter value of the random signal reached 13% was set to Pp. When recording was performed under the conditions of the thus set Pp and Pb, for example, an average jitter value of 8 to 9% was obtained when recording was repeated 10 times. Taking the upper limit of the laser power of the system into consideration, it is preferable to satisfy Pp≦14 mW and Pb≦8 mW. For the recording sensitivity, the smaller value of Pp is better.

The number of repetitions was determined based on the average jitter value in this example. The information recording medium 25 was irradiated with the laser light 12 while changing the power between Pp and Pb set as above, and a random signal having a mark length of 0.42 µm (3T) to 1.96 µm (14T) was recorded (by groove recording) repeatedly and continuously in the predetermined number of times on the same groove surface. Then, the average jitter value was measured. The average jitter value was measured when the number of repetitions is 1, 2, 3, 5, 10, 100, 200 and 500. While the number of repetitions was in the range from 1000 to 10000, measurement was performed every 1000 times, and while the number of repetitions was in the range from 20000 to 100000, measurement was performed every 10000 times. The time when the average jitter value reached 13% was determined to be the limit for repeated rewriting, and the repeated rewriting performance was evaluated by the number of repetitions at this point. The repeated rewriting performance is evaluated to be higher as the number of repetitions is larger. When the information recording medium is used as an external memory of a computer, it is preferable that the number of repetitions is 100000 or more. When the information recording medium is used in a video/audio recorder, it is preferable that the number of repetitions is 10000 or more.

As shown in Table 4, samples 3-1 to 3-7 have good adhesion, repeated rewriting performance and recording sensitivity. In particular, in $(ZrO_2)_{50}(Ga_2O_3)_{50}$ (mol %) of sample 3-4, a repeated rewriting performance of 100000 times and a high recording sensitivity of 12.5 mW were obtained. On the other hand, in a comparative example in which an oxide-based material layer of $(ZrO_2)_{50}(Cr_2O_3)_{50}$ (mol %) was used, the recording sensitivity was more than 14 mW. These results confirmed that the recording sensitivity was improved by using an oxide-based material layer containing a mixture of $ZrO_2$ and E.

Furthermore, the same media as samples 3-1 to 3-7 and the comparative example 3-1 except that $HfO_2$ was used instead of $ZrO_2$ were produced (samples 3-11 to 3-17 and comparative example 3-2), and were evaluated in the same manner. The results shown in Table 5 were obtained. These results confirmed that the recording sensitivity of the oxide-based material layer containing a material containing $HfO_2$ and (E) also was improved.

TABLE 5

| Sample No. | materials of first dielectric layer and second dielectric layer (mol %) | atom % conversion per element | peeling | number of repetitions (times) | peak power Pp (mW) |
|---|---|---|---|---|---|
| 3-11 | $(HfO_2)_{50}(La_2O_3)_{50}$ | $Hf_{12.5}La_{25}O_{62.5}$ | no | 20000 | 12.4 |
| 3-12 | $(HfO_2)_{50}(CeO_2)_{50}$ | $Hf_{16.7}Ce_{16.7}O_{66.6}$ | no | 20000 | 12.4 |
| 3-13 | $(HfO_2)_{50}(Al_2O_3)_{50}$ | $Hf_{12.5}Al_{25}O_{62.5}$ | no | 30000 | 13.3 |
| 3-14 | $(HfO_2)_{50}(Ga_2O_3)_{50}$ | $Hf_{12.5}Ga_{25}O_{62.5}$ | no | 100000 | 12.3 |
| 3-15 | $(HfO_2)_{50}(In_2O_3)_{50}$ | $Hf_{12.5}In_{25}O_{62.5}$ | no | 100000 | 12.9 |
| 3-16 | $(HfO_2)_{50}(MgO)_{50}$ | $Hf_{20}Mg_{20}O_{60}$ | no | 10000 | 12.4 |
| 3-17 | $(HfO_2)_{50}(Y_2O_3)_{50}$ | $Hf_{12.5}Y_{25}O_{62.5}$ | no | 100000 | 13.0 |
| Com. Ex. 3-2 | $(HfO_2)_{50}(Cr_2O_3)_{50}$ | $Hf_{12.5}Cr_{25}O_{62.5}$ | no | 100000 | 14.8 |

Example 4

In Example 4, the applicable range of the composition of the $(ZrO_2)_{50}(Ga_2O_3)_{50}$ (mol %) oxide-based material layer that exhibited particularly good performance in Example 3 was determined. Similarly to Example 3, oxide-based material layers with varied composition ratios of $ZrO_2$ and $Ga_2O_3$ were used for the first dielectric layer 2 and the second dielectric layer 6 of the information recording medium 25. The oxide-based material layer used here was indicated by $(ZrO_2)_X(Ga_2O_3)_{100-X}$ (mol %), and 11 types of medium samples (sample 4-1 to 4-11) formed of oxide-based material layers having a different value X were produced.

The results of evaluating the adhesion, the repeated rewriting performance, and the recording sensitivity in the same manner as in Example 3 were shown in Table 6.

TABLE 4

| Sample No. | materials of first dielectric layer and second dielectric layer (mol %) | atom % conversion per element | peeling | number of repetitions (times) | peak power Pp (mW) |
|---|---|---|---|---|---|
| 3-1 | $(ZrO_2)_{50}(La_2O_3)_{50}$ | $Zr_{12.5}La_{25}O_{62.5}$ | no | 20000 | 12.6 |
| 3-2 | $(ZrO_2)_{50}(CeO_2)_{50}$ | $Zr_{16.7}Ce_{16.7}O_{66.6}$ | no | 20000 | 12.6 |
| 3-3 | $(ZrO_2)_{50}(Al_2O_3)_{50}$ | $Zr_{12.5}Al_{25}O_{62.5}$ | no | 30000 | 13.5 |
| 3-4 | $(ZrO_2)_{50}(Ga_2O_3)_{50}$ | $Zr_{12.5}Ga_{25}O_{62.5}$ | no | 100000 | 12.5 |
| 3-5 | $(ZrO_2)_{50}(In_2O_3)_{50}$ | $Zr_{12.5}In_{25}O_{62.5}$ | no | 100000 | 13.0 |
| 3-6 | $(ZrO_2)_{50}(MgO)_{50}$ | $Zr_{20}Mg_{20}O_{60}$ | no | 10000 | 12.6 |
| 3-7 | $(ZrO_2)_{50}(Y_2O_3)_{50}$ | $Zr_{12.5}Y_{25}O_{62.5}$ | no | 100000 | 13.2 |
| Com. Ex. 3-1 | $(ZrO_2)_{50}(Cr_2O_3)_{50}$ | $Zr_{12.5}Cr_{25}O_{62.5}$ | no | 100000 | 15.0 |

TABLE 6

| Sample No. | materials of first dielectric layer and second dielectric layer (mol %) | atom % conversion per element | peeling | number of repetitions (times) | peak power Pp (mW) |
|---|---|---|---|---|---|
| 4-1 | $(ZrO_2)_{95}(Ga_2O_3)_5$ | $Zr_{31.6}Ga_{3.3}O_{65.1}$ | no | 100000 | 12.0 |
| 4-2 | $(ZrO_2)_{90}(Ga_2O_3)_{10}$ | $Zr_{28.1}Ga_{6.3}O_{65.6}$ | no | 100000 | 12.1 |
| 4-3 | $(ZrO_2)_{80}(Ga_2O_3)_{20}$ | $Zr_{23.5}Ga_{11.8}O_{64.7}$ | no | 100000 | 12.2 |
| 4-4 | $(ZrO_2)_{70}(Ga_2O_3)_{30}$ | $Zr_{19.4}Ga_{16.7}O_{63.9}$ | no | 100000 | 12.3 |
| 4-5 | $(ZrO_2)_{60}(Ga_2O_3)_{40}$ | $Zr_{15.8}Ga_{21.1}O_{63.1}$ | no | 100000 | 12.4 |
| 4-6 | $(ZrO_2)_{50}(Ga_2O_3)_{50}$ | $Zr_{12.5}Ga_{25}O_{62.5}$ | no | 100000 | 12.5 |
| 4-7 | $(ZrO_2)_{40}(Ga_2O_3)_{60}$ | $Zr_{9.5}Ga_{28.6}O_{61.9}$ | no | 100000 | 12.6 |
| 4-8 | $(ZrO_2)_{30}(Ga_2O_3)_{70}$ | $Zr_{6.8}Ga_{31.8}O_{61.4}$ | no | 100000 | 12.7 |
| 4-9 | $(ZrO_2)_{20}(Ga_2O_3)_{80}$ | $Zr_{4.3}Ga_{34.8}O_{60.9}$ | no | 100000 | 12.8 |
| 4-10 | $(ZrO_2)_{10}(Ga_2O_3)_{90}$ | $Zr_{2.1}Ga_{37.5}O_{60.4}$ | no | 100000 | 12.9 |
| 4-11 | $(ZrO_2)_5(Ga_2O_3)_{95}$ | $Zr_{1.0}Ga_{38.8}O_{60.2}$ | no | 100000 | 13.0 |
| Com. Ex. 4-1 | $(ZrO_2)_{50}(Cr_2O_3)_{50}$ | | no | 100000 | 14.5 |

As shown in Table 6, for all of the information recording media 25 in which $(ZrO_2)_X(Ga_2O_3)_{100-X}$ (mol %) oxide-based material layers were used for the first dielectric layer 2 and the second dielectric layer 6, good adhesion, a repeated rewriting performance of 100000 times, and a recording sensitivity of less than 14 mW were obtained. These results made it evident that $(ZrO_2)_X(Ga_2O_3)_{100-X}$ (mol %) can be used in a wide range of 0<X<100. The materials used in this example can be expressed by formula (2). Therefore, the results also made it evident that the materials expressed by formula (2) can be used in a wide range of 0<X1<100.

Furthermore, regarding the $(HfO_2)_{50}(Ga_2O_3)_{50}$ (mol %) oxide-based material layer that exhibited particularly good performance in Example 3, 11 types of medium samples (sample 4-21 to 4-31) were produced and evaluated in the same manner.

TABLE 7

| Sample No. | materials of first dielectric layer and second dielectric layer (mol %) | atom % conversion per element | peeling | number of repetitions (times) | peak power Pp (mW) |
|---|---|---|---|---|---|
| 4-21 | $(HfO_2)_{95}(Ga_2O_3)_5$ | $Hf_{31.6}Ga_{3.3}O_{65.1}$ | no | 100000 | 11.8 |
| 4-22 | $(HfO_2)_{90}(Ga_2O_3)_{10}$ | $Hf_{28.1}Ga_{6.3}O_{65.6}$ | no | 100000 | 11.8 |
| 4-23 | $(HfO_2)_{80}(Ga_2O_3)_{20}$ | $Hf_{23.5}Ga_{11.8}O_{64.7}$ | no | 100000 | 12.0 |
| 4-24 | $(HfO_2)_{70}(Ga_2O_3)_{30}$ | $Hf_{19.4}Ga_{16.7}O_{63.9}$ | no | 100000 | 12.1 |
| 4-25 | $(HfO_2)_{60}(Ga_2O_3)_{40}$ | $Hf_{15.8}Ga_{21.1}O_{63.1}$ | no | 100000 | 12.2 |
| 4-26 | $(HfO_2)_{50}(Ga_2O_3)_{50}$ | $Hf_{12.5}Ga_{25}O_{62.5}$ | no | 100000 | 12.3 |
| 4-27 | $(HfO_2)_{40}(Ga_2O_3)_{60}$ | $Hf_{9.5}Ga_{28.6}O_{61.9}$ | no | 100000 | 12.4 |
| 4-28 | $(HfO_2)_{30}(Ga_2O_3)_{70}$ | $Hf_{6.8}Ga_{31.8}O_{61.4}$ | no | 100000 | 12.5 |
| 4-29 | $(HfO_2)_{20}(Ga_2O_3)_{80}$ | $Hf_{4.3}Ga_{34.8}O_{60.9}$ | no | 100000 | 12.6 |
| 4-30 | $(HfO_2)_{10}(Ga_2O_3)_{90}$ | $Hf_{2.1}Ga_{37.5}O_{60.4}$ | no | 100000 | 12.7 |
| 4-31 | $(HfO_2)_5(Ga_2O_3)_{95}$ | $Hf_{1.0}Ga_{38.8}O_{60.2}$ | no | 100000 | 12.8 |
| Com. Ex. 4-2 | $(HfO_2)_{50}(Cr_2O_3)_{50}$ | | no | 100000 | 14.2 |

As shown in Table 7, the results made it evident that $(HfO_2)_X(Ga_2O_3)_{100-X}$ (mol %) can be used in a wide range of 0<X<100. The materials used in this example can be expressed by formula (4). Therefore, the results also made it evident that the materials expressed by formula (4) can be used in a wide range of 0<X2<100.

Example 5

In Example 5, the information recording medium 25 was produced using an oxide-based material layer of $(D3)_{X3}(SiO_2)_{Z1}(E2)_{100-X3-Z1}$ (mol %) obtained by using $SiO_2$ as g in the material expressed by formula (7) for the first dielectric layer 2 and the second dielectric layer 6. More specifically, $ZrO_2$ is contained as D3, each of $La_2O_3$, $CeO_2$, $Al_2O_3$, $Ga_2O_3$, $In_2O_3$, MgO, and $Y_2O_3$ is used as E2, and X3=Z1=25. In the step of forming the first dielectric layer 2 and the second dielectric layer 6, a sputtering target (diameter: 100 mm, thickness: 6 mm) made of the $(D3)_{X3}(SiO_2)_Z(E2)_{100-X3-Z}$ (mol %) material as described above was provided in a film-formation apparatus, and sputtering was performed in an Ar gas atmosphere with a pressure of 0.13 Pa at a high frequency power of 400 W. The materials and the steps of the other layers were the same as in Example 3. As a comparative example, a medium sample (comparative example 5-1) in which the first dielectric layer 2 and the second dielectric layer 6 were formed of $(ZrO_2)_{25}(SiO_2)_{25}(Cr_2O_3)_{50}$ (mol %) was produced.

Thus, several medium samples (samples 5-1 to 5-7) were produced and evaluated, regarding the adhesion, the repeated rewriting performance, and the recording sensitivity in the same manner as in Example 3. Table 8 shows the results.

TABLE 8

| Sample No. | materials of first dielectric layer and second dielectric layer (mol %) | atom % conversion per element | peeling | number of repetitions (times) | peak power Pp (mW) |
|---|---|---|---|---|---|
| 5-1 | $(ZrO_2)_{25}(SiO_2)_{25}(La_2O_3)_{50}$ | $Zr_{6.3}Si_{6.3}La_{25.0}O_{62.4}$ | no | 50000 | 11.6 |
| 5-2 | $(ZrO_2)_{25}(SiO_2)_{25}(CeO_2)_{50}$ | $Zr_{8.3}Si_{8.3}Ce_{16.7}O_{66.7}$ | no | 50000 | 11.6 |
| 5-3 | $(ZrO_2)_{25}(SiO_2)_{25}(Al_2O_3)_{50}$ | $Zr_{6.3}Si_{6.3}Al_{25.0}O_{62.4}$ | no | 80000 | 12.5 |
| 5-4 | $(ZrO_2)_{25}(SiO_2)_{25}(Ga_2O_3)_{50}$ | $Zr_{6.3}Si_{6.3}Ga_{25.0}O_{62.4}$ | no | 140000 | 11.5 |
| 5-5 | $(ZrO_2)_{25}(SiO_2)_{25}(In_2O_3)_{50}$ | $Zr_{6.3}Si_{6.3}In_{25.0}O_{62.4}$ | no | 130000 | 12.0 |
| 5-6 | $(ZrO_2)_{25}(SiO_2)_{25}(MgO)_{50}$ | $Zr_{10.0}Si_{10.0}In_{20.0}O_{60.0}$ | no | 20000 | 11.6 |
| 5-7 | $(ZrO_2)_{25}(SiO_2)_{25}(Y_2O_3)_{50}$ | $Zr_{6.3}Si_{6.3}Y_{25.0}O_{62.4}$ | no | 120000 | 12.2 |
| Com. Ex. 5-1 | $(ZrO_2)_{25}(SiO_2)_{25}(Cr_2O_3)_{50}$ | $Zr_{6.3}Si_{6.3}Cr_{25.0}O_{62.4}$ | no | 130000 | 14.2 |

As shown in Table 8, in samples 5-1 to 5-7, good results were obtained, regarding all of the adhesion, the repeated rewriting performance, and the recording sensitivity. Compared with the results of Table 4 of Example 3, it was confirmed that the repeated rewriting performance was improved and the recording sensitivity was further improved by $SiO_2$ being contained. In particular, in sample 5-4 in which $(ZrO_2)_{25}(SiO_2)_{25}(Ga_2O_3)_{50}$ (mol %) oxide-based material layer was used, a repeated rewriting performance of 100000 times or more and a recording sensitivity of less than 12 mW were obtained. In the comparative example of $(ZrO_2)_{25}(SiO_2)_{25}(Cr_2O_3)_{50}$ (mol %), the results was 14 mW<Pp.

Furthermore, the same medium samples as the samples 5-1 to 5-7 except that $HfO_2$ was used as D3 were produced (samples 5-11 to 5-17), and were evaluated in the same manner. Furthermore, as a comparative example, a medium sample (comparative example 5-2) in which the first dielectric layer 2 and the second dielectric layer 6 were formed of $(HfO)_{25}(SiO_2)_{25}(Cr_2O_3)_{50}$ (mol %) was produced.

TABLE 9

| Sample No. | materials of first dielectric layer and second dielectric layer (mol %) | atom % conversion per element | peeling | number of repetitions (times) | peak power Pp (mW) |
|---|---|---|---|---|---|
| 5-11 | $(HfO_2)_{25}(SiO_2)_{25}(La_2O_3)_{50}$ | $Hf_{6.3}Si_{6.3}La_{25.0}O_{62.4}$ | no | 50000 | 11.2 |
| 5-12 | $(HfO_2)_{25}(SiO_2)_{25}(CeO_2)_{50}$ | $Hf_{8.3}Si_{8.3}Ce_{16.7}O_{66.7}$ | no | 50000 | 11.3 |
| 5-13 | $(HfO_2)_{25}(SiO_2)_{25}(Al_2O_3)_{50}$ | $Hf_{6.3}Si_{6.3}Al_{25.0}O_{62.4}$ | no | 80000 | 12.1 |
| 5-14 | $(HfO_2)_{25}(SiO_2)_{25}(Ga_2O_3)_{50}$ | $Hf_{6.3}Si_{6.3}Ga_{25.0}O_{62.4}$ | no | 140000 | 11.2 |
| 5-15 | $(HfO_2)_{25}(SiO_2)_{25}(In_2O_3)_{50}$ | $Hf_{6.3}Si_{6.3}In_{25.0}O_{62.4}$ | no | 130000 | 11.7 |
| 5-16 | $(HfO_2)_{25}(SiO_2)_{25}(MgO)_{50}$ | $Hf_{10.0}Si_{10.0}In_{20.0}O_{60.0}$ | no | 20000 | 11.4 |
| 5-17 | $(HfO_2)_{25}(SiO_2)_{25}(Y_2O_3)_{50}$ | $Hf_{6.3}Si_{6.3}Y_{25.0}O_{62.4}$ | no | 120000 | 12.0 |
| Com. Ex. 5-2 | $(HfO_2)_{25}(SiO_2)_{25}(Cr_2O_3)_{50}$ | $Hf_{6.3}Si_{6.3}Cr_{25.0}O_{62.4}$ | no | 130000 | 14.0 |

As shown in Table 9, in samples 5-11 to 5-17, good results were obtained, regarding all of the adhesiveness, the repeated rewriting performance, and the recording sensitivity.

Example 6

In Example 6, an information recording medium (sample 6-1) in which the first dielectric layer 2 and the second interface layer 5 were oxide-based material layers in the information recording medium 26 shown in FIG. 2 corresponding to Embodiment 2 described above was produced. Hereinafter, a method for producing the information recording medium 26 will be described.

First, the same substrate as used in Example 3 was prepared as a substrate 1. A first dielectric layer 2 having a thickness of 150 nm, a recording layer 4 having a thickness of 9 nm, a second interface layer 5 having a thickness of 3 nm, a second dielectric layer 106 having a thickness of 50 nm, a light-absorption correction layer 7 having a thickness of 40 nm, and a reflective layer 8 having a thickness of 80 nm were formed on the substrate 1 in this order by sputtering with the following method.

In the step of forming the first dielectric layer 2, a sputtering target (diameter: 100 mm, thickness: 6 mm) of $(ZrO_2)_{25}(SiO_2)_{25}(Ga_2O_3)_{50}$ (mol %) was provided in a film-formation apparatus, and high frequency sputtering was performed in an Ar gas atmosphere with a pressure of 0.13 Pa. The power was 400 W.

For the second interface layer 5, similarly to the case for the first dielectric layer 2, a sputtering target (diameter: 100 mm, thickness: 6 mm) of $(ZrO_2)_{25}(SiO_2)_{25}(Ga_2O_3)_{50}$ (mol %) was provided in a film-formation apparatus, and high frequency sputtering was performed in an Ar gas atmosphere with a pressure of 0.13 Pa. The power was 400 W.

The second dielectric layer 106 was formed by sputtering at a high frequency of 400 W at a pressure of 0.13 Pa, using a sputtering target (diameter: 100 mm, thickness: 6 mm) of $(ZnS)_{80}(SiO_2)_{20}$ (mol %), in a mixed gas of Ar gas (97%) and $O_2$ gas (3%). The recording layer 4, the light-absorption correction layer 7 and the reflective layer 8 were formed in the same manner as in Example 3.

As a comparative example, a medium (comparative example 6-1) in which the first dielectric layer 2 and the second interface layer 5 were formed of $(ZrO_2)_{25}(SiO_2)_{25}(Cr_2O_3)_{50}$ (mol %) was produced. The repeated rewriting performance was evaluated by performing groove recording and land recording the produced information recording medium 26 and obtaining the number of repetitions by the method described in Example 3. Table 10 shows the evaluation results.

TABLE 10

| Sample No. | adhesive peeling | groove rewriting performance number of repetitions | power (mW) Pp | power (mW) Pb | land rewriting performance number of repetitions | power (mW) Pp | power (mW) Pb |
|---|---|---|---|---|---|---|---|
| 6-1 | no | 100000 or more | 10.5 | 4.2 | 100000 or more | 11.0 | 4.7 |
| Com. Ex. 6-1 | no | 100000 or more | 13.0 | 5.8 | 100000 or more | 13.6 | 6.3 |

As shown in Table 10, the information recording medium 26 in which the first dielectric layer 2 and the second interface layer 5 are oxide-based material layers have excellent adhesion, repeated rewriting performance, peak power and bias power in groove recording and land recording. The recording sensitivity was improved by about 20% by using $(ZrO_2)_{25}(SiO_2)_{25}(Ga_2O_3)_{50}$ (mol %) than when $(ZrO_2)_{25}(SiO_2)_{25}(Cr_2O_3)_{50}$ (mol %) was used.

When a medium in which an oxide-based material layer containing 60 mol % of $SiO_2$ that is $(ZrO_2)_{20}(SiO_2)_{60}(Ga_2O_3)_{20}$ (mol %) is used for the first dielectric layer 2 and the second interface layer 5 is produced and evaluated, the adhesion of the medium is deteriorated and it is observed that the medium was peeled in the peripheral portion. Therefore, it is preferable that the concentration of $SiO_2$ is 50 mol % or less.

Example 7

In Example 7, in the information recording medium 27 shown in FIG. 3 corresponding to Embodiment 3 described above, an information recording medium (sample 7-1) in which the first interface layer 3 and the second dielectric layer 6 are oxide-based material layers was produced. Hereinafter, a method for producing the information recording medium 27 will be described.

First, as the substrate 1, the same substrate as used in Example 1 was prepared. A first dielectric layer 102 having a thickness of 150 nm, a first interface layer 3 having a thickness of 5 nm, a recording layer 4 having a thickness of 9 nm, a second dielectric layer 6 having a thickness of 50 nm, a light-absorption correction layer 7 having a thickness of 40 nm, and a reflective layer 8 having a thickness of 80 nm were formed on the substrate 1 in this order by sputtering with the method described below.

The first dielectric layer 102 was formed of $(ZnS)_{80}(SiO_2)_{20}$ (mol %). The first interface layer 3 was formed of $(ZrO_2)_{25}(SiO_2)_{25}(Ga_2O_3)_{50}$ (mol %). The recording layer 4 was formed in the same manner as in Example 3. Therefore, the composition was $Ge_{27}Sn_8Sb_{12}Te_{53}$ (atom %).

The second dielectric layer 6 was formed by performing high frequency sputtering with a sputtering target (diameter: 100 mm, thickness: 6 mm) of $(ZrO_2)_{25}(SiO_2)_{25}(Ga_2O_3)_{50}$ (mol %) in an Ar gas atmosphere with a pressure of 0.13 Pa.

The light-absorption correction layer 7 and the reflective layer 8 were formed in the same manner as those of the information recording medium 25 described in Example 3.

For comparison, a medium (comparative example 7-1) in which the first interface layer 3 and the second dielectric layer 6 were formed of $(ZrO_2)_{25}(SiO_2)_{25}(Cr_2O_3)_{50}$ (mol %) was produced as a comparative example.

The obtained samples were evaluated regarding the adhesion of the dielectric layer and the repeated rewriting performance. Table 11 shows the evaluation results. The method for evaluating the adhesion and the repeated rewriting performance is such as described above. However, in this example, the adhesion was evaluated by examining whether or not peeling between the recording layer 4 and the second dielectric layer 6 in contact therewith occurred.

TABLE 11

| Sample No. | adhesive peeling | groove rewriting performance number of repetitions | power (mW) Pp | power (mW) Pb | land rewriting performance number of repetitions | power (mW) Pp | power (mW) Pb |
|---|---|---|---|---|---|---|---|
| 7-1 | no | 100000 or more | 10.7 | 4.4 | 100000 or more | 11.1 | 4.8 |
| Com. Ex. 7-1 | no | 100000 or more | 13.2 | 6.0 | 100000 or more | 14.0 | 6.7 |

As shown in Table 11, the information recording medium 27 in which the first interface layer 3 and the second dielectric layer 6 are oxide-based material layers have excellent adhesion, repeated rewriting performance, peak power and bias power in groove recording and land recording. The recording sensitivity was improved by about 20% by using $(ZrO_2)_{25}(SiO_2)_{25}(Ga_2O_3)_{50}$ (mol %) than when $(ZrO_2)_{25}(SiO_2)_{25}(Cr_2O_3)_{50}$ (mol %) was used.

Example 8

In Example 8, an information recording medium (sample 8-1) in which the first interface layer 3 and the second interface layer 5 were oxide-based material layers in the information recording medium 28 shown in FIG. 4 corresponding to Embodiment 4 described above was produced. Hereinafter, a method for producing the information recording medium 28 will be described.

First, the same substrate as used in Example 3 was prepared as a substrate 1. A first dielectric layer 102 having a thickness of 150 nm, a first interface layer 3 having a thickness of 5 nm, a recording layer 4 having a thickness of 9 nm, a second interface layer 5 having a thickness of 3 nm, a second dielectric layer 106 having a thickness of 50 nm, a light-absorption correction layer 7 having a thickness of 40 nm, and a reflective layer 8 having a thickness of 80 nm were formed on the substrate 1 in this order by sputtering.

The first dielectric layer 102 was formed of $(ZnS)_{80}(SiO_2)_{20}$ (mol %). The second dielectric layer 106 was formed in the same manner.

In the step of forming the first interface layer 3, a sputtering target (diameter: 100 mm, thickness: 6 mm) of $(ZrO_2)_{25}(SiO_2)_{25}(Ga_2O_3)_{50}$ (mol %) was provided in a film-formation apparatus, and high frequency sputtering was performed in an Ar gas atmosphere with a pressure of 0.13 Pa. The power was 400 W. The second interface layer 5 was formed in the same manner.

The recording layer 4 was formed in the same manner as in Example 3. Therefore, the composition thereof was $Ge_{27}Sn_8Sb_{12}Te_{53}$ (atom %). The light-absorption correction layer 7 was formed of $Ge_{80}Cr_{20}$ (atom %) in the same manner as in Example 3. The reflective layer 8 was formed of an Ag—Pd—Cu alloy in the same manner as in Example 3.

As a comparative example, a medium (comparative example 8-1) in which the first interface layer 3 and the second interface layer 5 were formed of $(ZrO_2)_{25}(SiO_2)_{25}(Cr_2O_3)_{50}$ (mol %) was produced. The adhesion and the repeated rewriting performance of the obtained sample were evaluated. The adhesion was evaluated by investigating whether or not peeling occurred between the recording layer 4 and the interface layer in contact therewith, more specifically, at least one of the interface between the recording layer 4 and the first interface layer 3 and the interface between the recording layer 4 and the second interface layer 5. The repeated rewriting performance was evaluated by performing groove recording and land recording and obtaining the number of repetitions of the groove recording and the land recording according to the method described in Example 3. Table 12 shows the evaluation results.

TABLE 12

| Sample No. | adhesive peeling | groove rewriting performance number of repetitions | power (mW) Pp | power (mW) Pb | land rewriting performance number of repetitions | power (mW) Pp | power (mW) Pb |
|---|---|---|---|---|---|---|---|
| 8-1 | no | 100000 or more | 10.0 | 4.0 | 100000 or more | 10.3 | 4.3 |
| Com. Ex. 8-1 | no | 100000 or more | 10.8 | 4.8 | 100000 or more | 11.3 | 5.2 |

As shown in Table 12, it was confirmed that the performance of the sample 8-1 in which an oxide-based material layer was used as the interface layer had a lower Pp by about 1 mW than that of the comparative example 8-1, and even if it was used as an interface layer having a small thickness, the recording sensitivity was improved. In addition, the adhesion and the repeated rewriting performance were equal to or better than those of the comparative example 8-1.

The number of layers constituting the sample 8-1 is the same as in the conventional information recording medium. Therefore, the effect caused by reducing the number of the layers cannot be obtained. However, when using the oxide-based material layer for an interface layer, the interface layer can be formed, not by reactive sputtering, but by sputtering in an atmosphere with Ar gas alone. Therefore, easy and stable production can be maintained, and higher transparency than $(ZrO_2)_{25}(SiO_2)_{25}(Cr_2O_3)_{50}$ (mol %) material can be obtained, and the performance such as the recording sensitivity of the medium can be improved.

Furthermore, 14 media in which the first interface layer 3 and the second interface layer 5 were formed of the oxide-based material layer expressed by formula (7), (8), (11) or (12) were produced (media 8-11 to 8-24), and evaluated in the same manner as for the medium 8-1. Table 13 shows the oxide-based materials used and the evaluation results. Furthermore, as comparative examples 8-2 to 8-5, media in which the first interface layer 3 and the second interface layer 5 were formed of the oxide-based material layer that does not contain E2 of the materials expressed by formula (7), (8), (11) or (12) were produced, and evaluated in the same manner.

TABLE 13

| Sample No. | materials of first interface layer and second interface layer (mol %) | atom % conversion per element | adhesive peeling |
|---|---|---|---|
| 8-11 | $(ZrO_2)_{40}(SiC)_{40}(La_2O_3)_{20}$ | $Zr_{13.3}Si_{13.3}La_{13.3}C_{13.3}O_{46.8}$ | no |
| 8-12 | $(ZrO_2)_{10}(SiC)_{10}(Ga_2O_3)_{80}$ | $Zr_{2.2}Si_{2.2}Ga_{35.6}C_{2.2}O_{57.8}$ | no |
| 8-13 | $(ZrO_2)_{48}(SiC)_{48}(In_2O_3)_4$ | $Zr_{18.5}Si_{18.5}In_{3.1}C_{18.5}O_{41.4}$ | no |
| 8-14 | $(ZrO_2)_{25}(SiO_2)_{25}(Cr_2O_3)_{25}(Ga_2O_3)_{25}$ | $Zr_{6.3}Si_{6.3}Ga_{12.5}Cr_{12.5}O_{62.4}$ | no |
| 8-15 | $(ZrO_2)_{20}(SiO_2)_{30}(S_3N_4)_{40}(Ga_2O_3)_{10}$ | $Zr_{4.2}Si_{31.2}Ga_{4.2}N_{33.3}O_{27.1}$ | no |
| 8-16 | $(ZrO_2)_{40}(SiO_2)_{10}(SiC)_{10}(Ga_2O_3)_{40}$ | $Zr_{10.8}Si_{5.4}Ga_{21.6}C_{2.7}O_{59.5}$ | no |
| 8-17 | $(HfO_2)_{10}(Cr_2O_3)_{10}(MgO)_{80}$ | $Hf_{4.2}Mg_{33.3}Cr_{8.3}O_{54.2}$ | no |
| 8-18 | $(HfO_2)_{25}(Cr_2O_3)_{25}(CeO_2)_{50}$ | $Hf_{7.1}Ce_{14.3}Cr_{14.3}O_{64.3}$ | no |
| 8-19 | $(HfO_2)_{40}(Cr_2O_3)_{20}(Ga_2O_3)_{40}$ | $Hf_{9.5}Ga_{19.0}Cr_{9.5}O_{62.0}$ | no |
| 8-20 | $(HfO_2)_{20}(SiO_2)_{10}(Cr_2O_3)_{10}(In_2O_3)_{60}$ | $Hf_{4.5}Si_{2.3}In_{27.3}Cr_{4.5}O_{61.4}$ | no |
| 8-21 | $(HfO_2)_{20}(SiO_2)_{50}(S_3N_4)_{15}(In_2O_3)_{15}$ | $Hf_{5.1}Si_{24.4}In_{7.7}N_{15.4}O_{47.4}$ | no |
| 8-22 | $(HfO_2)_{80}(SiO_2)_2(SiC)_3(In_2O_3)_{15}$ | $Hf_{24.5}Si_{1.5}In_{9.2}C_{0.9}O_{63.9}$ | no |
| 8-23 | $(ZrO_2)_{25}(Cr_2O_3)_{25}(SiC)_{25}(Ga_2O_3)_{25}$ | $Zr_{6.7}Si_{6.7}Ga_{13.3}Cr_{13.3}C_{6.7}O_{53.3}$ | no |
| 8-24 | $(ZrO_2)_{25}(Cr_2O_3)_{25}(S_3N_4)_{25}(MgO)_{25}$ | $Zr_{5.9}Si_{17.6}Mg_{5.9}Cr_{11.8}N_{23.5}O_{35.3}$ | no |
| Com. Ex. 8-2 | $(ZrO_2)_{50}(SiC)_{50}$ | | no |
| Com. Ex. 8-3 | $(ZrO_2)_{25}(SiO_2)_{25}(S_3N_4)_{50}$ | | occurred |
| Com. Ex. 8-4 | $(HfO_2)_{50}(Cr_2O_3)_{50}$ | | no |
| Com. Ex. 8-5 | $(HfO_2)_{40}(SiO_2)_{40}(SiC)_{20}$ | | occurred |

| Sample No. | groove rewriting performance number of repetitions | power (mW) Pp | power (mW) Pb | land rewriting performance number of repetitions | power (mW) Pp | power (mW) Pb | judgement |
|---|---|---|---|---|---|---|---|
| 8-11 | 100000 or more | 12.0 | 5.5 | 100000 | 12.5 | 5.8 | ○ |
| 8-12 | 100000 or more | 10.5 | 4.3 | 100000 | 11.0 | 4.6 | ○ |
| 8-13 | 100000 or more | 11.0 | 5.0 | 100000 | 11.5 | 5.0 | ○ |
| 8-14 | 100000 or more | 11.0 | 5.4 | 100000 | 11.5 | 5.6 | ○ |
| 8-15 | 100000 or more | 10.5 | 4.6 | 100000 | 11.0 | 4.9 | ○ |

TABLE 13-continued

| | | | | | | | |
|---|---|---|---|---|---|---|---|
| 8-16 | 100000 or more | 11.0 | 5.1 | 100000 | 11.5 | 5.2 | ○ |
| 8-17 | 100000 or more | 13.0 | 6.0 | 100000 | 13.5 | 6.3 | ○ |
| 8-18 | 100000 or more | 12.0 | 5.2 | 100000 | 12.5 | 5.4 | ○ |
| 8-19 | 100000 or more | 11.0 | 5.0 | 100000 | 11.5 | 5.2 | ○ |
| 8-20 | 100000 or more | 12.5 | 6.0 | 100000 | 13.0 | 6.2 | ○ |
| 8-21 | 100000 or more | 11.5 | 5.3 | 100000 | 12.0 | 5.5 | ○ |
| 8-22 | 100000 or more | 12.0 | 5.8 | 100000 | 12.5 | 6.1 | ○ |
| 8-23 | 100000 or more | 10.8 | 4.7 | 100000 | 11.2 | 5.1 | ○ |
| 8-24 | 100000 or more | 10.5 | 4.5 | 100000 | 10.9 | 4.9 | ○ |
| Com. Ex. 8-2 | 100000 or more | 14.0 | 6.5 | 100000 | 14 or more | 7.0 | X |
| Com. Ex. 8-3 | 50000 | 10.5 | 4.8 | 30000 | 10.8 | 5.0 | X |
| Com. Ex. 8-4 | 2000 | 15 or more | 7.5 or more | 1000 | 15 or more | 7.5 or more | X |
| Com. Ex. 8-5 | 100000 or more | 11.0 | 5.0 | 100000 | 11.3 | 5.1 | X |

As shown in Table 13, when the oxide-based material layer expressed by either one of the materials expressed by formula (7) was used as the interface layer, the recording sensitivity was good, and the adhesion and the repeated rewriting performance were equal to or more than those of the comparative example.

Example 9

In Example 9, oxide-based material layers containing $ZrO_2$ and either one of $La_2O_3$, $CeO_2$, $Al_2O_3$, $In_2O_3$, MgO and $Y_2O_3$ were investigated in the same manner as in Examples 6, 7, and 8. Then, good adhesion and repeated rewriting performance were obtained, and the recording sensitivity also was good.

Example 10

In Example 10, oxide-based material layers containing $HfO_2$ and either one of $La_2O_3$, $CeO_2$, $Al_2O_3$, $Ga_2O_3$, $In_2O_3$, MgO and $Y_2O_3$ were investigated in the same manner as in Examples 6, 7, and 8. Then, good adhesion and repeated rewriting performance were obtained, and the recording sensitivity also was good.

As described above, the oxide-based material layer can be used as the dielectric layers or the interface layers having the structure of the information recording medium 25 shown in FIG. 1, having the structure of the information recording medium 26 shown in FIG. 2, having the structure of the information recording medium 27 shown in FIG. 3, and having the structure of the information recording medium 28 shown in FIG. 4. In this case, the recording sensitivity can be improved without deteriorating the adhesion and the repeated rewriting performance, compared with the case when the conventional $(ZrO_2)_{25}(SiO_2)_{25}(Cr_2O_3)_{50}$ (mol %) is used. Furthermore, when the oxide-based material layer is used as at least the first dielectric layer 2 or the second dielectric layer 6, it is possible to reduce the number of the layers from 7 to 6 or 5, compared with the structure of information recording medium 31 shown in FIG. 12. The films can be formed in a higher speed under more optimal conditions, because the films do not have to be formed by reactive film-formation, and the dependency of film quality on the apparatus is small. Therefore, using the oxide-based material layer for the dielectric layers or the interface layers can provide an advantage that the mass production starting process of information recording media can proceed more rapidly.

Example 11

In Example 11, an information recording medium (sample 11-1) in which the first and second dielectric layers 2 and 6 were oxide-based material layers in the information recording medium 29 shown in FIG. 5 corresponding to Embodiment 5 described above was produced. Hereinafter, a method for producing the information recording medium 29 will be described.

First, a round polycarbonate substrate having a diameter of 120 mm and a thickness of 1.1 mm that previously is provided with guide grooves having a depth of 21 nm and a track pitch (distance between the centers of the groove surface and the groove surface in a plane parallel to the main plane of the substrate) of 0.32 μm on one surface was prepared as a substrate 101.

A reflective layer 8 having a thickness of 80 nm, a second dielectric layer 6 having a thickness of 16 nm, a recording layer 4 having a thickness of 10 nm, and a first dielectric layer 2 having a thickness of 68 nm were formed on the substrate 101 in this order by sputtering with the following method.

The reflective layer 8 was formed in the same manner as in Example 1. In the step of forming the second dielectric layer 6, a sputtering target (diameter: 100 mm, thickness: 6 mm) made of $(ZrO_2)_{35}(SiO_2)_{35}(Ga_2O_3)_{30}$ (mol %) was provided in a film-formation apparatus, and high frequency sputtering was performed in an Ar gas atmosphere with a pressure of 0.13 Pa. The power was 400 W. The first dielectric layer 2 was formed in the same manner.

In the step of forming the recording layer 4, a sputtering target (diameter: 100 mm, thickness: 6 mm) made of a Ge—Bi—Te material was provided in a film-formation apparatus, and DC sputtering was performed. The power was 100 W. During sputtering, a mixed gas of Ar gas (97%) and $N_2$ gas (3%) was introduced. The pressure during sputtering was 0.13 Pa. The composition of the recording layer 4 was $Ge_{45}Bi_4Te_{51}$.

After the first dielectric layer 2 was formed, UV curable resin was applied onto the first dielectric layer 2. A round polycarbonate substrate having a diameter of 120 mm and a thickness of 90 μm was attached tightly onto the applied UV curable resin as a dummy substrate 110. Then, irradiation of ultraviolet rays was performed from the side of the dummy substrate 110 to cure the resin. Thus, the adhesive layer 9 made of the cured resin was formed in a thickness of 10 μm, and the dummy substrate 110 was attached onto the first dielectric layer 2 via the adhesive layer 9 at the same time.

After the dummy substrate 110 was attached, the initialization step was performed using a semiconductor laser having a wavelength of 670 nm. In the initialization step, the substantially entire recording layer 4 positioned in a circular region in a 22 to 60 mm range of the radius of the information recording medium 29 was crystallized. The production of the information recording medium 29 (sample 11-1) was finished with the end of the initialization. The Rc obtained by actual measurement of the produced information recording medium 29 (in the plane portion without concavities and convexities) was 20%, and the Ra obtained by actual measurement was 2%.

As a comparative example, a medium sample (comparative example 11-1) in which the first dielectric layer 2 and the second dielectric layer 6 were formed of $(ZrO_2)_{35}(SiO_2)_{35}(Cr_2O_3)_{30}$ (mol %) and other materials were the same as those of the information recording medium 29 was produced.

The adhesion and the repeated rewriting performance were evaluated, regarding the obtained samples. Table 14 shows the evaluation results. The adhesion was evaluated in the same manner as described in Example 1. The repeated rewriting performance was evaluated by a different method from that used in Example 1. The method will be described below.

The repeated rewriting performance of the information recording medium 29 was evaluated with an information recording system having the same structure as that used in Example 1. For evaluation of the information recording medium 29, recording corresponding to a capacity of 25 GB was performed using a semiconductor laser with a wavelength of 405 nm and an objective lens having a numerical aperture of 0.85. The linear velocity at which the information recording medium 29 was rotated was 4.92 m/sec (data transfer rate: 36 Mbps) and 9.84 m/sec (72 Mbps). A time interval analyzer was used to measure the jitter value to obtain the average jitter value (the average value of the jitter between the front ends and the jitter between the rear ends).

First, a peak power (Pp) and a bias power (Pb) were set in the following procedure in order to determine the measurement conditions for determining the number of repetitions. The information recording medium 29 was irradiated with the laser light 12 while changing the power between a peak power (mW) in a high power level and a bias power (mW) in a low power level, and a 2T signal having a mark length of 0.149 μm was recoded ten times on the same groove surface of the recording layer 4. After random signals from 2T to 8T were recorded 10 times, the average jitter value was measured. During 10 times of recording of the random signals, the bias power was fixed to a predetermined value, and the average jitter value was measured with respect to each recording condition in which the peak power was changed variously. Then, the peak power in which the average jitter value was a minimum was set as Pp1. The peak power was fixed to Pp1 and the average jitter value was measured with respect to each recording condition in which the bias power was changed variously, and the bias power in which the average jitter value was a minimum was set as Pb. The bias power was fixed to Pb again, and the average jitter value was measured with respect to each recording condition in which the peak power was changed variously. Then, the peak power in which the average jitter value was a minimum was set as Pp. It is preferable that the obtained Pp and Pb satisfy 5.2 mW or less in 36 Mbps, if the specification is taken into consideration. It is preferable that the obtained Pp and Pb satisfy 6 mW or less in 72 Mbps, if the balance with the system is taken into consideration.

The number of repetitions was determined based on the average jitter value in this example. The information recording medium 29 was irradiated with the laser light 12 while changing the power between Pp and Pb set as above, and a random signal was recoded repeatedly and continuously in the predetermined number of times on the same groove surface. Then, the average jitter value was measured. The average jitter value was measured when the number of repetitions is 1, 2, 3, 5, 10, 100, 200, 500, 1000, 2000, 3000, 5000, 7000 and 10000. The time when the average jitter value was increased by 3%, based on the average jitter value when recording was repeated 10 times, was determined to be the limit for repeated rewriting, and the repeated rewriting performance is evaluated by the number of repetitions at this point. The repeated rewriting performance was evaluated to be higher as the number of repetition is larger. It is preferable that the number of repetitions of the information recording medium 29 is 10000 or more.

TABLE 14

| Sample No. | peeling | 36 Mbps | | | 72 Mbps | | |
| | | rewriting performance number of repetitions | power (mW) Pp | Pb | rewriting performance number of repetitions | power (mW) Pp | Pb |
| --- | --- | --- | --- | --- | --- | --- | --- |
| 11-1 | no | 10000 or more | 5.0 | 2.3 | 10000 or more | 5.5 | 2.5 |
| Com. Ex. 11-1 | no | 10000 or more | 5.6 | 2.6 | 10000 or more | 7.0 | 2.8 |

The information recording medium 29 of the sample 11-1 of this example is different in the film formation order of the layers on the substrate, the recording conditions (the laser wavelength and the numerical aperture of the lens) and recording capacity from the information recording medium 25 shown in FIG. 1. The recording capacity of the sample 11-1 has five times as much as the information recording medium 25 shown in FIG. 1. However, regardless of these differences, as shown in Table 14, the recording sensitivity that satisfies the specification with 25 GB capacity was obtained by using oxide-based material layers of $(ZrO_2)_{35}(SiO_2)_{35}(Ga_2O_3)_{30}$ (mol %) for the first dielectric layer 2 and the second dielectric layer 6. In the comparative example, the recording sensitivity was not satisfactory.

In the structure of the information recording medium 29, even if only the first dielectric layer 2 or the second dielectric layer 6 is an oxide-based material layer, the same results were obtained. That is, at least one of the interface layers that are necessary when $(ZnS)_{80}(SiO_2)_{20}$ (mol %) is used can be reduced, and the same performance can be obtained. The oxide-based material layer used in the present invention is free of S (sulfur), and therefore even if the oxide-based material layer is in contact with the reflective layer 8 containing Ag at its interface, atomic diffusion does not occur. Thus, a four layer structure is possible. A layer for regulating absorption or reflection of light in the recording layer can be formed, if necessary, between the reflective layer 8 and the second dielectric layer 6. Such a layer can be formed of one or two or more materials selected from the group consisting of metals, non-metals, semi-metals, semiconductors and dielectrics and these compounds. Preferably, such a layer has a refractive index of 4 or less and an extinction coefficient of 4 or less with respect to light in the vicinity of a wavelength of 405 nm.

Example 12

In Example 12, an information recording medium (sample 12-1) in which the fifth dielectric layers 19, the fourth dielectric layer 17, the second dielectric layer 6, and the first dielectric layer 2 were oxide-based material layers in the information recording medium 30 shown in FIG. 6 corresponding to Embodiment 6 described above was produced. Hereinafter, a method for producing the information recording medium 30 will be described.

First, the same substrate as the substrate 101 used in Example 11 was prepared as a substrate 101. A second reflective layer 20 having a thickness of 80 nm, a fifth dielectric layer 19 having a thickness of 16 nm, a second recording layer 18 having a thickness of 10 nm, and a fourth dielectric layer 17 having a thickness of 68 nm were formed on the substrate 101 in this order by sputtering, and thus a second information layer 22 was formed.

The second reflective layer 20 was formed of Ag—Pd—Cu alloy in the same manner as in Example 1. In the step of forming the fifth dielectric layer 19, a sputtering target (diameter: 100 mm, thickness: 6 mm) made of $(ZrO_2)_{35}(SiO_2)_{35}(Ga_2O_3)_{30}$ (mol %) was provided in a film-formation apparatus, and high frequency sputtering was performed in an Ar gas atmosphere with a pressure of 0.13 Pa. The power was 400 W. The fourth dielectric layer 17 was formed in the same manner. The second recording layer 18 was formed using a sputtering target made of a Ge—Bi—Te material in the same manner as in Example 11.

Next, an intermediate layer 16 having a thickness of 25 μm that is provided with grooves was formed. The intermediate layer 16 was formed in the following manner. First, UV curable resin was applied by spin-coating. A polycarbonate substrate having a surface that has concavities and convexities was provided on the applied UV curable resin with its surface attached thereto. The concavities and convexities have a shape complementary to the guide grooves to be formed in the intermediate layer 16. Thereafter, the resin is irradiated with ultraviolet rays from the side of the polycarbonate substrate to be cured, and then the polycarbonate substrate was detached from the intermediate layer 16. Thus, the intermediate layer 16 made of cured UV curable resin, in which the guide grooves had been formed by transfer, was obtained.

After the intermediate layer 16 was formed, the initialization step of the second information layer 22 was performed. In the initialization step, using a semiconductor laser having a wavelength of 670 nm, the substantially entire second recording layer 18 positioned in a circular region in a 22 to 60 mm range of the radius was crystallized.

Next, a third dielectric layer 15 having a thickness of 15 nm, a first reflective layer 14 having a thickness of 10 nm, a second dielectric layer 6 having a thickness of 12 nm, a first recording layer 13 having a thickness of 6 nm, and a first dielectric layer 2 having a thickness of 45 nm were formed on the intermediate layer 16 in this order by sputtering, and thus a first information layer 21 was formed.

In the step of forming the third dielectric layer 15, using a sputtering target (diameter: 100 mm, thickness: 6 mm) made of $TiO_2$ material, high frequency sputtering was performed at a pressure of about 0.13 Pa. The power was 400 W. During the sputtering, a mixed gas of Ar gas (97%) and $O_2$ gas (3%) was introduced.

The first reflective layer 14 was formed in the same manner as the second reflective layer 20 and formed as a layer made of Ag—Pd—Cu alloy. The second dielectric layer 6 and the first dielectric layer 2 were formed of $(ZrO_2)_{56}(SiO_2)_{14}(Ga_2O_3)_{30}$ (mol %).

In the step of forming the first recording layer 13, a sputtering target (diameter: 100 mm, thickness: 6 mm) made of a Ge—Sn—Bi—Te material was provided in a film-formation apparatus, and DC sputtering was performed in at a pressure of 0.13 Pa. The power was 50 W. During the sputtering, Ar gas (100%) was introduced. The pressure during the sputtering was about 0.13 Pa. The composition of the recording layer was $Ge_{40}Sn_5Bi_4Te_{51}$ (atom %).

After the first dielectric layer 2 was formed, UV curable resin was applied onto the first dielectric layer 2. A round polycarbonate substrate having a diameter of 120 mm and a thickness of 65 μm was attached tightly onto the applied UV curable resin as a dummy substrate 110. Then, irradiation of ultraviolet rays was performed from the side of the dummy substrate 110 to cure the resin. Thus, the adhesive layer 9 made of the cured resin was formed in a thickness of 10 μm, and the dummy substrate 110 was attached onto the first dielectric layer 2 via the adhesive layer at the same time.

After the dummy substrate 110 was attached, the initialization step of the first information layer 21 was performed using a semiconductor laser having a wavelength of 670 nm. In the initialization step, the substantially entire first recording layer 13 positioned in a circular region in a 22 to 60 mm range of the radius was crystallized. The production of the information recording medium 30 (sample 12-1) was finished with the end of the initialization.

Regarding each of the first information layer 21 and the second information layer 22 of the sample 12-1, the adhesion of the dielectric layer and the repeated rewriting performance of the information recording medium were evaluated. Table 15 shows these results together with the peak power (Pp) and the bias power (Pb) obtained when the repeated rewriting performance was evaluated.

In this example, the adhesion of the dielectric layer was evaluated under the same conditions as in Example 1 by investigating whether or not peeling occurred with respect to each of the first information layer 21 and the second information layer 22. The repeated rewriting performance of the information recording medium 30 was evaluated under the same conditions as in Example 11 by recording information corresponding to 25 GB capacity on each of the first information layer 21 and the second information layer 22 and investigating the number of repetitions with respect to each of the first information layer 21 and the second information layer 22. When recording on the first information layer 21, the laser light 12 was focused on the first recording layer 13, and when recording on the second information layer 22, the laser light 12 was focused on the second recording layer 18. Taking the specification and the balance of the system into consideration, it is preferable that in 36 Mbps, Pp≦10.4 mW is satisfied in the first information layer 21.

TABLE 15

| | | first information layer | | | second information layer | | |
|---|---|---|---|---|---|---|---|
| data transfer rate (Mbps) | adhesive peeling | rewriting performance number of repetitions | Pp (mW) | jitter (%) | rewriting performance number of repetitions | Pp (mW) | jitter (%) |
| 36 | no | 100000 or more | 9.8 | 8.4 | 100000 or more | 10.0 | 6.4 |
| 72 | | 100000 or more | 10.3 | 8.3 | 100000 or more | 10.6 | 6.5 |

The information recording medium 30 of the sample 12-1 of this example is different from the information recording medium 25 shown in FIG. 1 in the film formation order of the layers on the substrate, the number of the information layers (i.e., recording layers), which is 2, and the recording conditions (the laser wavelength and the numerical aperture of the lens). The recording capacity of the sample 12-1 has ten times as much as the information recording medium 25 shown in FIG. 1. However, regardless of these differences, it was confirmed that the an information recording medium having good performance was obtained without providing an interface layer by using a layer made of a mixture of $ZrO_2$, $SiO_2$ and $Ga_2O_3$ as the first, the second, the fourth and the fifth dielectric layers, 2, 6, 17, and 19. The designed value of Rc of the first information layer 21 of the produced information recording medium 30 (in the plane portion without concavities and convexities) was 6%, and the designed value of Ra was 0.7%. The designed value of Rc of the second information layer 22 was 25%, and the designed value of Ra was 3%.

In this example, all of the first, the second, the fourth and the fifth dielectric layers, 2, 6, 17 and 19 constituting the information recording medium 30 are oxide-based material layers, but the present invention is not limited thereto. In a variation example, in the information recording medium of the present invention, at least one of these four dielectric layers is an oxide-based material layer, and the other dielectric layers can be made of $(ZnS)_{80}(SiO_2)_{20}$ (mol %). In this case, it is necessary to form an interface layer between the dielectric layer made of $(ZnS)_{80}(SiO_2)_{20}$ (mol %) and the recording layer. Also in such a variation example of the information recording medium, the object of reducing the number of the layers can be achieved and good performance can be obtained, as in the sample 12-1 above.

In this example, all of the first, the second, the fourth and the fifth dielectric layers, 2, 6, 17 and 19 are oxide-based material layers having the same composition, but the present invention is not limited thereto. In a modified example, an information recording medium 30 in which these four dielectric layers have different compositions may be produced. Such an information recording medium also exhibits good performance as in the sample 12-1 above.

Example 13

In Example 13, the performance of an information recording medium having an oxide-based material layer containing a third component other than the oxides of the essential elements (e.g., an oxide of Zr and an oxide of the element L1 in the case of the oxide-based material layer (I); and an oxide of M1 and an oxide of the element L2 in the case of the oxide-based material layer (II); the same applies to the oxide-based material layers (III) and (IV)) was evaluated. In this example, the information recording medium 27 shown in FIG. 3 was produced in the same manner as in Example 7, except for the material of the second dielectric layer 6.

When forming the second dielectric layer 6, a sputtering target (diameter: 100 mm, thickness: 6 mm) made of $(ZrO_2)_{35}(SiO_2)_{25}(Ga_2O_3)_{40}$ (mol %) was provided in a film-formation apparatus, and sputtering chips of $Si_3N_4$, Ge, and C; each of which had a size of 10 mm×10 mm×1 mm were placed on the surface of the sputtering target. Using the sputtering target having this sputtering chip, high frequency sputtering was performed in an Ar gas atmosphere with a pressure of 0.13 Pa to form a second dielectric layer 6. The power was 400 W. When the formed layer was analyzed, 98 mol % of $(ZrO_2)_{35}(SiO_2)_{25}(Ga_2O_3)_{40}$ (mol %) were contained in the layer, and 1 mol % of $Si_3N_4$, 0.5 mol % of Ge, and 0.5 mol % of C were contained as third components.

For comparison, the second dielectric layer 6 made of $(ZrO_2)_{35}(SiO_2)_{25}(Ga_2O_3)_{40}$ (mol %) that contains no third components was produced (comparative example 13-1). The other materials were the same as those for the information recording medium 27 of this example. The adhesion of the second dielectric layer 6 of each sample was evaluated under the same conditions as in Example 1. Furthermore, the repeated rewriting performance of each sample was evaluated by performing groove recording and land recording on each sample and investigating the number of repetitions of the groove recording and the land recording according to the method described in Example 1. As a result, even with an oxide-based material layer containing 2 mol % of a third component, the performance that satisfies Pp≦14 mW was obtained. Table 16 shows the evaluation results.

TABLE 16

| | | groove | | | land | | |
|---|---|---|---|---|---|---|---|
| Sample No. | adhesive peeling | rewriting performance number of repetitions | power (mW) Pp | Pb | rewriting performance number of repetitions | power (mW) Pp | Pb |
| 13-1 | no | 100000 or more | 13.4 | 6.2 | 100000 or more | 13.8 | 6.7 |
| Com. Ex. 13-1 | no | 100000 or more | 13.0 | 6.0 | 100000 or more | 13.3 | 6.4 |

As shown in Table 16, the sample 13-1 exhibited the adhesion and the repeated rewriting performance comparable to the comparative sample. Although Pp and Pb of the sample 13-1 were higher than those of the comparative sample, Pp≦14 mW and Pb≦7 mW were satisfied, and thus the sample 13-1 sufficiently can be put in practical use. These results confirmed that when the dielectric layer contains an oxide of an element selected from the group GM and an oxide of an element selected from the group GL in a combined amount of 98 mol % or more, good adhesion, good rewriting performance and good recording sensitivity can be obtained.

Example 14

In Examples 1 to 13, information recording media on which information was recorded by optical means were produced. In Example 14, an information recording medium 207 on which information was to be recorded by electric means was produced, as shown in FIG. 9. This is a so-called memory.

The information recording medium 207 of this example was produced in the following manner. First, a Si substrate 201 having a length of 5 mm, a width of 5 mm and a thickness of 1 mm whose surface had been subjected to nitriding was prepared. A lower electrode 202 of Au was formed to a thickness of 0.1 µm in an area of 1.0 mm×1.0 mm on this substrate 201. A phase change portion 205 of $Ge_{38}Sb_{10}Te_{52}$ (expressed by $Ge_8Sb_2Te_{11}$ as a compound) was formed to a thickness of 0.1 µm in a circular area with a diameter of 0.2 mm on the lower electrode 202. An insulating portion 206 (a dielectric layer 206) of $(ZrO_2)_{15}(SiO_2)_{15}(Ga_2O_3)_{70}$ (mol %) was formed to the same thickness as the phase change portion 205 in an area of 0.6 mm×0.6 mm (except the phase change portion 205). Furthermore, an upper electrode 204 of Au was formed to a thickness of 0.1 µm in an area of 0.6 mm×0.6 mm. The lower electrode 202, the phase change portion 205, the insulating portion 206 and the upper electrode 204 were formed by sputtering.

In the step of forming the phase change portion 205, a sputtering target (diameter: 100 mm, thickness: 6 mm) made of a Ge—Sb—Te material was provided in a film-formation apparatus, and DC sputtering was performed at a power of 100 W with Ar gas introduced. The pressure during the sputtering was about 0.13 Pa. In the step of forming the insulating portion 206, a sputtering target (diameter: 100 mm, thickness: 6 mm) made of a material having a composition of $(ZrO_2)_{15}(SiO_2)_{15}(Ga_2O_3)_{70}$ (mol %) was provided in a film-formation apparatus, and high frequency sputtering was performed at a pressure of about 0.13 Pa. The power was 400 W. During the sputtering, Ar gas was introduced. The sputtering in these processes was performed with the areas other than the surface on which a film is to be formed covered with a masking tool so that the phase change portion 205 and the insulating portion 206 were not laminated each other. The order of forming the phase change portion 205 and the insulating portion 206 does not matter, and either can be formed first.

The phase change portion 205 and the insulating portion 206 constitute the recording portion 203. The phase change portion 205 corresponds to the recording layer in the present invention, and the insulating portion 206 corresponds to the oxide-based material layer in the present invention.

The lower electrode 202 and the upper electrode 204 can be formed by sputtering that is generally used in the field of the electrode forming, so that the process of forming these films is not described in detail.

Figure 10:
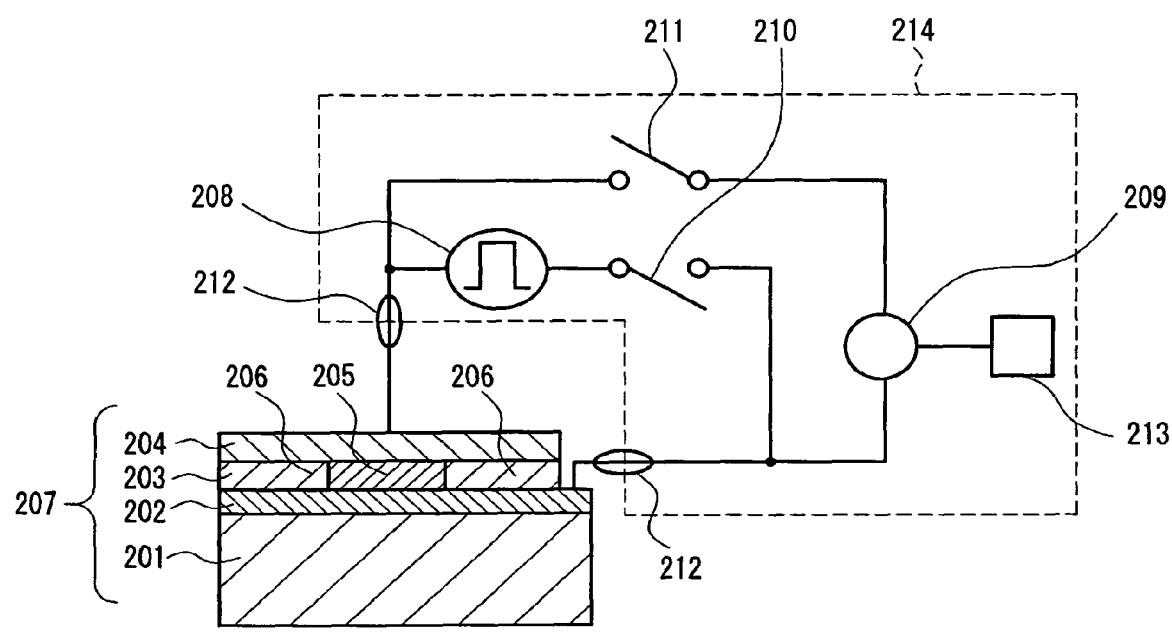
FIG. 10 is a schematic view showing an example of a system using the information recording medium shown in FIG. 9.

It was confirmed by a system shown in FIG. 10 that a phase change is caused in the phase change portion 205 by applying electric energy to the information recording medium 207 produced in the above-described manner. The cross-sectional view of the information recording medium 207 shown in FIG. 10 shows the cross-section taken in the thickness direction along line A-B of the information recording medium 207 shown in FIG. 9.

More specifically, as shown in FIG. 10, by bonding two applying portions 212 to the lower electrode 202 and the upper electrode 204, respectively, with Au lead wires, an electric write/read-out device 214 is connected to the information recording medium (memory) 207 via the applying portions 212. In this electric write/read-out device 214, a pulse generating portion 208 is connected between the applying portions 212 each connected to the lower electrode 202 and the upper electrode 204 via a switch 210, and a resistance measuring device 209 is connected therebetween via a switch 211. The resistance measuring device 209 is connected to a determining portion 213 that determines whether a resistance value measured by the resistance measuring device 209 is high or low. A current pulse is allowed to flow between the upper electrode 204 and the lower electrode 202 via the applying portion 212 by the pulse generating portion 208, and the resistance value between the lower electrode 202 and the upper electrode 204 is measured by the resistance measuring device 209. Then, the determining portion 213 determines whether this resistance value is high or low. In general, since the resistance value is changed by phase change of the phase change portion 205, the phase state of the phase change portion 205 can be known based on the determination results.

In the case of this example, the melting point of the phase change portion 205 was 630° C., the crystallization temperature was 170° C., and the crystallization time was 130 ns. The resistance value between the lower electrode 202 and the upper electrode 204 was 1000Ω when the phase change portion 205 was in the amorphous phase state and was 20Ω when the phase change portion 205 was in the crystalline phase state. When the phase change portion 205 was in the amorphous phase state (i.e., the state of high resistance) and a current pulse of 20 mA and 150 ns was applied between the lower electrode 202 and the upper electrode 204, the resistance value between the lower electrode 202 and the upper electrode 204 was reduced, and the phase change portion 205 was changed from the amorphous phase state to the crystalline phase state. Next, when the phase change portion 205 was in the crystalline phase state (i.e., the state of low resistance) and a current pulse of 200 mA and 100 ns was applied between the lower electrode 202 and the upper electrode 204, the resistance value between the lower electrode 202 and the upper electrode 204 was increased, and the phase change portion 205 was changed from the crystalline phase state to the amorphous phase state.

The results obtained above confirmed that a phase change is caused in the phase change portion (recording layer) by using a layer containing a material having a composition of $(ZrO_2)_{15}(SiO_2)_{15}(Ga_2O_3)_{70}$ (mol %) as the insulating portion 206 surrounding the phase change portion 205 and applying electric energy, and thus the information recording medium 207 serves to record information.

As in this example, when the insulating portion 206 of $(ZrO_2)_{15}(SiO_2)_{15}(Ga_2O_3)_{70}$ (mol %) that is a dielectric is provided around the cylindrical phase change portion 205, current flowing through the phase change portion 205 by applying a voltage between the upper electrode 204 and the lower electrode 202 is prevented effectively from escaping to the surrounding portion. As a result, the temperature of the phase change portion 205 can be increased efficiently by the Joule heat generated by current. In particular, to change the phase change portion 205 to the amorphous phase state, it is necessary to melt $Ge_{38}Sb_{10}Te_{52}$ of the phase change portion 205 and then cool it rapidly. The phase change portion 205 can be melted with a smaller current by providing the insulating portion 206 around the phase change portion 205.

The $(ZrO_2)_{15}(SiO_2)_{15}(Ga_2O_3)_{70}$ (mol %) of the insulating portion 206 has a high melting point, and atomic diffusion due to heat hardly occurs, and therefore this can be applied to an electric memory such as the information recording medium 207. Furthermore, when the insulating portion 206 is present around the phase change portion 205, the insulating portion 206 serves as a barrier so that the phase change portion 205 is substantially isolated electrically and thermally in the plane of the recording portion 203. Utilizing this, it is possible to increase the memory capacity of the information recording medium 207 and to improve the access function and the switching function by providing a plurality of phase change portions 205 that are isolated each other by the insulating portion 206. Alternatively, a plurality of information recording media 207 can be coupled.

Although $(ZrO_2)_{15}(SiO_2)_{15}(Ga_2O_3)_{70}$ (mol %) was used for example, the same results were obtained with oxide-based material layers containing $ZrO_2$ as D, and $La_2O_3$, $CeO_2$, $Al_2O_3$, $In_2O_3$, $MgO$ and $Y_2O_3$ as E. Furthermore, the same results were obtained with oxide-based material layers containing $HfO_2$ as D, and $La_2O_3$, $CeO_2$, $Al_2O_3$, $Ga_2O_3$, $In_2O_3$, $MgO$, and $Y_2O_3$ as E. As described with respect to the information recording media of the present invention through the various examples, the oxide-based material layer can be used for both the information recording medium for recording with optical means and the information recording medium for recording with electric means. The information recording medium of the present invention containing the oxide-based material layer can achieve the structure that has not been achieved and/or provides better performance than that of the conventional information recording medium.

The information recording medium of the present invention and the method for producing are useful for DVD-RAM disk, DVD-RW (Digital Versatile Disk-Recordable) disk, DVD+RW (Digital Versatile Disk+Rewritable) disk, DVD-R (Digital Versatile Disk-Recordable) disk, Blu-ray Disc or the like as a large capacity optical information recording medium having an excellent dielectric material. Furthermore, the present invention can be applied to a magneto-optical disk. In addition, the present invention can be useful as an electric switching element as an electric information recording medium. In any case, the present invention can be applied regardless of rewritable or write once type, and can be used as an information recording medium containing a read-only medium.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for producing an information recording medium containing an oxide-based material layer containing Zr, at least one element selected from the group GL1 consisting of La, Ga and In, and oxygen (O), comprising:
   forming the oxide-based material layer by sputtering using a sputtering target containing Zr, at least one element selected from the group GL1 and oxygen (O); and forming a recording layer,
   wherein the sputtering target contains a material having a composition expressed by:

$Zr_{q1}L1_{t1}O_{100-q1-t1}$ (atom %)

where L1 is at least one element selected from the group GL1, and q1 and t1 satisfy $0<q1<34$, $0<t1<50$, and $20<q1+t1<60$.

2. The method for producing an information recording medium according to claim 1, wherein L1 is Ga.

3. The method for producing an information recording medium according to claim 1,
   wherein the sputtering target contains a material that can be expressed by:

$(D1)_{x1}(E1)_{100-x1}$ (mol %)

where D1 is an oxide of Zr, E1 is an oxide of at least one element selected from the group GL1, and x1 satisfies $0<x1<100$.

4. The method for producing an information recording medium according to claim 3, wherein D1 is $ZrO_2$, and E1 is $Ga_2O_3$.

5. A method for producing an information recording medium containing an oxide-based material layer containing M1 (where M1 is a mixture of Zr and Hf, or Hf), at least one element selected from the group GL3 consisting of La, Ga, Mg and Y, and oxygen (O), comprising:
   forming the oxide-based material layer by sputtering using a sputtering target containing the M1, at least one element selected from the group GL3 and oxygen (O); and forming a recording layer,
   wherein the sputtering target contains a material having a composition expressed by:

$M1_{q2}L3_{t2}O_{100-q2-t2}$ (atom %)

where L3 is at least one element selected from the group GL3, and q2 and t2 satisfy $0<q2<34$, $0<t2<50$, and $20<q2+t2<60$.

6. The method for producing an information recording medium according to claim 5, wherein L3 is Ga.

7. The method for producing an information recording medium according to claim 5, wherein the sputtering target contains a material that can be expressed by:

$(D2)_{x2}(E3)_{100-x2}$ (mol %)

where D2 is an oxide of M1, E3 is an oxide of at least one element selected from the group GL3, and x2 satisfies $0<x2<100$.

8. The method for producing an information recording medium according to claim 7, wherein E3 is $Ga_2O_3$.

9. A method for producing an information recording medium containing an oxide-based material layer containing Zr, at least one element selected from the group GL2 consisting of La, Ce, Al, Ga, In, Mg and Y, Si, and oxygen (O), comprising:
   forming the oxide-based material layer by sputtering using a sputtering target containing Zr, at least one element selected from the group GL2, Si and oxygen (O); and forming a recording layer,
   wherein the sputtering target contains a material having a composition expressed by:

$Zr_{q3}Si_{r1}L2_{t3}O_{100-q3-r1-t3}$ (atom %)

where L2 is at least one element selected from the group GL2, and q3, r1 and t3 satisfy $0<q3\leq32$, $0<r1\leq32$, $3<t3<43$, and $20<q3+r1+t3<60$.

10. The method for producing an information recording medium according to claim 9, wherein L2 is Ga.

11. The method for producing an information recording medium according to claim 9,
wherein the sputtering target contains a material that can be expressed by:

$$(ZrO_2)_{x3}(g)_{z1}(E2)_{100-x3-z1} \text{(mol \%)}$$

where g is at least one compound selected from the group consisting of $SiO_2$, $Si_3N_4$ and SiC, E2 is an oxide of at least one element selected from the group GL2, and x3 and z1 satisfy $10 \leq x3 < 90$, $0 < z1 \leq 50$, and $10 < x3+z1 \leq 90$.

12. The method for producing an information recording medium according to claim 11, wherein E2 is $Ga_2O_3$.

13. The method for producing an information recording medium according to claim 9,
wherein the sputtering target further contains at least one element selected from the group GK1 consisting of carbon (C), nitrogen (N) and Cr.

14. The method for producing an information recording medium according to claim 13,
wherein the sputtering target contains a material having a composition expressed by:

$$Zr_{q3}Si_{r1}L2_{t3}K1_{j1}O_{100-q3-r1-t3-j1} \text{(atom \%)}$$

where L2 is at least one element selected from the group GL2, K1 is at least one element selected from the group GK1, and q3, r1, t3 and j1 satisfy $0 < q3 \leq 32$, $0 < r1 \leq 35$, $2 < t3 \leq 40$, $0 < j1 \leq 40$, and $20 < q3+r1+t3+j1 < 80$.

15. The method for producing an information recording medium according to claim 14, wherein L2 is Ga.

16. The method for producing an information recording medium according to claim 14,
wherein the sputtering target contains a material that can be expressed by:

$$(ZrO_2)_{x3}(g)_{z1}(E2)_{100-x3-z1} \text{(mol \%)}$$

where g is at least one compound selected from the group consisting of $SiO_2$, $Si_3N_4$ and SiC, E2 is an oxide of at least one element selected from the group GL2, and x3 and z1 satisfy $10 \leq x3 < 90$, $0 < z1 \leq 50$, and $10 < x3+z1 \leq 90$.

17. The method for producing an information recording medium according to claim 16, wherein E2 is $Ga_2O_3$.

18. The method for producing an information recording medium according to claim 14,
wherein the sputtering target contains a material that can be expressed by:

$$(ZrO_2)_{x3}(SiO_2)_{z2}(f)_{a1}(E2)_{100-x3-z2-a1} \text{(mol \%)}$$

where f is at least one compound selected from the group consisting of SiC, $Si_3N_4$ and $Cr_2O_3$, E2 is an oxide of at least one element selected from the group GL2, x3, z2 and a1 satisfy $10 \leq x3 < 90$, $0 < z2 \leq 50$, $0 < a1 \leq 50$, and $10 < x3+z2+a1 \leq 90$.

19. The method for producing an information recording medium according to claim 18, wherein E2 is $Ga_2O_3$.

20. A method for producing an information recording medium containing an oxide-based material layer containing Zr, at least one element selected from the group GL5 consisting of Ce, Mg and Y, Cr, and oxygen (O), comprising:
forming the oxide-based material layer by sputtering using a sputtering target containing Zr, at least one element selected from the group GL5, Cr and oxygen (O); and
forming a recording layer,
wherein the sputtering target contains a material having a composition expressed by:

$$Zr_{q4}Cr_uL5_{t4}O_{100-q4-u-t4} \text{(atom \%)}$$

where L5 is at least one element selected from the group GL5, and q4, u and t4 satisfy $0 < q4 \leq 32$, $0 < u \leq 25$, $0 < t4 \leq 40$, and $20 < q4+u+t4 < 60$.

21. The method for producing an information recording medium according to claim 20,
wherein the sputtering target contains a material that can be expressed by:

$$(ZrO_2)_{x4}(Cr_2O_3)_{a2}(E5)_{100-x4-a2} \text{(mol \%)}$$

where E5 is an oxide of at least one element selected from the group GL5, and x4 and a2 satisfy $10 \leq x4 < 90$, $0 < a2 \leq 40$, and $10 < x4+a2 \leq 90$.

22. The method for producing an information recording medium according to claim 20,
wherein the sputtering target contains a material having a composition expressed by:

$$Zr_{q4}Cr_uL5_{t4}Si_{r2}K2_{j2}O_{100-q4-u-t4-r2-j2} \text{(atom \%)}$$

where L5 is at least one element selected from the group GL5, K2 is at least one element selected from the group GK2 consisting of nitrogen (N) and carbon (C), and q4, u, t4, r2 and j2 satisfy $0 < q4 \leq 32$, $0 < u \leq 25$, $0 < t4 \leq 40$, $0 < r2 \leq 30$, $0 < j2 \leq 40$, and $25 < q4+u+t4+r2+j2 < 85$.

23. The method for producing an information recording medium according to claim 22,
wherein the sputtering target contains a material that can be expressed by:

$$(ZrO_2)_{x4}(Cr_2O_3)_{a2}(h)_{z3}(E5)_{100-x4-a2-z3} \text{(mol \%)}$$

where h is at least one compound selected from the group consisting of $Si_3N_4$ and SiC, E5 is an oxide of at least one element selected from the group GL5, and x4, a2 and z3 satisfy $10 \leq x4 < 90$, $0 < a2 \leq 40$, $0 < z3 \leq 40$, and $10 < x4+a2+z3 \leq 90$.

24. The method for producing an information recording medium according to claim 5,
wherein the oxide-based material layer further contains at least one element selected from the group GL4 consisting of Ce, Al and In,
the sputtering target contains a material having a composition expressed by:

$$M1_{q2}L3_{t5}L4_{t6}O_{100-q2-t5-t6} \text{(atom \%)}$$

where L3 is at least one element selected from the group GL3, L4 is at least one element selected from the group GL4, and q2, t5 and t6 satisfy $0 < q2 \leq 34$, $0 < t5+t6 \leq 50$, and $20 < q2+t5+t6 < 60$.

25. The method for producing an information recording medium according to claim 24, wherein L3 is Ga.

26. The method for producing an information recording medium according to claim 24, wherein the sputtering target contains a material that can be expressed by:

$$(D2)_{100-x5-x6}(E3)_{x5}(E4)_{x6} \text{(mol \%)}$$

where D2 is an oxide of M1, E3 is an oxide of at least one element selected from the group GL3, E4 is an oxide of at least one element selected from the group GL4, and x5 and x6 satisfy $0 < x5+x6 < 100$.

27. The method for producing an information recording medium according to claim 26, wherein E3 is $Ga_2O_3$.

28. A method for producing an information recording medium containing an oxide-based material layer containing M1 (where M1 is a mixture of Zr and Hf, or Hf), at least one element selected from the group GL3 consisting of La, Ga, Mg and Y, Si, and oxygen (O), comprising:
forming the oxide-based material layer by sputtering using a sputtering target containing the M1, at least one element selected from the group GL3, Si and oxygen (O); and forming a recording layer, wherein the sputtering target contains a material having a composition expressed by:

$$M1_{q3}Si_{r1}L3_{t3}O_{100-q3-r1-t3}(\text{atom \%})$$

where L3 is at least one element selected from the group GL3, and q3, r1 and t3 satisfy $0<q3\leq32$, $0<r1\leq32$, $3<t3<43$, and $20<q3+r1+t3<60$.

29. The method for producing an information recording medium according to claim 28, wherein the oxide-based material layer further contains at least one element selected from the group GL4 consisting of Ce, Al and In, the sputtering target contains a material having a composition expressed by:

$$M1_{q3}Si_{r1}L3_{t5}L4_{t6}O_{100-q3-r1-t5-t6}(\text{atom \%})$$

where L3 is at least one element selected from the group GL3, L4 is at least one element selected from the group GL4, and q3, r1, t5 and t6 satisfy $0<q3\leq32$, $0<r1\leq32$, $3<t5+t6<43$, and $20<q3+r1+t5+t6<60$.

30. The method for producing an information recording medium according to claim 28, wherein L3 is Ga.

31. The method for producing an information recording medium according to claim 28, wherein the sputtering target contains a material that can be expressed by:

$$(D2)_{x3}(g)_{z1}(E3)_{100-x3-z1}(\text{mol \%})$$

where D2 is an oxide of M1, g is at least one compound selected from the group consisting of $SiO_2$, $Si_3N_4$ and SiC, E3 is an oxide of at least one element selected from the group GL3, and x3 and z1 satisfy $10\leq x3<90$, $0<z1\leq50$, and $10<x3+z1\leq90$.

32. The method for producing an information recording medium according to claim 31, wherein E3 is $Ga_2O_3$.

33. The method for producing an information recording medium according to claim 28, wherein the sputtering target further contains at least one element selected from the group GK1 consisting of carbon (C), nitrogen (N) and Cr.

34. The method for producing an information recording medium according to claim 33, wherein the sputtering target contains a material having a composition expressed by:

$$M1_{q3}Si_{r1}L3_{t3}K1_{j1}O_{100-q3-r1-t3-j1}(\text{atom \%})$$

where L3 is at least one element selected from the group GL3, K1 is at least one element selected from the group GK1, and q3, r1, t3 and j1 satisfy $0<q3\leq32$, $0<r1\leq35$, $2<t3\leq40$, $0<j1\leq40$, and $20<q3+r1+t3+j1<80$.

35. The method for producing an information recording medium according to claim 34, wherein L3 is Ga.

36. The method for producing an information recording medium according to claim 34, wherein the sputtering target contains a material that can be expressed by:

$$(D2)_{x3}(g)_{z1}(E3)_{100-x3-z1}(\text{mol \%})$$

where D2 is an oxide of M1, g is at least one compound selected from the group consisting of $SiO_2$, $Si_3N_4$ and SiC, E3 is an oxide of at least one element selected from the group GL3, and x3 and z1 satisfy $10\leq x3<90$, $0<z1\leq50$, and $10<x3+z1\leq90$.

37. The method for producing an information recording medium according to claim 36, wherein E3 is $Ga_2O_3$.

38. The method for producing an information recording medium according to claim 34, wherein the sputtering target contains a material that can be expressed by:

$$(D2)_{x3}(SiO_2)_{z2}(f)_{a1}(E3)_{100-x3-z2-a1}(\text{mol \%})$$

where D2 is an oxide of M1, f is at least one compound selected from the group consisting of SiC, $Si_3N_4$ and $Cr_2O_3$, E3 is an oxide of at least one element selected from the group GL3, x3, z2 and a1 satisfy $10\leq x3<90$, $0<z2\leq50$, $0<a1\leq50$, and $10<x3+z2+a1\leq90$.

39. The method for producing an information recording medium according to claim 38, wherein E3 is $Ga_2O_3$.

40. The method for producing an information recording medium according to claim 29, wherein L3 is Ga.

41. The method for producing an information recording medium according to claim 29, wherein the sputtering target contains a material that can be expressed by:

$$(D2)_{x3}(g)_{z1}[(E3)_{x5}(E4)_{1-x5}]_{100-x3-z1}(\text{mol \%})$$

where D2 is an oxide of M1, g is at least one compound selected from the group consisting of $SiO_2$, $Si_3N_4$ and SiC, E3 is an oxide of at least one element selected from the group GL3, E4 is an oxide of at least one element selected from the group GL4, and x3, z1 and x5 satisfy $10\leq x3<90$, $0<z1\leq50$, $10<x3+z1\leq90$, and $0<x5<1$.

42. The method for producing an information recording medium according to claim 41, wherein E3 is $Ga_2O_3$.

43. The method for producing an information recording medium according to claim 29, wherein the sputtering target further contains at least one element selected from the group GK1 consisting of carbon (C), nitrogen (N) and Cr.

44. The method for producing an information recording medium according to claim 43, wherein the sputtering target contains a material having a composition expressed by:

$$M1_{q3}Si_{r1}(L3_{x5}L4_{1-x5})_{t3}K1_{j1}O_{100-q3-r1-t3-j1}(\text{atom \%})$$

where L3 is at least one element selected from the group GL3, L4 is at least one element selected from the group GL4, K1 is at least one element selected from the group GK1, and q3, r1, x5, t3 and j1 satisfy $0<q3\leq32$, $0<r1\leq35$, $2<t3\leq40$, $0<j1\leq40$, $20<q3+r1+t3+j1<80$, and $0<x5<1$.

45. The method for producing an information recording medium according to claim 44, wherein L3 is Ga.

46. The method for producing an information recording medium according to claim 44, wherein the sputtering target contains a material that can be expressed by:

$$(D2)_{x3}(g)_{z1}[(E3)_{x5}(E4)_{1-x5}]_{100-x3-z1}(\text{mol \%})$$

where D2 is an oxide of M1, g is at least one compound selected from the group consisting of $SiO_2$, $Si_3N_4$ and SiC, E3 is an oxide of at least one element selected from the group GL3, E4 is an oxide of at least one element selected from the group GL4, and x3, z1 and x5 satisfy $10\leq x3<90$, $0<z1\leq50$, $10<x3+z1\leq90$, and $0<x5<1$.

47. The method for producing an information recording medium according to claim 46, wherein E3 is $Ga_2O_3$.

48. The method for producing an information recording medium according to claim 44, wherein the sputtering target contains a material that can be expressed by:

$$(D2)_{x3}(SiO_2)_{z2}(f)_{a1}[(E3)_{x5}(E4)_{1-x5}]_{100-x3-z2-a1}(\text{mol \%})$$

where D2 is an oxide of M1, f is at least one compound selected from the group consisting of SiC, $Si_3N_4$ and $Cr_2O_3$, E3 is an oxide of at least one element selected from the group GL3, E4 is an oxide of at least one element selected from the group GL4, and x3, z2, a1 and x5 satisfy $10 \leq x3 < 90$, $0 < z2 \leq 50$, $0 < a1 \leq 50$, $10 < x3+z2+a1 \leq 90$, and $0 < x5 < 1$.

49. The method for producing an information recording medium according to claim 48, wherein E3 is $Ga_2O_3$.

50. A method for producing an information recording medium containing an oxide-based material layer containing M1 (where M1 is a mixture of Zr and Hf, or Hf), at least one element selected from the group GL6 consisting of Mg and Y, Cr, and oxygen (O), comprising:

forming the oxide-based material layer by sputtering using a sputtering target containing the M1, at least one element selected from the group GL6, Cr and oxygen (O); and forming a recording layer, wherein the sputtering target contains a material having a composition expressed by:

$$M1_{q4}Cr_uL6_{t4}O_{100-q4-u-t4} \text{(atom \%)}$$

where L6 is at least one element selected from the group GL6, and q4, u and t4 satisfy $0 < q4 \leq 32$, $0 < u \leq 25$, $0 < t4 \leq 40$, and $20 < q4+u+t4 < 60$.

51. The method for producing an information recording medium according to claim 50,
wherein the sputtering target contains a material that can be expressed by:

$$(D2)_{x4}(Cr_2O_3)_{a2}(E6)_{100-x4-a2} \text{(mol \%)}$$

where D2 is an oxide of M1, E6 is an oxide of at least one element selected from the group GL6, and x4 and a2 satisfy $10 \leq x4 < 90$, $0 < a2 \leq 40$, and $10 < x4+a2 \leq 90$.

52. The method for producing an information recording medium according to claim 50,
wherein the sputtering target contains a material having a composition expressed by:

$$M1_{q4}Cr_uL6_{t4}Si_{r2}K2_{j2}O_{100-q4-u-t4-r2-j2} \text{(atom \%)}$$

where L6 is at least one element selected from the group GL6, K2 is at least one element selected from the group GK2 consisting of nitrogen (N) and carbon (C), and q4, u, t4, r2 and j2 satisfy $0 < q4 \leq 32$, $0 < u \leq 25$, $0 < t4 \leq 40$, $0 < r2 \leq 30$, $0 < j2 \leq 40$, and $25 < q4+u+t4+r2+j2 < 85$.

53. The method for producing an information recording medium according to claim 52,
wherein the sputtering target contains a material that can be expressed by:

$$(D2)_{x4}(Cr_2O_3)_{a2}(h)_{z3}(E6)_{100-x4-a2-z3} \text{(mol \%)}$$

where D2 is an oxide of M1, h is at least one compound selected from the group consisting of $Si_3N_4$ and SiC, E6 is an oxide of at least one element selected from the group GL6, and x4, a2 and z3 satisfy $10 \leq x4 < 90$, $0 < a2 \leq 40$, $0 < z3 \leq 40$, and $10 < x4+a2+z3 \leq 90$.

54. The method for producing an information recording medium according to claim 50,
wherein the oxide-based material layer further contains at least one element selected from the group GL4 consisting of Ce, Al and In,
the sputtering target contains a material having a composition expressed by:

$$M1_{q4}Cr_uL6_{t8}L4_{t9}O_{100-q4-u-t8-t9} \text{(atom \%)}$$

where L6 is at least one element selected from the group GL6, L4 is at least one element selected from the group GL4, and q4, u, t8 and t9 satisfy $0 < q4 \leq 32$, $0 < u \leq 25$, $0 < t8+t9 < 40$, and $20 < q4+u+t8+t9 < 60$.

55. The method for producing an information recording medium according to claim 54,
wherein the sputtering target contains a material that can be expressed by:

$$(D2)_{x4}(Cr_2O_3)_{a2}[(E6)_{x5}(E4)_{1-x5}]_{100-x4-a2} \text{(mol \%)}$$

where D2 is an oxide of M1, E6 is an oxide of at least one element selected from the group GL6, E4 is an oxide of at least one element selected from the group GL4, and x4, a2 and x5 satisfy $10 \leq x4 < 90$, $0 < a2 \leq 40$, $10 < x4+a2 \leq 90$, and $0 < x5 < 1$.

56. The method for producing an information recording medium according to claim 54,
wherein the sputtering target contains a material having a composition expressed by:

$$M1_{q4}Cr_u(L6_{x5}L4_{1-x5})_{t4}Si_{r2}K2_{j2}O_{100-q4-u-t4-r2-j2} \text{(atom \%)}$$

where L6 is at least one element selected from the group GL6, L4 is at least one element selected from the group GL4, K2 is at least one element selected from the group GK2 consisting of nitrogen (N) and carbon (C), and q4, u, x5, t4, r2 and j2 satisfy $0 < q4 \leq 32$, $0 < u \leq 25$, $0 < t4 \leq 40$, $0 < r2 \leq 30$, $0 < j2 \leq 40$, $25 < q4+u+t4+r2+j2 < 85$, and $0 < x5 < 1$.

57. The method for producing an information recording medium according to claim 56,
wherein the sputtering target contains a material that can be expressed by:

$$(D2)_{x4}(Cr_2O_3)_{a2}(h)_{z3}[(E6)_{x5}(E4)_{1-x5}]_{100-x4-a2-z3} \text{(mol \%)}$$

where D2 is an oxide of M1, h is at least one compound selected from the group consisting of $Si_3N_4$ and SiC, E6 is an oxide of at least one element selected from the group GL6, E4 is an oxide of at least one element selected from the group GL4, and x4, a2, z3 and x5 satisfy $10 \leq x4 < 90$, $0 < a2 \leq 40$, $0 < z3 \leq 40$, $10 < x4+a2+z3 \leq 90$, and $0 < x5 < 1$.

* * * * *